US009671687B2

(12) United States Patent
Sasaki et al.

(10) Patent No.: US 9,671,687 B2
(45) Date of Patent: Jun. 6, 2017

(54) COLORING COMPOSITION, CURED FILM, COLOR FILTER, METHOD FOR MANUFACTURING COLOR FILTER, SOLID-STATE IMAGING DEVICE, AND IMAGE DISPLAY DEVICE

(71) Applicant: FUJIFILM Corporation, Tokyo (JP)

(72) Inventors: Daisuke Sasaki, Haibara-gun (JP); Junichi Ito, Haibara-gun (JP); Yuushi Kaneko, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/212,377

(22) Filed: Jul. 18, 2016

(65) Prior Publication Data

US 2016/0327858 A1 Nov. 10, 2016

Related U.S. Application Data

(63) Continuation of application No. PCT/JP2015/052167, filed on Jan. 27, 2015.

(30) Foreign Application Priority Data

Jan. 31, 2014 (JP) ................................ 2014-017698
Nov. 14, 2014 (JP) ................................ 2014-231436

(51) Int. Cl.
*G03F 7/004* (2006.01)
*G02B 5/20* (2006.01)
(Continued)

(52) U.S. Cl.
CPC ............ *G03F 7/0007* (2013.01); *C09B 11/24* (2013.01); *C09B 11/28* (2013.01); *C09B 69/10* (2013.01); *G02B 5/201* (2013.01); *G02B 5/223* (2013.01); *G03F 7/027* (2013.01); *G03F 7/105* (2013.01); *G03F 7/16* (2013.01); *G03F 7/2002* (2013.01); *G03F 7/32* (2013.01)

(58) Field of Classification Search
CPC ........ G03F 7/0007; G03F 7/027; G03F 7/105; G02B 5/223; G02F 1/133514; G02F 1/133516; C09B 69/10; C09B 69/109
USPC ........................................................... 430/7
See application file for complete search history.

(56) References Cited

U.S. PATENT DOCUMENTS 8,845,760 B2 9/2014 Fuji et al.
9,323,145 B2 4/2016 Kaneko et al.
(Continued)

FOREIGN PATENT DOCUMENTS

CN 103226289 A 7/2013
CN 103443206 A 12/2013
(Continued)

OTHER PUBLICATIONS

Computer-generated translation of JP 2012-032754 (Feb. 2012).*
International Search Report for PCT/JP2015/052167 dated Apr. 28, 2015 [PCT/ISA/210].
Written Opinion for PCT/JP2015/052167 dated Apr. 28, 2015 [PCT/ISA/237].
International Preliminary Report on Patentability dated Aug. 11, 2016, from the International Bureau in counterpart International Application No. PCT/JP2015/052167.
Office Action dated Jan. 17, 2017, from the State Intellectual Property Office of the P.R.C. In corresponding Chinese Application No. 201580006050.3.
Office Action in counterpart Japanese Application No. 2014-231436 dated Apr. 11, 2017.

*Primary Examiner* — John A McPherson
(74) *Attorney, Agent, or Firm* — Sughrue Mion, PLLC

(57) ABSTRACT

Provided are a coloring composition which makes it possible to providing a color filter having surface unevenness relieved; and a cured film, a color filter, a method for manufacturing the color filter, a solid-state imaging device, and an image display device, each of which uses the coloring composition. The coloring composition includes a colorant compound represented by General Formula (1), a curable compound, and a solvent, in which one of $Ar^1$ and $Ar^2$ is a group represented by General Formula (2), and the other of $Ar^1$ and $Ar^2$ is a hydrogen atom, a group represented by the following General Formula (2), or the like, $R^5$ and $R^6$ each independently represent a hydrogen atom or the like, $R^7$ represents a monovalent substituent, $R^8$ represents a halogen atom or the like, and p represents an integer of 0 to 4, $R^1$ and $R^2$ each independently represent an alkyl group having 3 or more carbon atoms, or the like, and $X^1$ to $X^3$ each independently represent a hydrogen atom or the like. The colorant compound represented by General Formula (1) has a counter anion inside and/or outside the molecule.

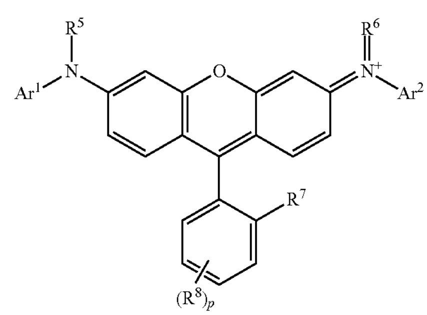

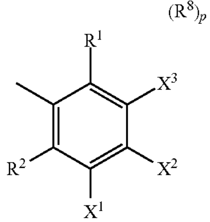

19 Claims, No Drawings

(51) Int. Cl.

| | |
|---|---|
| ***G03F 7/00*** | (2006.01) |
| ***G02B 5/22*** | (2006.01) |
| ***C09B 11/28*** | (2006.01) |
| ***C09B 69/10*** | (2006.01) |
| ***G03F 7/027*** | (2006.01) |
| ***G03F 7/105*** | (2006.01) |
| ***C09B 11/24*** | (2006.01) |
| ***G03F 7/16*** | (2006.01) |
| ***G03F 7/20*** | (2006.01) |
| ***G03F 7/32*** | (2006.01) |

(56) References Cited

U.S. PATENT DOCUMENTS

2003/0225178 A1* 12/2003 Purvis ...................... C08F 2/48 522/67
2014/0005417 A1 1/2014 Takahashi et al.
2014/0349101 A1 11/2014 Kaneko et al.
2015/0322265 A1 11/2015 Park et al.
2016/0004154 A1 1/2016 Idei et al.
2016/0116838 A1 4/2016 Hara et al.
2016/0122547 A1 5/2016 Samejima et al.

FOREIGN PATENT DOCUMENTS

JP 2005-250000 A 9/2005
JP 2012-032754 A 2/2012
JP 2012-107192 A 6/2012
JP 2012-207224 A 10/2012
JP 2013-064099 A 4/2013
JP 2013-178478 A 9/2013
JP 2013-195854 A 9/2013
JP 2014-199436 A 10/2014
JP 2015-143330 A 8/2015
WO 2013/089197 A1 6/2013
WO 2013/147422 A1 10/2013
WO 2015/005265 A1 1/2015
WO 2015/008726 A1 1/2015
WO 2015/033814 A1 3/2015

* cited by examiner

COLORING COMPOSITION, CURED FILM, COLOR FILTER, METHOD FOR MANUFACTURING COLOR FILTER, SOLID-STATE IMAGING DEVICE, AND IMAGE DISPLAY DEVICE

This application is a Continuation of PCT International Application No. PCT/JP2015/52167 filed on Jan. 27, 2015, which claims priority under 35 U.S.C. §119(a) to Japanese Patent Application No. 2014-017698 filed on Jan. 31, 2014 and Japanese Patent Application No. 2014-231436 filed on Nov. 14, 2014. Each of the above application(s) is hereby expressly incorporated by reference, in its entirety, into the present application.

BACKGROUND OF THE INVENTION

1. Field of the Invention

The present invention relates to a coloring composition and a cured film using the same. It further relates to a pattern forming method, a method for manufacturing a color filter, a color filter, a solid-state imaging device having a color filter, and an image display device, each of which uses the coloring composition.

2. Description of the Related Art

In the related art, a color filter has been manufactured by forming a colored pattern by a method for manufacturing a color filter in a photolithography or a dry etching method, using a coloring composition including a colorant compound, a curable compound, and if desired, other components. Such the coloring composition is used for formation of a color filter layer of a solid-state imaging device or an image display device.

As the coloring composition, a composition using a xanthene-based colorant compound is disclosed in, for example, JP2005-250000A and WO2013/089197A.

SUMMARY OF THE INVENTION

On reviewing JP2005-250000A and WO2013/089197A, it could be seen that in the case of using a colorant compound specifically disclosed in JP2005-250000A and WO2013/089197A, solvent solubility are not sufficient, and as a result, surface unevenness occurs.

The present invention has been made for the purpose of solving such problems, and thus has an object to provide a coloring composition which makes it possible to form a colored layer having excellent solvent solubility and suppressed surface unevenness. The present invention has another object to provide a cured film, a color filter, a method for manufacturing a color filter, a solid-state imaging device, and an image display device, each of which uses the coloring composition.

As a result of extensive studies, the present inventors have found that the problems can be solved by using a compound having a predetermined structure as a xanthene colorant compound and suppressing aggregation of the xanthene colorant compound. Specifically, the problems were solved by the following means <1>, and preferably <2> to <16>.

<1> A coloring composition comprising:

a colorant compound represented by the following General Formula (1);

a curable compound; and a solvent:

General Formula (1)

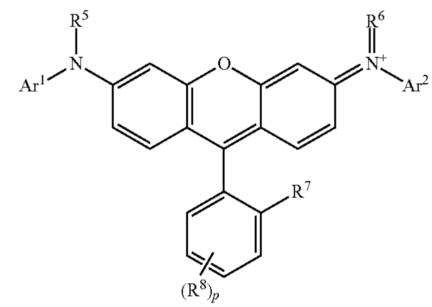

(in General Formula (1), one of $Ar^1$ and $Ar^2$ represents a group represented by the following General Formula (2), the other of $Ar^1$ and $Ar^2$ represents a hydrogen atom, a group represented by the following General Formula (2), an aryl group other than the group represented by General Formula (2), or an alkyl group, $R^5$ and $R^6$ each independently represent a hydrogen atom, an alkyl group, or an aryl group, $R^7$ represents a monovalent substituent, $R^8$ represents a halogen atom, an alkyl group, a carboxyl group, or a nitro group, and p represents an integer of 0 to 4); and Gemeral Formula (2)

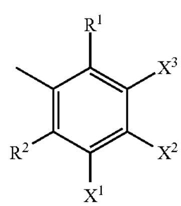

(in General Formula (2), $R^1$ and $R^2$ each independently represent an alkyl group having 3 or more carbon atoms, an aryl group, or a heterocyclic group, and $X^1$ to $X^3$ each independently represent a hydrogen atom or a monovalent substituent), in which the colorant compound represented by General Formula (1) has a counter anion inside and/or outside the molecule.

<2> The coloring composition as described in <1>, in which in General Formula (1), both of $Ar^1$ and $Ar^2$ are each independently the group represented by General Formula (2).

<3> The coloring composition as described in <1> or <2>, in which in General Formula (1), $R^1$ and $R^2$ are each an alkyl group having 3 to 12 carbon atoms.

<4> The coloring composition as described in any one of <1> to <3>, in which in General Formula (1), $R^1$ and $R^2$ are the same groups.

<5> The coloring composition as described in any one of <1> to <4>, in which in General Formula (1), $R^1$ and $R^2$ are each an isopropyl group.

<6> The coloring composition as described in any one of <1> to <5>, in which the counter anion of the colorant compound represented by General Formula (1) is an anion formed by dissociation of an organic acid having a pKa lower than the pKa of sulfuric acid.

<7> The coloring composition as described in any one of <1> to <6>, in which in General Formula (1), $R^7$ is a group represented by the following structure:

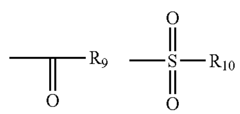

in above formula, $R_9$ and $R_{10}$ each independently represent an alkoxy group, an aryloxy group, an alkylamino group, an arylamino group, a dialkylamino group, a diarylamino group, an alkylarylamino group, an alkylsulfamoyl group, an arylsulfamoyl group, an alkylcarbamoyl group, or an arylcarbamoyl group.

<8> The coloring composition as described in any one of <1> to <7>, in which the counter anion of the colorant compound represented by General Formula (1) is bonded to a cation via one or more covalent bonds.

<9> The coloring composition as described in any one of <1> to <8>, in which the colorant compound represented by General Formula (1) is a polymer having a repeating unit or a compound having a polymerizable group.

<10> The coloring composition as described in any one of <1> to <9>, for use in a color filter.

<11> A cured film formed by curing the coloring composition as described in any one of <1> to <10>.

<12> A pattern forming method comprising:

applying the coloring composition as described in any one of <1> to <10> onto a support to form a coloring composition layer;

patternwise exposing the coloring composition layer; and removing an unexposed area by development to form a colored pattern.

<13> A method for manufacturing a color filter, comprising the pattern forming method as described in <12>.

<14> A color filter obtained using the coloring composition as described in any one of <1> to <10> or a color filter manufactured by the method for manufacturing a color filter as described in <13>.

<15> A solid-state imaging device comprising the color filter as described in <14>.

<16> An image display device comprising the color filter as described in <14>.

According to the present invention, it became possible to provide a coloring composition which makes it possible to provide a color filter having surface unevenness relieved. It also became possible to provide a cured film, a color filter, a method for manufacturing a color filter, a solid-state imaging device, and an image display device, each of which uses the coloring composition.

DESCRIPTION OF THE PREFERRED EMBODIMENTS

Hereinafter, the coloring composition, the cured film, the pattern forming method, the method for manufacturing a color filter, the color filter, the solid-state imaging device, and the image display device of the present invention will be described in detail.

The explanation of constituents in the present invention as described below will be based on typical embodiments of the present invention, but the present invention is not limited to such embodiments.

In citations for a group (atomic group) in the present specification, when the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

Furthermore, "radiation" in the present specification means, for example, a bright line spectrum of a mercury lamp, far ultraviolet rays represented by an excimer laser, extreme ultraviolet rays (EUV rays), X-rays, electron beams, or the like. In addition, in the present invention, light means actinic rays or radiation. "Exposure" in the present specification includes, unless otherwise specified, not only exposure by a mercury lamp, far ultraviolet rays represented by an excimer laser, X-rays, EUV rays, or the like, but also writing by particle rays such as electron beams and ion beams.

In the present specification, a numeral value range represented by "(a value) to (a value)" means a range including the numeral values represented before and after "to" as a lower limit value and an upper limit value, respectively.

In the present specification, the total solid content refers to a total mass of the components remaining when a solvent is excluded from the entire composition of a coloring composition.

The solid content concentration in the present invention refers to a concentration of solid contents at 25° C.

Moreover, in the present specification, "(meth)acrylate" represents either or both of acrylate and methacrylate, "(meth)acryl" represents either or both of acryl and methacryl, and "(meth)acryloyl" represents either or both of acryloyl and methacryloyl.

In addition, in the present specification, a "monomer material" and a "monomer" have the same definition. The monomer in the present specification refers to a compound which is distinguished from an oligomer or a polymer and has a weight-average molecular weight of 2,000 or less. In the present specification, a polymerizable compound refers to a compound having a polymerizable functional group, and may be a monomer or a polymer. The polymerizable functional group refers to a group involved in a polymerization reaction.

In the present specification, a term "step" includes not only an independent step, but also steps which are not clearly distinguished from other steps if an intended action of the steps is obtained.

The present invention has been made taking into consideration the above circumstances, and has an object to provide a coloring composition having excellent color characteristics.

In the present specification, the weight-average molecular weight and the number-average molecular weight are defined as a value in terms of polystyrene by GPC measurement. In the present specification, the weight-average molecular weight (Mw) and the number-average molecular weight (Mn) can be determined, for example, using HLC-8220 (manufactured by Tosoh Corporation) and TSKgel Super AWM-H (manufactured by Tosoh Corporation, 6.0 mm ID×15.0 cm) as a column, and a 10 mmol/L solution of lithium bromide in N-methylpyrrolidone (NMP) as an eluant.

In the present specification, a methyl group is represented by Me, an ethyl group is represented by Et, a propyl group is represented by Pr, a butyl group is represented by Bu, and a phenyl group is represented by PH or Ph in some cases.

The coloring composition of the present invention (hereinafter simply referred to as "the composition of the present invention" in some cases) is a coloring composition including the colorant compound represented by General Formula (1), a curable compound, and a solvent:

General Formula (1)

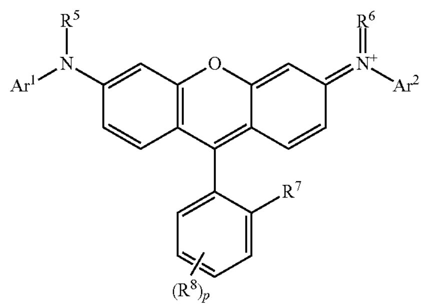

in General Formula (1), one of $Ar^1$ and $Ar^2$ represents a group represented by the following General Formula (2), the other of $Ar^1$ and $Ar^2$ represents a hydrogen atom, a group represented by the following General Formula (2), an aryl group other than the group represented by General Formula (2), or an alkyl group, $R^5$ and $R^6$ each independently represent a hydrogen atom, an alkyl group, or an aryl group, $R^7$ represents a monovalent substituent, $R^8$ represents a halogen atom, an alkyl group, a carboxyl group, or a nitro group, and p represents an integer of 0 to 4; and General Formula (2)

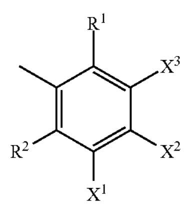

in General Formula (2), $R^1$ and $R^2$ each independently represent an alkyl group having 3 or more carbon atoms, an aryl group, or a heterocyclic group, and $X^1$ to $X^3$ each independently represent a hydrogen atom or a monovalent substituent, in which the colorant compound represented by General Formula (1) has a counter anion inside and/or outside the molecule.

By adopting such a configuration, the coloring composition makes it possible to form a colored layer having excellent solvent solubility, and as a result, having surface unevenness suppressed. The mechanism for this is presumed as follows: in the present invention, when bulky substituents are introduced into $R^1$ and $R^2$ of General Formula (2), they function as a soluble group. Further, as shown in the following compound, the anilino ring X is twisted, leading to an effect of reducing the planarity of the xanthene skeleton, as compared with the rings A and B contained in the xanthene colorant compound, and thus, the intermolecular interaction is weakened. It is thought that as a result, the solubility is improved.

Particularly, when the xanthene colorant compound is mixed with a pigment dispersion, aggregation of the xanthene colorant compound occurs, leading to generation of surface unevenness. In the present invention, it could be seen that the xanthene colorant compound in which bulky substituents are introduced to $R^1$ to $R^4$, the compatibility with the pigment dispersion is improved. As a result, during the manufacture of a color filter, it became possible that aggregation of the xanthene colorant compound does not occur and the surface unevenness is improved.

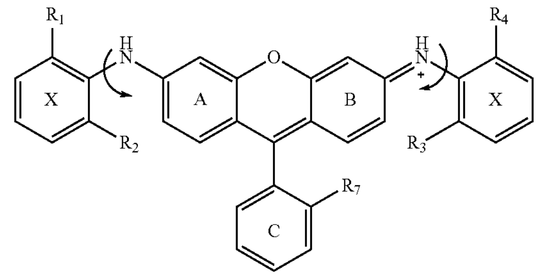

<Colorant Compound Represented by General Formula (1)>

The colorant compound represented by General Formula (1) is the same as described above. The colorant compound represented by General Formula (1) may be in a low molecular type (for example, those having a molecular weight of less than 2,000) or a polymer (also referred to as a high molecular type (for example, having a molecular weight of 2,000 or more)). In the present invention, the high molecular type (polymer) is preferable.

<<Low Molecular Type>>

First, a case where the colorant compound represented by General Formula (1) is in a low molecular type will be described.

In General Formula (1), one of $Ar^1$ and $Ar^2$ represents the group represented by General Formula (2), the other of $Ar^1$ and $Ar^2$ represents a hydrogen atom, the group represented by the following General Formula (2), or an aryl group other than the group represented by General Formula (2), or an alkyl group, the group represented by the following General Formula (2) or an aryl group other than the group represented by General Formula (2) being preferable. In the present invention, it is more preferable that in General Formula (1), both of $Ar^1$ and $Ar^2$ are the groups represented by General Formula (2). In the case where in General Formula (1), both of $Ar^1$ and $Ar^2$ are the groups represented by General Formula (2), the two groups represented by General Formula (2) may be the same as or different from each other.

In General Formula (2), $R^1$ and $R^2$ each independently represent an alkyl group having 3 or more carbon atoms, an aryl group, or a heterocyclic group, more preferably a secondary or tertiary alkyl group having 3 to 12 carbon atoms, and still more preferably an isopropyl group.

Specifically, the alkyl group having 3 or more carbon atoms may be linear, branched, or cyclic, and preferably has 3 to 24 carbon atoms, more preferably has 3 to 18 carbon atoms, and still more preferably has 3 to 12 carbon atoms. Specific examples thereof include a propyl group, an isopropyl group, a butyl group (preferably a t-butyl group), a pentyl group, a hexyl group, a heptyl group, an octyl group, a 2-ethylhexyl group, a dodecyl group, a hexadecyl group, a cyclopropyl group, a cyclopentyl group, a cyclohexyl group, a 1-norbonyl group, and a 1-adamantyl group; preferably a propyl group, an isopropyl group, a butyl group, a t-butyl group, a pentyl group, a hexyl group, a heptyl group, an octyl group, a 2-ethylhexyl group, a dodecyl group, a cyclopropyl group, a cyclopentyl group, and a cyclohexyl group; more preferably a propyl group, an isopropyl group, a butyl group (preferably a t-butyl group), a pentyl group, a hexyl group, a heptyl group, an octyl group, and a 2-ethylhexyl group; and particularly preferably an isopropyl group, a t-butyl group, and a 2-ethylhexyl group.

The aryl group includes a substituted or unsubstituted aryl group. As the substituted or unsubstituted aryl group, an aryl group having 6 to 30 carbon atoms is preferable, and examples thereof include a phenyl group and a naphthyl group. Examples of the substituent are the same as the substituents T which will be described later.

The heterocycle of the heterocyclic group is preferably a 5- or 6-membered ring, and may or may not further be condensed. Further, it may be an aromatic heterocycle or a non-aromatic heterocycle, and examples thereof include a pyridine ring, a pyrazine ring, a pyridazine ring, a quinoline ring, an isoquinoline ring, a quinazoline ring, a cinnoline ring, a phthalazine ring, a quinoxaline ring, a pyrrole ring, an indole ring, a furan ring, a benzofuran ring, a thiophene ring, a benzothiophene ring, a pyrazole ring, an imidazole ring, a benzimidazole ring, a triazole ring, an oxazole ring, a benzoxazole ring, a thiazole ring, a benzothiazole ring, an isothiazole ring, a benzisothiazole ring, a thiadiazole ring, an isoxazole ring, a benzisoxazole ring, a pyrrolidine ring, a piperidine ring, a piperazine ring, an imidazolidine ring, and a thiazoline ring. Among these, an aromatic heterocyclic group is preferable, and as exemplified above, examples of the aromatic heterocyclic group preferably include a pyridine ring, a pyrazine ring, a pyridazine ring, a pyrazole ring, an imidazole ring, a benzimidazole ring, a triazole ring, a benzoxazole ring, a thiazole ring, a benzothiazole ring, an isothiazole ring, a benzisothiazole ring, and a thiadiazole ring, more preferably include an imidazole ring, a benzoxazole ring, and a thiadiazole ring, and particularly preferably include a pyrazole ring, a thiadiazole ring (preferably a 1,3,4-thiadiazole ring and a 1,2,4-thiadiazole ring). These may have a substituent, and examples of the substituent include the same substituents as those of the aryl group, which will be described later.

Among those, $R^1$ and $R^2$ are preferably an alkyl group having 3 or more carbon atoms, and particularly preferably an alkyl group having 3 to 12 carbon atoms.

$X^1$ to $X^3$ each independently represent a hydrogen atom or a monovalent substituent. Examples of the substituent include the substituents T which will be described later, and preferred ranges thereof are also the same. Among those, $X^1$ to $X^3$ are preferably a halogen atom, an alkyl group, a hydroxyl group, an alkoxy group, an acyl group, an acyloxy group, an alkylthio group, a sulfonamide group, and a sulfamoyl group are preferable, and specific preferred examples thereof in this case are the same as those described as the substituent T.

In General Formula (1), as the aryl group other than the group represented by General Formula (2) in $Ar^1$ and $Ar^2$, a phenyl group is preferable. The phenyl group may or may not have a substituent. Examples of the substituent include the substituents T which will be described later, and preferably an alkyl group and an aryl group. The preferred ranges of the alkyl group and the aryl group are the same as those of the alkyl group and the aryl group in $R^5$ and $R^6$, which will be described later.

In General Formula (1), the alkyl group other than the group represented by General Formula (2) of $Ar^1$ and $Ar^2$ has the same preferred ranges as those of the alkyl group as $R^5$, which will be described later.

$R^5$ and $R^6$ each independently represent a hydrogen atom, an alkyl group, or an aryl group, and the alkyl group and the aryl group may or may not have a substituent.

As the substituted or unsubstituted alkyl group, an alkyl group having 1 to 30 carbon atoms is preferable. Examples of the substituent include those which are the same groups as the substituents T which will be described later. Examples of the alkyl group include a methyl group, an ethyl group, a propyl group, an isopropyl group, a butyl group (preferably a t-butyl group), an n-octyl group, and a 2-ethylhexyl group.

As the substituted or unsubstituted aryl group, an aryl group having 6 to 30 carbon atoms is preferable, and examples thereof include a phenyl group and a naphthyl group. Examples of the substituent are the same as the substituents T which will be described later.

$R^5$ and $R^6$ are preferably a hydrogen atom or an alkyl group, and more preferably a hydrogen atom.

$R^7$ represents a monovalent substituent, and examples thereof include the substituents T which will be described later.

Among these, $R^7$ preferably has the following structure.

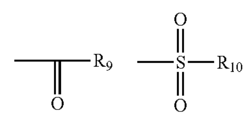

In above formula, $R_9$ and $R_{10}$ each independently represent an alkoxy group, an aryloxy group, an alkylamino group, an arylamino group, a dialkylamino group, a diarylamino group, an alkylarylamino group, an alkylsulfamoyl group, an arylsulfamoyl group, an alkylcarbamoyl group, or an arylcarbamoyl group.

$R_9$ and $R_{10}$ are preferably an alkoxy group, an aryloxy group, a dialkylamino group, a diarylamino group, an alkylarylamino group, an alkylsulfonylamino group, an arylsulfonylamino group, an alkylcarbonylamino group, or an arylcarbonylamino group; more preferably an alkoxy group, a dialkylamino group, an alkylsulfonylamino group, an arylsulfonylamino group, an alkylcarbonylamino group, or an arylcarbonylamino group; and particularly preferably an alkylsulfonylamino group or an arylsulfonylamino group.

Specific examples of the alkoxy group and the aryloxy group are the same as the substituents T.

The alkylamino group is preferably an amino group having 32 or less carbon atoms, and more preferably an amino group having 24 or less carbon atoms, and examples thereof include an amino group, a methylamino group, an N,N-dibutylamino group, a bismethoxyethylamino group, 2-ethylhexylamino, an N-ethylethanolamino group, and a cyclohexylamino group.

The arylamino group is preferably an anilino group having 6 to 32 carbon atoms, and more preferably an anilino group having 6 to 24 carbon atoms, and examples thereof include an anilino group and an N-methylanilino group.

Specific examples of the dialkylamino group which may have a substituent in the general formulae are as follows. Examples of the dialkylamino group include an N,N-dimethylamino group, an N,N-diethylamino group, an N,N-diaisopropylamino group, an N,N-methylhexylamino group, an N,N-butylethylamino group, an N,N-butylmethylamino group, an N,N-ethylisopropylamino group, an N,N-dibutylamino group, an N,N-di(2-ethylhexyl)amino group, an N-methyl-N-benzylamino group, an N,N-di(2-ethoxyethyl) amino group, and an N,N-di(2-hydroxyethyl)amino group.

Specific examples of the diarylamino group which may have a substituent in the general formulae are as follows. Examples of the diarylamino group include an N,N-diphenylamino group, an N,N-di(4-methoxyphenyl)amino group, and an N,N-di(4-acylphenyl)amino group.

Specific examples of the alkylarylamino group which may have a substituent in the general formulae are as follows. Examples of the alkylarylamino group include an N-methyl-N-phenylamino group, an N-benzyl-N-phenylamino group, and an N-methyl-N-(4-methoxyphenyl)amino group.

Specific examples of the alkylsulfonylamino group which may have a substituent in the general formulae are as follows. Examples of the alkylsulfonylamino group include a methylsulfonylamino group, a butylsulfonylamino group, a hydroxypropylsulfonylamino group, a 2-ethylhexylsulfonylamino group, an n-octylsulfonylamino group, a phenoxyethylsulfonylamino group, and an arylsulfonylamino group.

Specific examples of the arylsulfonylamino group which may have a substituent in the general formulae include a phenylsulfonylamino group, a p-methoxyphenylsulfonylamino group, and a p-ethoxyphenylsulfonylamino group.

Examples of the alkylcarbonylamino group which may have a substituent in the general formulae include a methylcarbonylamino group, a 2-ethylhexanoylamino group, an n-heptylcarbonylamino group, and an ethoxymethylcarbonylamino group.

Examples of the arylcarbonylamino group which may have a substituent in the general formulae include a benzoylamino group, a 2-methoxybenzoylamino group, and a 4-vinylbenzoylamino group.

Particularly, $R^7$ preferably has the following structure. With such the structure, the curability of a colored layer thus obtained can further be improved.

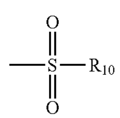

$R^8$ represents a halogen atom, an alkyl group, a carboxyl group, or a nitro group. As the alkyl group, an alkyl group having 1 to 18 carbon atoms is preferable. Examples of the substituent include those which are the same as the substituents T which will be described later. Examples of the alkyl group include a methyl group, an ethyl group, a propyl group, an isopropyl group, a butyl group (preferably a t-butyl group), an n-octyl group, and a 2-ethylhexyl group.

Further, p represents an integer of 0 to 4, and is preferably an integer of 0 to 3, more preferably an integer of 0 to 2, still more preferably an integer of 0 or 1, and particularly preferably 0.

<<<Substituent T>>>

Examples of the substituent T include a halogen atom (for example, fluorine, chlorine, and bromine), an alkyl group (preferably a linear, branched, or cyclic alkyl group having 1 to 48 carbon atoms, and more preferably a linear, branched, or cyclic alkyl group having 1 to 24 carbon atoms, for example, methyl, ethyl, propyl, isopropyl, and butyl groups (preferably a t-butyl group), pentyl, hexyl, heptyl, octyl, 2-ethylhexyl, dodecyl, hexadecyl, cyclopropyl, cyclopentyl, cyclohexyl, 1-norbornyl, and 1-adamantyl), an alkenyl group (preferably an alkenyl group having 2 to 48, and more preferably an alkenyl group having 2 to 18 carbon atoms, for example, vinyl, allyl, and 3-buten-1-yl), an alkanyl group (preferably an alkanyl group having 2 to 20, more preferably an alkynyl group having 2 to 12 carbon atoms, and particularly preferably an alkynyl group having 2 to 8 carbon atoms, for example, propargyl and 3-pentynyl), an aryl group (preferably an aryl group having 6 to 48 carbon atoms, and more preferably an aryl group having 6 to 24 carbon atoms, for example, phenyl and naphthyl), a heterocyclic group (preferably a heterocyclic group having 1 to 32 carbon atoms, and more preferably a heterocyclic group having 1 to 18 carbon atoms, for example, 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl), a silyl group (preferably a silyl group having 3 to 38 carbon atoms, and more preferably a silyl group having 3 to 18 carbon atoms, for example, trimethylsilyl, triethylsilyl, tributylsilyl, t-butyldimethylsilyl, and t-hexyldimethylsilyl), a hydroxyl group, a cyano group, a nitro group, an alkoxy group (preferably an alkoxy group having 1 to 48 carbon atoms, and more preferably an alkoxy group having 1 to 24 carbon atoms, for example, methoxy, ethoxy, 1-butoxy, 2-butoxy, isopropoxy, t-butoxy, dodecyloxy, and cycloalkyloxy group, for example, cyclopentyloxy and cyclohexyloxy), an aryloxy group (preferably an aryloxy group having 6 to 48 carbon atoms, and more preferably an aryloxy group having 6 to 24 carbon atoms, for example, phenoxy and 1-naphthoxy), a heterocyclyloxy group (preferably a heterocyclyloxy group having 1 to 32 carbon atoms, and more preferably a heterocyclyloxy group having 1 to 18 carbon atoms, for example, 1-phenyltetrazol-5-oxy and 2-tetrahydropyranyloxy), a silyloxy group (preferably a silyloxy group having 1 to 32 carbon atoms, and more preferably a silyloxy group having 1 to 18 carbon atoms, for example, trimethylsilyloxy, t-butyldimethylsilyloxy, and diphenylmethylsilyloxy), an acyloxy group (preferably an acyloxy group having 2 to 48 carbon atoms, and more preferably an acyloxy group having 2 to 24 carbon atoms, for example, acetoxy, pivaloyloxy, benzoyloxy, and dodecanoyloxy), an alkoxycarbonyloxy group (preferably an alkoxycarbonyloxy group having 2 to 48 carbon atoms, and more preferably an alkoxycarbonyloxy group having 2 to 24 carbon atoms, for example, ethoxycarbonyloxy, t-butoxycarbonyloxy, and cycloalkyloxycarbonyloxy groups, for example, cyclohexyloxycarbonyloxy), an aryloxycarbonyloxy group (preferably an aryloxycarbonyloxy group having 7 to 32 carbon atoms, and more preferably an aryloxycarbonyloxy group having 7 to 24 carbon atoms, for example, phenoxycarbonyloxy), a carbamoyloxy group (preferably a carbamoyloxy group having 1 to 48 carbon atoms, and more preferably a carbamoyloxy group having 1 to 24 carbon atoms, for example, N,N-dimethylcarbamoyloxy, N-butylcarbamoyloxy, N-phenylcarbamoyloxy, and N-ethyl-N-phenylcarbamoyloxy), a sulfamoyloxy group (preferably a sulfamoyloxy group having 1 to 32 carbon atoms, and more preferably a sulfamoyloxy group having 1 to 24 carbon atoms, for example, N,N-diethylsulfamoyloxy, N-propylsulfamoyloxy), an alkylsulfonyloxy group (preferably an alkylsulfonyloxy group having 1 to 38 carbon atoms, and more preferably an alkylsulfonyloxy group having 1 to 24 carbon atoms, for example, methylsulfonyloxy, hexadecylsulfonyloxy, and cyclohexylsulfonyloxy), an arylsulfonyloxy group (preferably an arylsulfonyloxy group having 6 to 32 carbon atoms, and more preferably an arylsulfonyloxy group having 6 to 24 carbon atoms, for example, phenylsulfonyloxy), an acyl group (preferably an acyl group having 1 to 48 carbon atoms, and more preferably an acyl group having 1 to 24 carbon atoms, for example, formyl, acetyl, pivaloyl, benzoyl, tetradecanoyl, and cyclohexanoyl), an alkoxycarbonyl group (preferably an alkoxycarbonyl group having 2 to 48 carbon atoms, and more preferably an alkoxycarbonyl group having 2 to 24 carbon atoms, for example, methoxycarbonyl, ethoxycarbonyl, octadecyloxycarbonyl, cyclohexyloxycarbonyl, and 2,6-di-tert-butyl-4-methylcyclohexyloxycarbonyl), an aryloxycarbonyl group (preferably an aryloxycarbonyl group having 7 to 32 carbon atoms, and more preferably an aryloxycarbonyl group having 7 to 24 carbon atoms, for example, phenoxycarbonyl), a carbamoyl group (preferably a carbamoyl group having 1 to 48 carbon atoms, and more preferably a carbamoyl group having 1 to 24 carbon atoms, for example, carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl, and N,N-dicyclohexylcarbamoyl), an amino group (preferably an amino group having 32 or less carbon atoms, and more preferably an amino group having 24 or less carbon atoms, for example, amino, methylamino, N,N-dibutylamino, tetradecylamino, 2-ethylhexylamino, and cyclohexylamino), an anilino group (preferably an anilino group having 6 to 32 carbon atoms, and more preferably an anilino group having 6 to 24 carbon atoms, for example, anilino and N-methylanilino), a heterocyclicamino group (preferably a heterocyclicamino group having 1 to 32 carbon atoms, and more preferably a heterocyclicamino group having 1 to 18 carbon atoms, for example, 4-pyridylamino), a carbonamide group (preferably a carbonamide group having 2 to 48 carbon atoms, and more preferably a carbonamide group having 2 to 24 carbon atoms, for example, acetamide, benzamide, tetradecanamide, pivaloylamide, and cyclohexanamide), a ureido group (preferably a ureido group having 1 to 32 carbon atoms, and more preferably a ureido group having 1 to 24 carbon atoms, for example, ureido, N,N-dimethylureido, and N-phenylureido), an imide group (preferably an imide group having 36 or less carbon atoms, and more preferably an imide group having 24 or less carbon atoms, for example, N-succinimide and N-phthalimide), an alkoxycarbonylamino group (preferably an alkoxycarbonylamino group having 2 to 48 carbon atoms, and more preferably an alkoxycarbonylamino group having 2 to 24 carbon atoms, for example, methoxycarbonylamino, ethoxycarbonylamino, t-butoxycarbonylamino, octadecyloxycarbonylamino, and cyclohexyloxycarbonylamino), an aryloxycarbonylamino group (preferably an aryloxycarbonylamino group having 7 to 32 carbon atoms, and more preferably an aryloxycarbonylamino group having 7 to 24 carbon atoms, for example, phenoxycarbonylamino), a sulfonamide group (preferably a sulfonamide group having 1 to 48 carbon atoms, and more preferably a sulfonamide group having 1 to 24 carbon atoms, for example, methanesulfonamide, butanesulfonamide, benzenesulfonamide, hexadecanesulfonamide, and cyclohexanesulfonamide), a sulfamoylamino group (preferably a sulfamoylamino group having 1 to 48 carbon atoms, and more preferably a sulfamoylamino group having 1 to 24 carbon atoms, for example, N,N-dipropylsulfamoylamino and N-ethyl-N-dodecylsulfamoylamino), an azo group (preferably an azo group having 1 to 32 carbon atoms, and more preferably an azo group having 1 to 24 carbon atoms, for example, phenylazo and 3-pyrazolylazo), an alkylthio group (preferably an alkylthio group having 1 to 48 carbon atoms, and more preferably an alkylthio group having 1 to 24 carbon atoms, for example, methylthio, ethylthio, octylthio, and cyclohexylthio), an arylthio group (preferably an arylthio group having 6 to 48 carbon atoms, and more preferably an arylthio group having 6 to 24 carbon atoms, for example, phenylthio), a heterocyclicthio group (preferably a heterocyclicthio group having 1 to 32 carbon atoms, and more preferably a heterocyclicthio group having 1 to 18 carbon atoms, for example, 2-benzothiazolylthio, 2-pyridylthio, and 1-phenyltetrazolylthio), an alkylsulfinyl group (preferably an alkylsulfinyl group having 1 to 32 carbon atoms, and more preferably an alkylsulfinyl group having 1 to 24 carbon atoms, for example, dodecanesulfinyl), an arylsulfinyl group (preferably an arylsulfinyl group having 6 to 32 carbon atoms, and more preferably an arylsulfinyl group having 6 to 24 carbon atoms, for example, phenylsulfinyl), an alkylsulfonyl group (preferably an alkylsulfonyl group having 1 to 48 carbon atoms, and more preferably an alkylsulfonyl group having 1 to 24 carbon atoms, for example, methylsulfonyl, ethylsulfonyl, propylsulfonyl, butylsulfonyl, isopropylsulfonyl, 2-ethylhexylsulfonyl, hexadecylsulfonyl, octylsulfonyl, and cyclohexylsulfonyl), an arylsulfonyl group (preferably an arylsulfonyl group having 6 to 48 carbon atoms, and more preferably an arylsulfonyl group having 6 to 24 carbon atoms, for example, phenylsulfonyl and 1-naphthylsulfonyl), a sulfamoyl group (preferably a sulfamoyl group having 32 or less carbon atoms, and more preferably a sulfamoyl group having 24 or less carbon atoms, for example, sulfamoyl, N,N-dipropylsulfamoyl, N-ethyl-N-dodecylsulfamoyl, N-ethyl-N-phenylsulfamoyl, and N-cyclohexylsulfamoyl), a sulfo group, a phosphonyl group (preferably a phosphonyl group having 1 to 32 carbon atoms, and more preferably a phosphonyl group having 1 to 24 carbon atoms, for example, phenoxyphosphonyl, octyloxyphosphonyl, and phenylphosphonyl), and a phosphinoylamino group (preferably a phosphinoylamino group having 1 to 32 carbon atoms, and more preferably a phosphinoylamino group having 1 to 24 carbon atoms, for example, diethoxyphosphinoylamino and dioctyloxyphosphinoylamino). These substituents may further be substituted. Further, in the case where there are two or more substituents, the substituents may be the same as or different from each other. In addition, if possible, the groups may be bonded to each other to form a ring.

<<<Compound Including Polymerizable Group>>>

In the case where the colorant compound represented by General Formula (1) is of a low molecular type, it is preferable that the colorant compound represented by General Formula (1) has a polymerizable group. The colorant compound may include one kind or two or more kinds of the polymerizable group.

As the polymerizable group, known polymerizable groups which can be crosslinked by a radical, an acid, or heat can be used, and examples thereof include a group including an ethylenically unsaturated bond, a cyclic ether group (an epoxy group and an oxetane group), and a methylol group. Particularly, a group having an ethylenically unsaturated bond is preferable, a (meth)acryloyl group is more preferable, and (meth)acryloyl groups derived from glycidyl (meth)acrylate and 3,4-epoxy-cyclohexyl methyl (meth) acrylate are still more preferable.

In the present embodiment, it is preferable that at least one group selected from $X^1$ to $X^3$, $R^7$, or $R^8$ in General Formula (1) or General Formula (2) has a polymerizable group, and it is more preferable that the group having an ethylenically unsaturated double bond having the structure represented by the following General Formula (3) at a terminal.

General Formula (3)

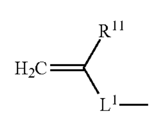

$R^{11}$ represents a hydrogen atom, a methyl group, a hydroxymethyl group, or an alkoxymethyl group. $L^1$ represents a single bond or a divalent linking group.

In the case where $L^1$ represents a divalent linking group, suitable examples of the divalent linking group include an alkylene group having 1 to 20 carbon atoms, an arylene group having 6 to 20 carbon atoms, a divalent group formed by removing two hydrogen atoms from a heterocycle, —O—, —S—, —NR— (R represents a hydrogen atom or a monovalent substituent (preferably the substituent T)), $—SO_2—$, —CO—, —CS—, —C(═NH)—, or a divalent linking group formed by combination of these groups. The divalent linking group is more preferably an alkylene group having 1 to 12 carbon atoms, a phenylene group having 6 to 12 carbon atoms, —O—, —S—, —NR— (R represents hydrogen or a monovalent substituent (preferably the substituent T)), —CO—, or a divalent linking group formed by combination of these groups, and particularly preferably an alkylene group having 1 to 6 carbon atoms, a phenylene group having 6 carbon atoms, —O—, —NR— (R represents hydrogen or a monovalent substituent (preferably the substituent T)), —CO—, or a divalent linking group formed by combination of these groups.

<<<Counter Anion>>>

The colorant compound represented by General Formula (1) has a counter anion inside and/or outside the molecule. The counter anion is included according to the number of cations included in the colorant compound represented by General Formula (1). The cation is usually monovalent or divalent, and more preferably monovalent, with respect to one xanthene structure. A counter anion being inside the molecule means that an anionic moiety or cationic moiety is present in the colorant compound represented by General Formula (1) via one or more covalent bonds. A counter anion being outside the molecule means cases corresponding to any other than the aforementioned cases.

In the present invention, the colorant compound having at least an anion inside the molecule is preferable.

Further, the anion in the present invention is not particularly defined, but a low nucleophilic anion is preferable. The low nucleophilic anion represents an anionic structure in which organic acids having a pKa lower than the pKa of sulfuric acid are dissociated.

Case where Counter Anion is Inside Molecule

A first embodiment of the anion in the present invention is a case where the counter anion is in the same molecule of the colorant compound represented by General Formula (1), specifically, a case where a cation and an anion are bonded via a covalent bond in a repeating unit having a colorant structure.

As an anionic moiety in this case, at least one selected from $—SO_3^-$, —COO—, $—PO_4^-$, a structure represented by the following General Formula (A1), or a structure represented by the following General Formula (A2) is preferable. As the bonding position of the counter anion, $R^7$ and/or $R^8$ in General Formula (1) is/are preferable, and $R^7$ is more preferable.

General Formula (A1)

$$R^1—\overset{\ominus}{N}—R^2$$

(In General Formula (A1), $R^1$ and $R^2$ each independently represent $—SO_2—$ or —CO—.)

In General Formula (A1), it is preferable that at least one of $R^1$ or $R^2$ represents $—SO_2—$, and it is more preferable that both of $R^1$ and $R^2$ represent $—SO_2—$.

General Formula (A1) is more preferably represented by the following General Formula (A1-1).

General Formula (A1-1)

$$—X^1—R^1—\overset{\ominus}{N}—R^2—X^2—$$

(In General Formula (A1-1), $R^1$ and $R^2$ each independently represent $—SO_2—$ or —CO—. $X^1$ and $X^2$ each independently represent an alkylene group or an arylene group.)

In General Formula (A1-1), $R^1$ and $R^2$ have the same definitions as $R^1$ and $R^2$ in General Formula (A1), and preferred ranges thereof are also the same.

In the case where $X^1$ represents an alkylene group, the number of carbon atoms of the alkylene group is preferably 1 to 8, and more preferably 1 to 6. In the case where $X^1$ represents an arylene group, the number of carbon atoms of the arylene group is preferably 6 to 18, more preferably 6 to 12, and still more preferably 6. In the case where $X^1$ has a substituent, it is preferably substituted with a fluorine atom.

$X^2$ represents an alkyl group or an aryl group, and preferably an alkyl group. The number of carbon atoms of the alkyl group is preferably 1 to 8, more preferably 1 to 6, still more preferably 1 to 3, and particularly preferably 1. In the case where $X^2$ has a substituent, it is preferably substituted with a fluorine atom.

General Formula (A2)

$$R^3—\overset{\ominus}{\underset{R^5}{\underset{|}{C}}}—R^4$$

(In General Formula (A2), $R^3$ represents $—SO_2—$ or —CO—. $R^4$ and $R^5$ each independently represent $—SO_2—$, —CO—, or —CN.)

In General Formula (A2), it is preferable that at least one of $R^3$, . . . or $R^5$ represents $—SO_2—$, and it is more preferable that at least two of $R^3$, $R^4$, or $R^5$ represent $—SO_2—$.

Case where Counter Anion is in Different Molecule

A second embodiment of the anion in the present invention is a case where the counter anion is not in the same repeating unit, in which a cation and an anion are not bonded via a covalent bond and present in different molecules.

Examples of the anion in this case include a fluorine anion, a chlorine anion, a bromine anion, an iodine anion, a cyanide ion, a perchloric acid anion, and a non-nucleophilic anion, and preferably a non-nucleophilic anion.

The non-nucleophilic counter anion may be an organic anion or an inorganic anion, and preferably an organic anion. Examples of the counter anion used in the present invention include the known non-nucleophilic anions described in paragraph No. 0075 of JP2007-310315A, the contents of which are hereby incorporated by reference.

Preferred examples of the non-nucleophilic counter anion include a bis(sulfonyl)imide anion, a tris(sulfonyl)methyl-anion, a tetraarylborate anion, $B^-(CN)_{n1}(OR^a)_{4-n1}$ ($R^a$ represents an alkyl group having 1 to 10 carbon atoms or an aryl group having 6 to 10 carbon atoms, and n1 represents 1 to 4), and $PF_{n2}R^P_{(6-n2)}{}^-$ ($R^P$ represents a fluorinated alkyl group having 1 to 10 carbon atoms, and n2 represents an integer of 1 to 6), and the non-nucleophilic counter anion is more preferably one selected from a bis(sulfonyl)imide anion, a tris(sulfonyl)methide anion, and a tetraarylborate anion, and still more preferably a bis(sulfonyl)imide anion. The effects of the present invention tend to be more effectively exerted by using such a non-nucleophilic counter anion.

As the bis(sulfonyl)imide anion which is a non-nucleophilic counter anion, a structure represented by the following General Formula (AN-1) is preferable.

(AN-1)

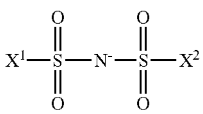

(In Formula (AN-1), $X^1$ and $X^2$ each independently represent a fluorine atom or a fluorine atom-containing alkyl group having 1 to 10 carbon atoms. $X^1$ and $X^2$ may be bonded to each other to form a ring.)

$X^1$ and $X^2$ each independently represent a fluorine atom, or a fluorine atom-containing alkyl group having 1 to 10 carbon atoms, preferably represent a fluorine atom-containing alkyl group having 1 to 10 carbon atoms, more preferably represent a perfluoroalkyl group having 1 to 10 carbon atoms, still more preferably represent a perfluoroalkyl group having 1 to 4 carbon atoms, and particularly preferably represent a trifluoromethyl group.

As the tris(sulfonyl)methyl anion which is a non-nucleophilic counter anion, a structure represented by the following General Formula (AN-2) is preferable.

(AN-2)

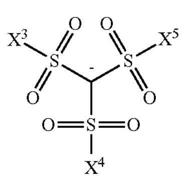

(In Formula (AN-2), $X^3$, $X^4$, and $X^5$ each independently represent a fluorine atom, or a fluorine atom-containing alkyl group having 1 to 10 carbon atoms.)

$X^3$, $X^4$, and $X^5$ each independently have the same definitions as $X^1$ and $X^2$, and preferred ranges thereof are also the same.

As the tetraarylborate anion which is a non-nucleophilic counter anion, a compound represented by the following General Formula (AN-5) is preferable.

(AN-5)

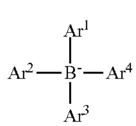

(In Formula (AN-5), $Ar^1$, $Ar^2$, $Ar^3$, and $Ar^4$ each independently represent an aryl group.)

$Ar^1$, $Ar^2$, $Ar^3$, and $Ar^4$ are each independently preferably an aryl group having 6 to 20 carbon atoms, more preferably an aryl group having 6 to 14 carbon atoms, and still more preferably an aryl group having 6 to 10 carbon atoms.

The aryl group represented by $Ar^1$, $Ar^2$, $Ar^3$, and $Ar^4$ may have a substituent. In the case where the aryl group has a substituent, examples of the substituent include a halogen atom, an alkyl group, an aryl group, an alkoxy group, a carbonyl group, a carbonyloxy group, a carbamoyl group, a sulfo group, a sulfonamide group, and a nitro group, among which a halogen atom and an alkyl group are preferable, a fluorine atom and an alkyl group are more preferable, and a fluorine atom and a perfluoroalkyl group having 1 to 4 carbon atoms are still more preferable.

$Ar^1$, $Ar^2$, $Ar^3$, and $Ar^4$ are each independently more preferably a phenyl group having a halogen atom and/or a halogen atom-containing alkyl group, and still more preferably a phenyl group having a fluorine atom and/or a fluorine atom-containing alkyl group.

The non-nucleophilic counter anion is preferably $—B(CN)_{n1}(OR^a)_{4-n1}$ ($R^a$ represents an alkyl group having 1 to 10 carbon atoms or an aryl group having 6 to 10 carbon atoms, and n1 represents an integer of 1 to 4). $R^a$ as alkyl group having 1 to 10 carbon atoms is preferably an alkyl group having 1 to 6 carbon atoms, and more preferably an alkyl group having 1 to 4 carbon atoms. $R^a$ as aryl group having 6 to 10 carbon atoms is preferably a phenyl group and a naphthyl group.

n1 is preferably 1 to 3, and more preferably 1 to 2.

The non-nucleophilic counter anion is preferably $—PF_6R^P_{(6-n2)}{}^-$ ($R^P$ represents a fluorinated alkyl group having 1 to 10 carbon atoms, and n2 represents an integer of 1 to 6). $R^P$ is preferably a fluorine atom-containing alkyl group having 1 to 6 carbon atoms, more preferably a fluorine-atom containing alkyl group having 1 to 4 carbon atoms, and still more preferably a perfluoroalkyl group having 1 to 3 carbon atoms.

n2 is preferably an integer of 1 to 4, and more preferably 1 or 2.

The mass per molecule of the non-nucleophilic counter anion used in the present invention is preferably 100 to 1,000, and more preferably 200 to 500.

The colorant multimer of the present invention may include one kind or two or more kinds of non-nucleophilic counter anion.

Specific examples of the non-nucleophilic counter anion used in the present invention are shown below, but the present invention is not limited thereto.

(IM-1)

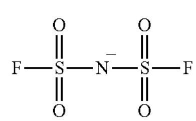

(IM-2)

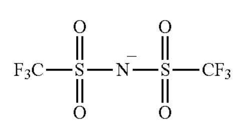

(IM-3)

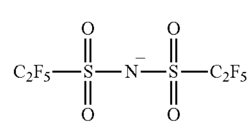

(IM-4)

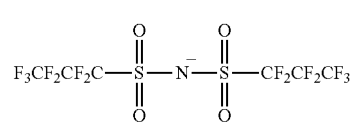

-continued
(IM-5)
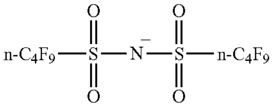
(IM-6)
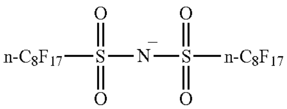
(IM-7)
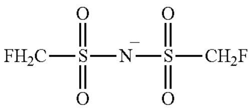
(IM-8)
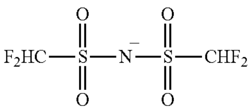
(IM-9)
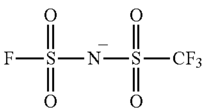
(IM-10)
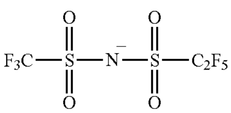
(IM-11)
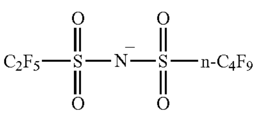
(IM-12)
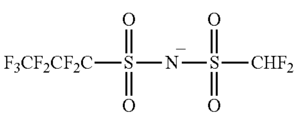
(IM-13)
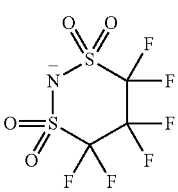
(IM-14)
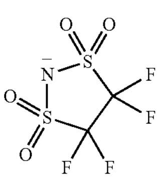
(IM-15)
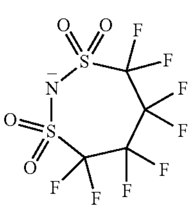
-continued
(MD-1)
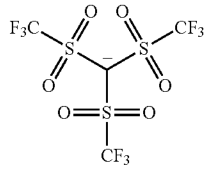
(MD-2)
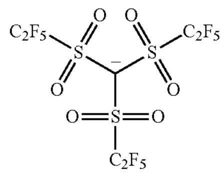
(MD-3)
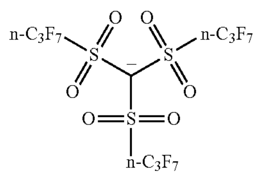
(MD-4)
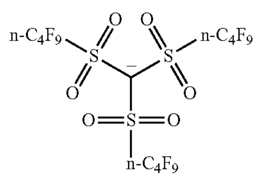
(MD-5)
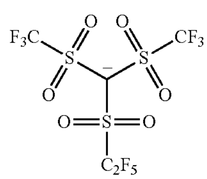
(MD-6)
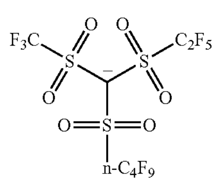
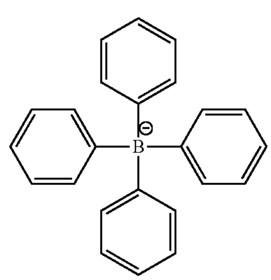

-continued
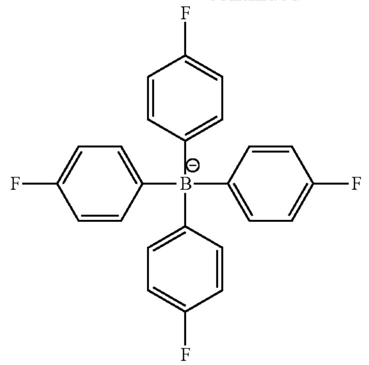
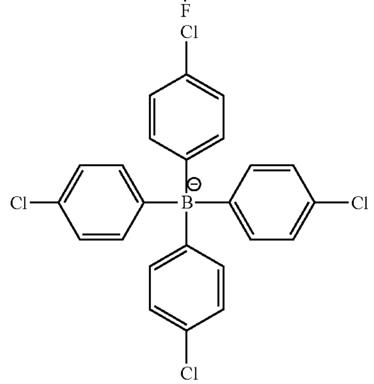
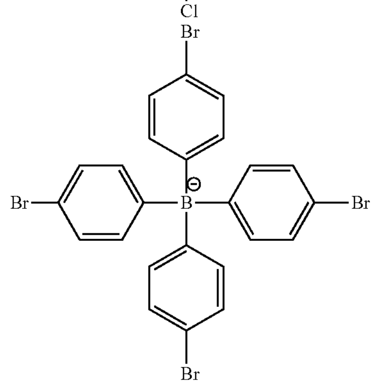
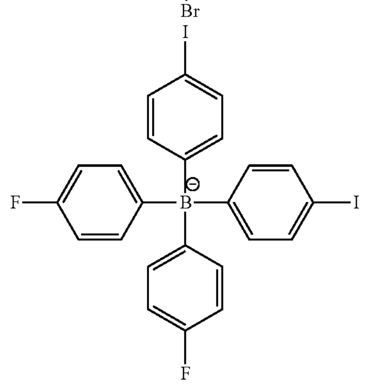
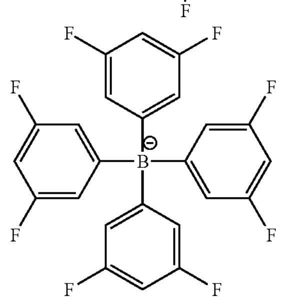
-continued
$CF_3SO_3^-$ (a-1)
$C_4F_{13}SO_3^-$ (a-2)
$C_8F_{17}SO_3^-$ (a-3)
(a-4)
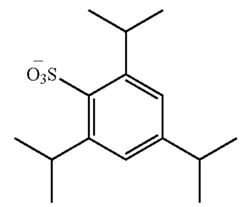
(a-5)
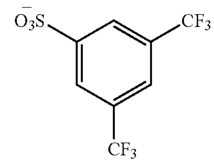
(a-6)
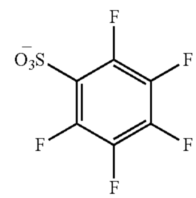
(a-7)
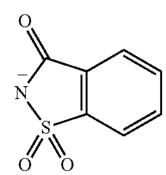
(a-8)
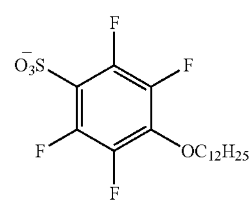
(a-9)
$^-O_3S—CF_2—SO_3^-$
(a-10)
$^-O_3S—CF_2CF_2—SO_3^-$
(a-11)
$^-O_3S—CF_2CF_2CF_2—SO_3^-$
(a-12)
$^-O_3S—CF_2CF_2CF_2CF_2—SO_3^-$
(a-13)
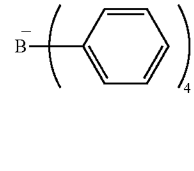

-continued (a-14)

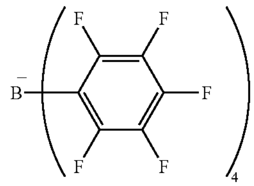

(a-15)

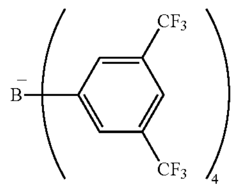

(a-16)

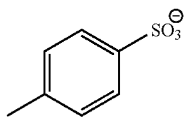

(a-17)

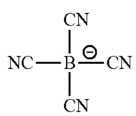

(a-18)

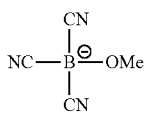

-continued (a-19)

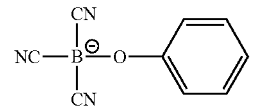

(a-20)

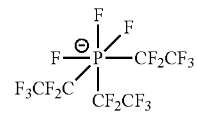

Further, in the second embodiment, the anion may be a multimer. The multimer in this case includes a repeating unit including an anion, and examples thereof include multimers not including repeating units derived from a colorant structure including a cation. Here, preferred examples of the repeating unit including an anion include repeating units including anions mentioned in the third embodiment which will be described later. Further, the multimer including an anion may have repeating units other than the repeating units including anions. Preferred examples of such repeating units include other repeating units which may include colorant multimers which are used in the present invention which will be described later.

Examples of the colorant structure of the xanthene compound in a low molecular type are shown below, but the present invention is not limited thereto.

Furthermore, in the colorant structure, cations are non-localized, and therefore, for example, cations are present on nitrogen atoms or carbon atoms of the xanthene ring.

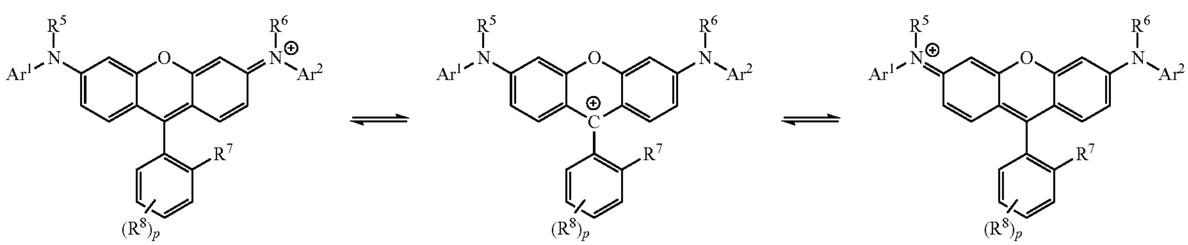

M-1

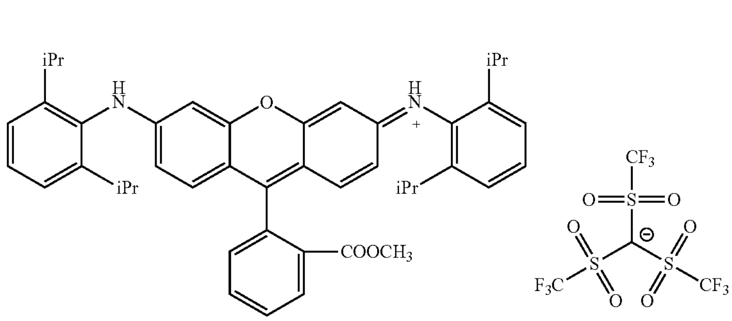

-continued
M-2
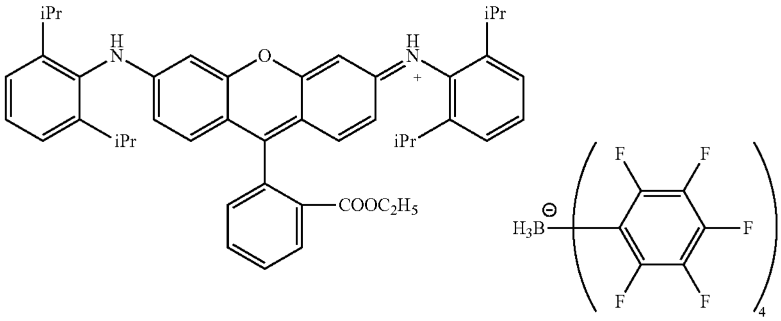
M-3
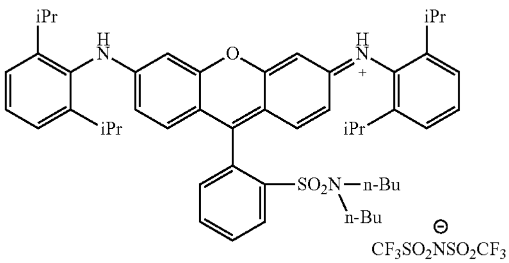
M-4
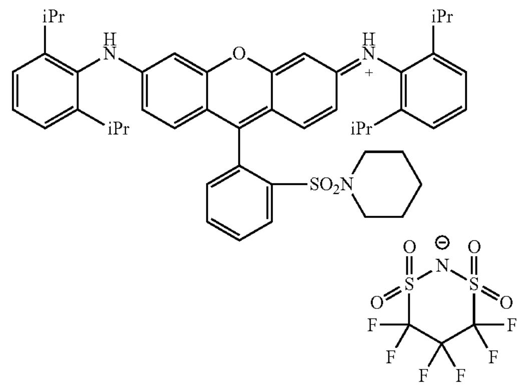
M-5
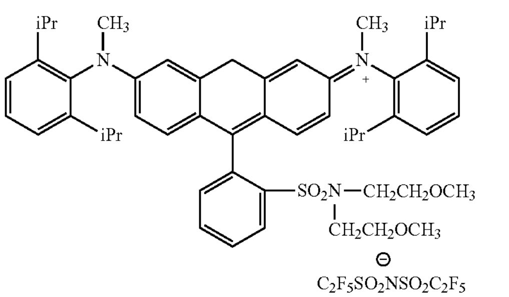
M-6
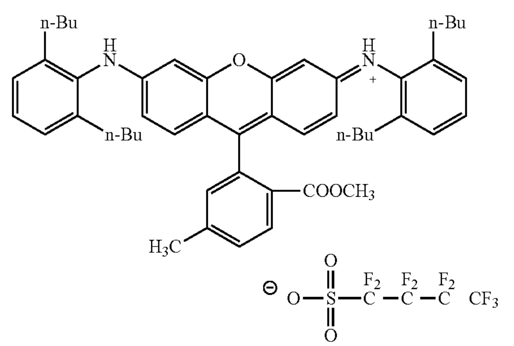
M-7
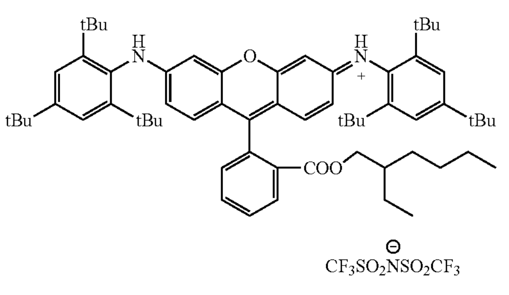
M-8
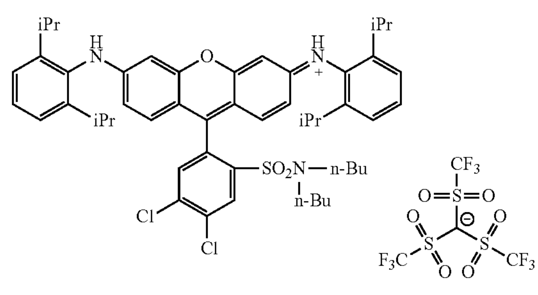

-continued
M-9
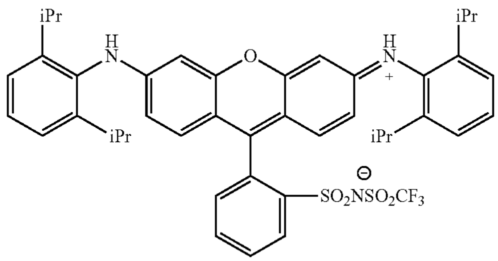
M-10
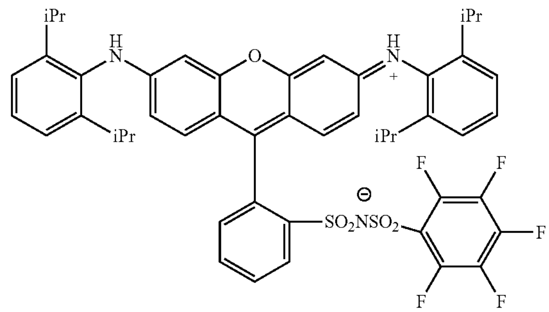
M-11
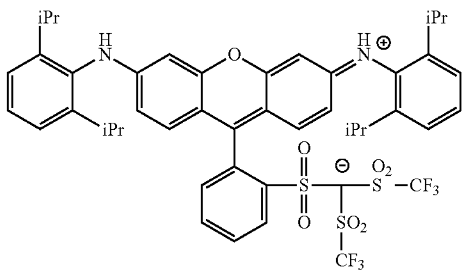
M-12
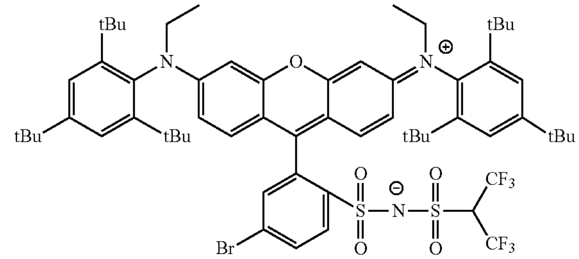
M-13
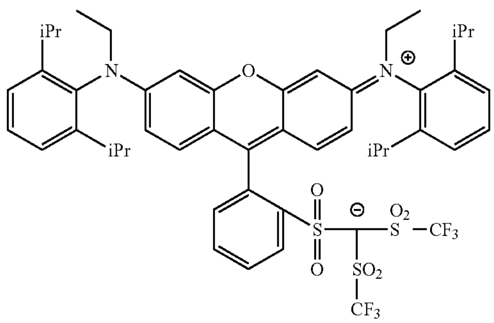
M-14
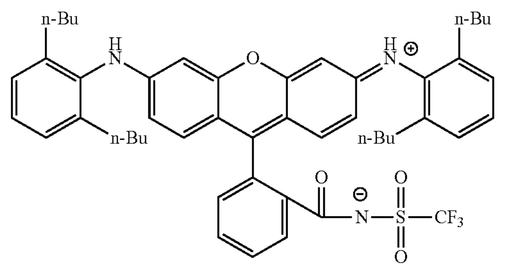
M-15
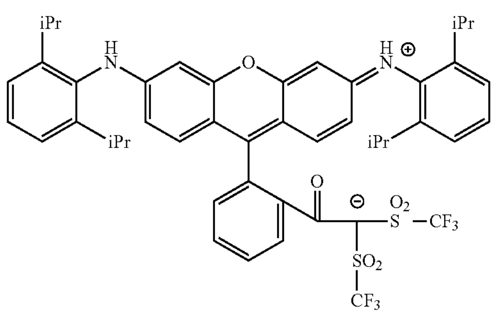
M-16
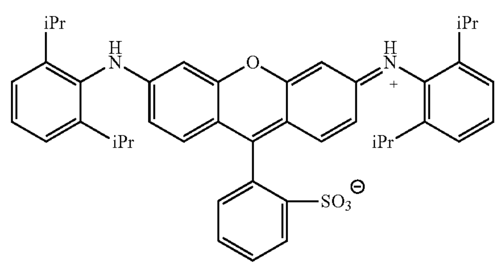
M-17
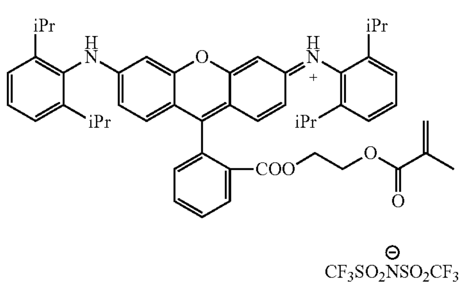
M-18
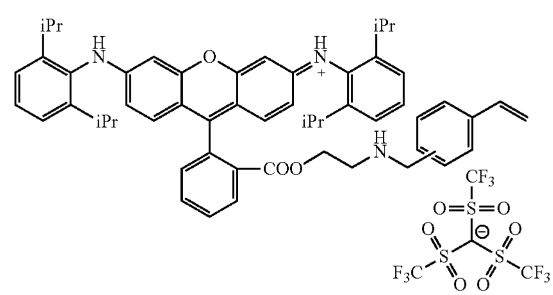

-continued
M-19
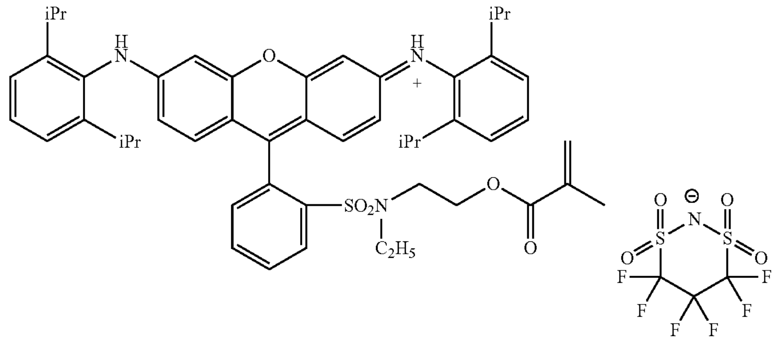
M-20
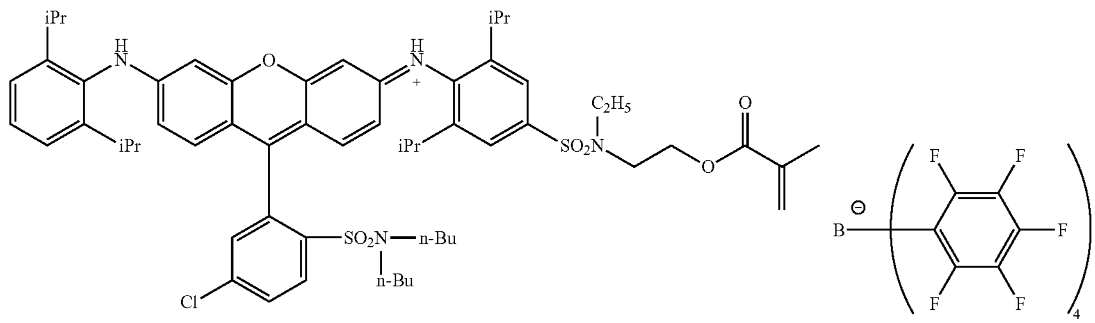
M-21
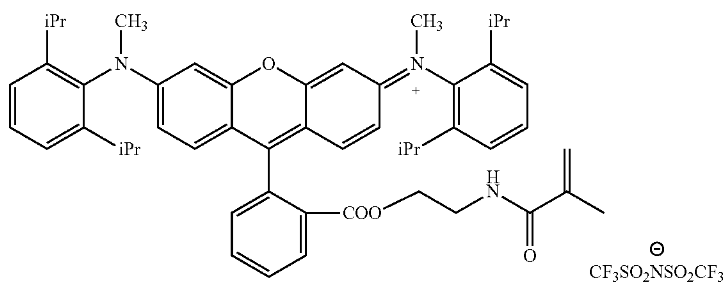
M-22
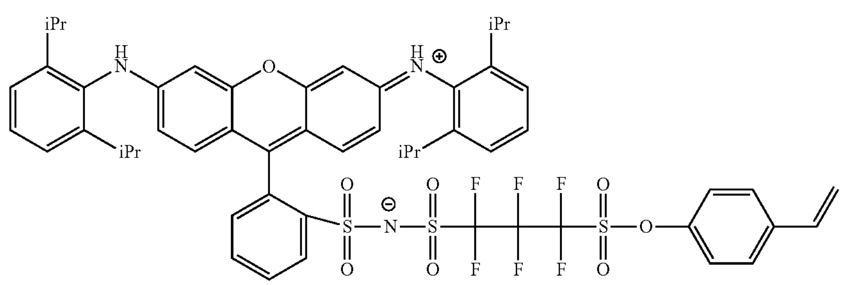
M-23
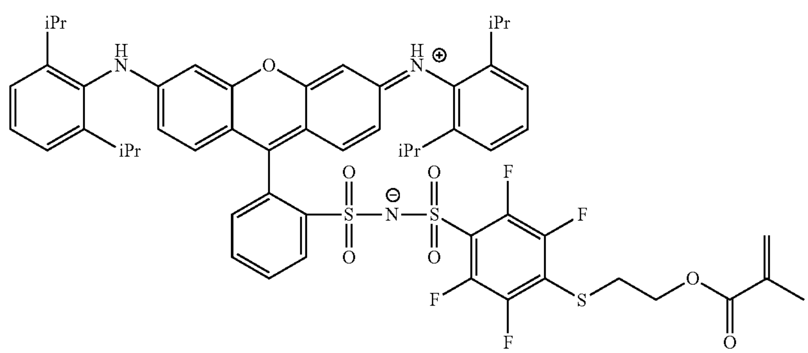

-continued
M-24
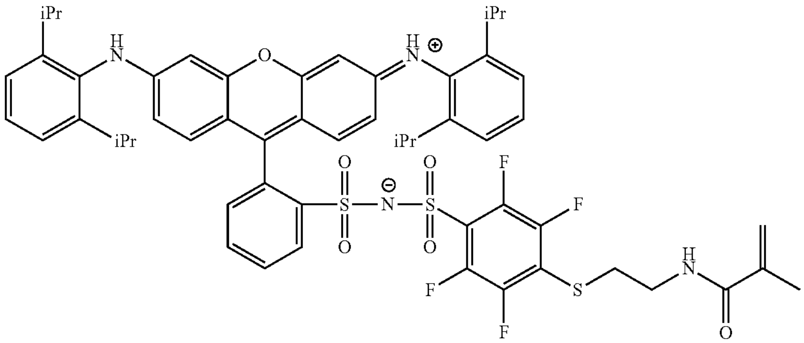
M-25
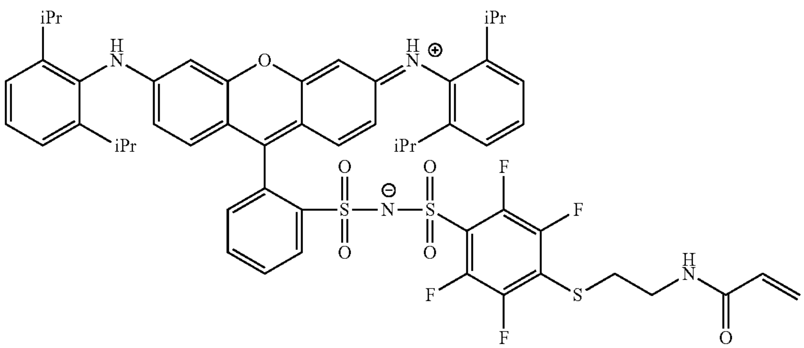
M-26
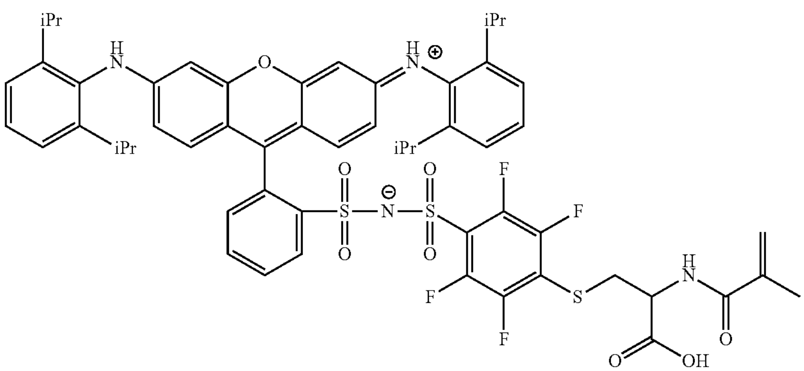
M-27
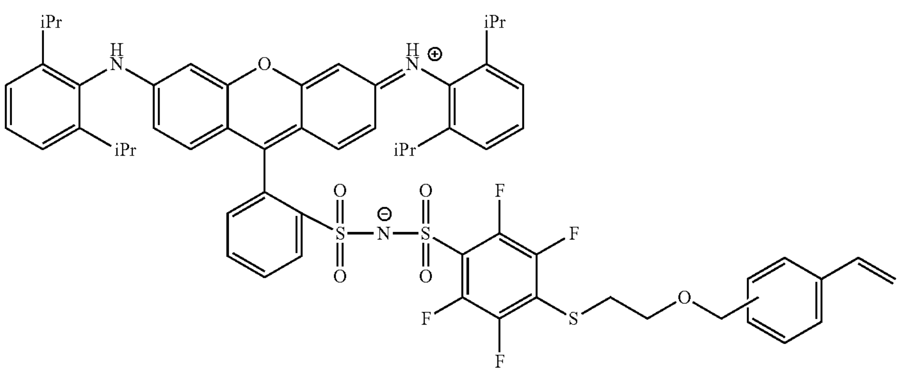

-continued
M-28
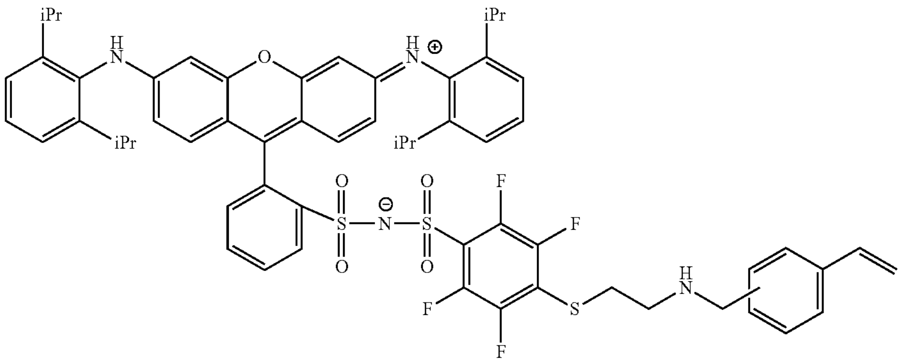
M-29
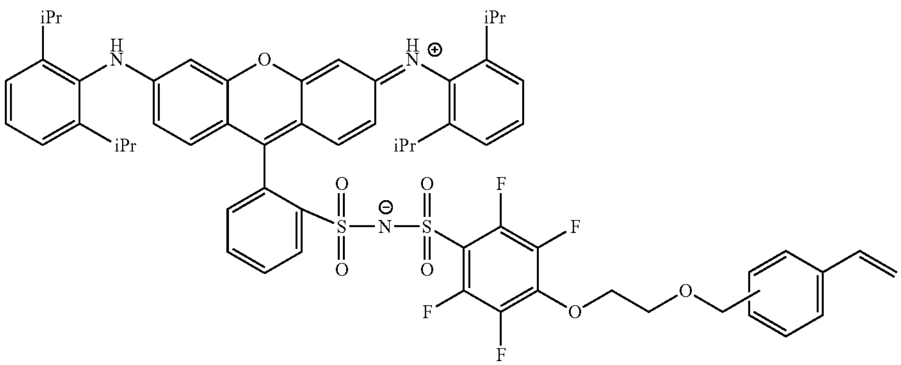
M-30
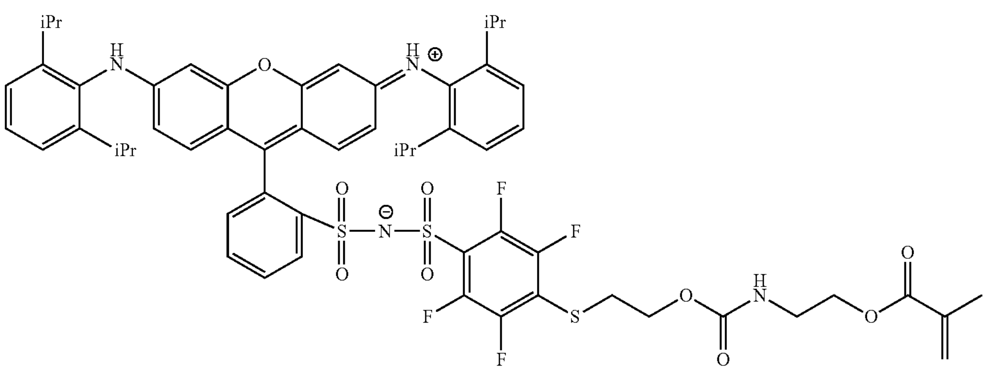
M-31
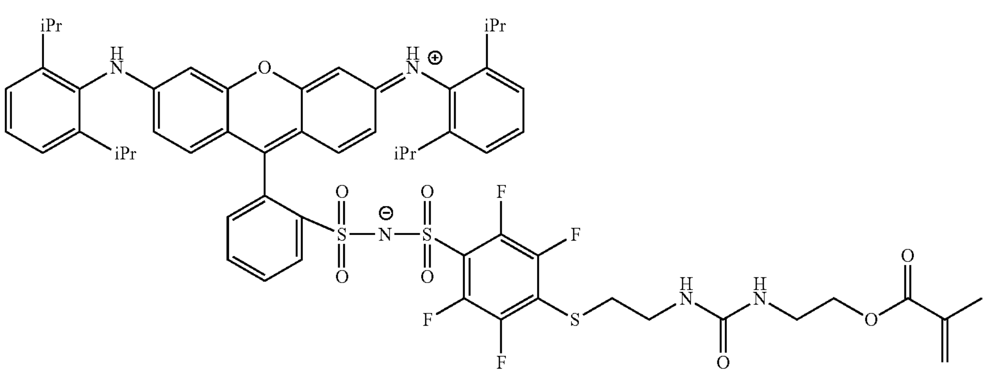

-continued
M-32
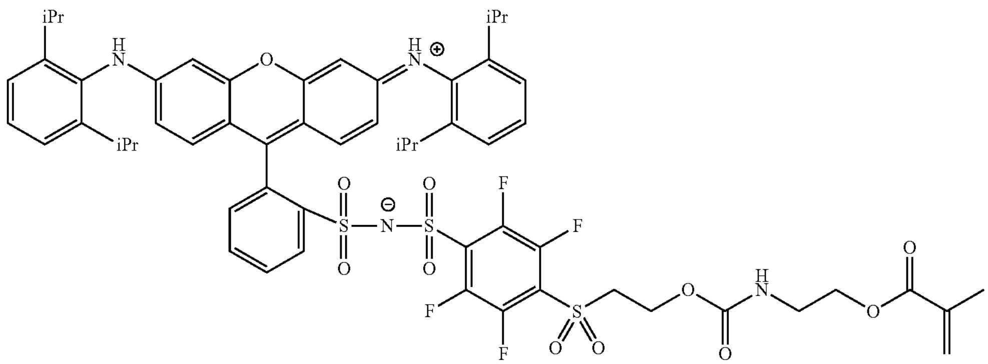
M-33
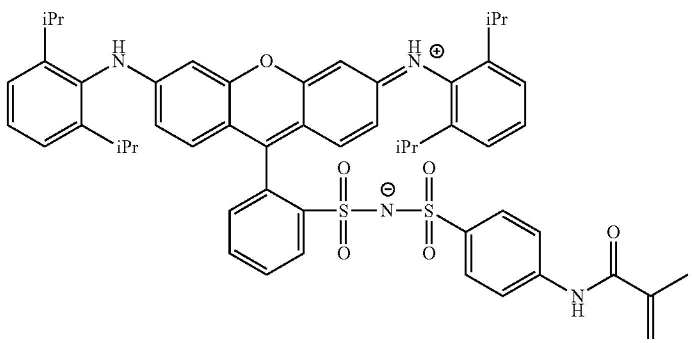
M-34
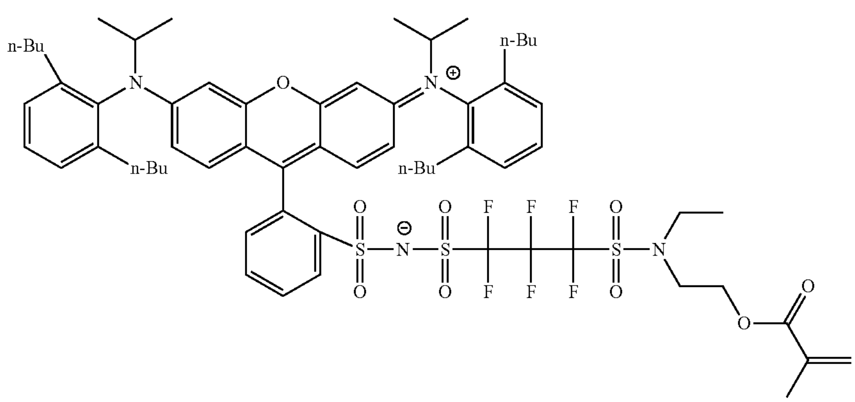
M-35
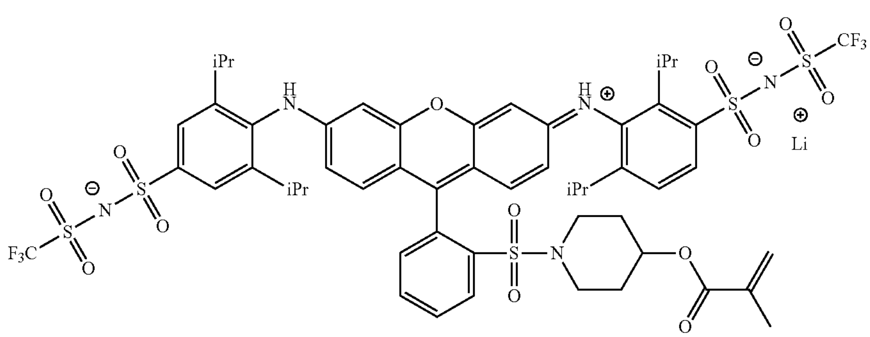

-continued
M-36
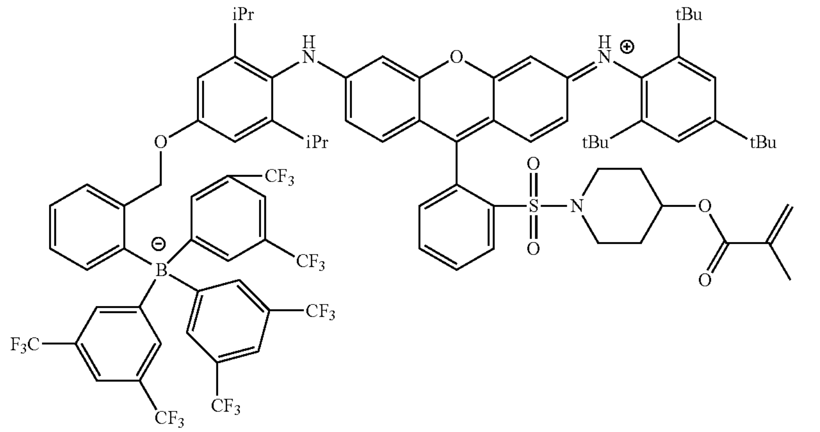
M-37
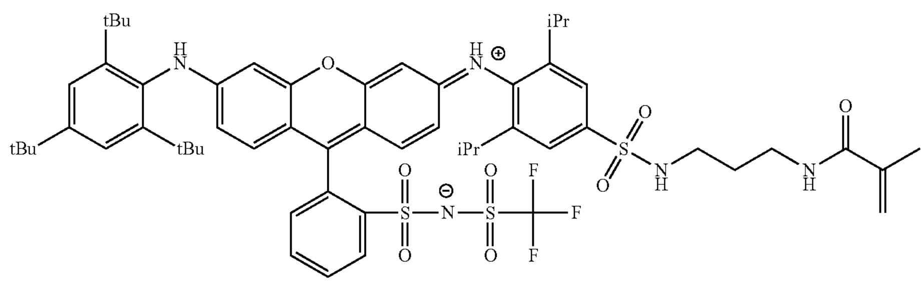
M-38
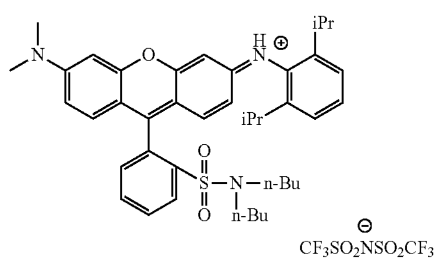
M-39
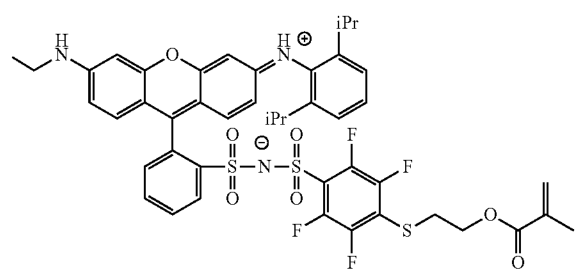
M-40
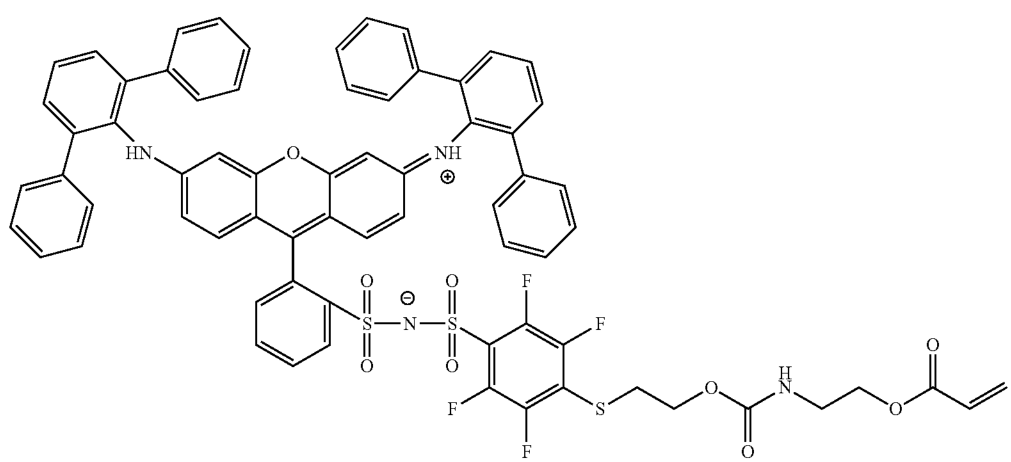

-continued
M-41
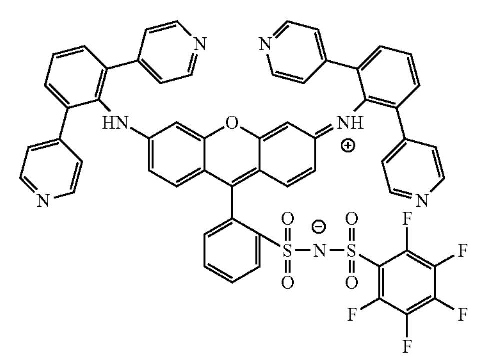
M-42
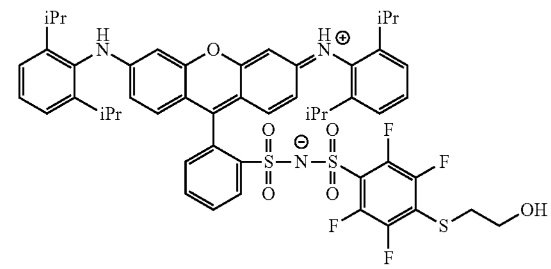
M-43
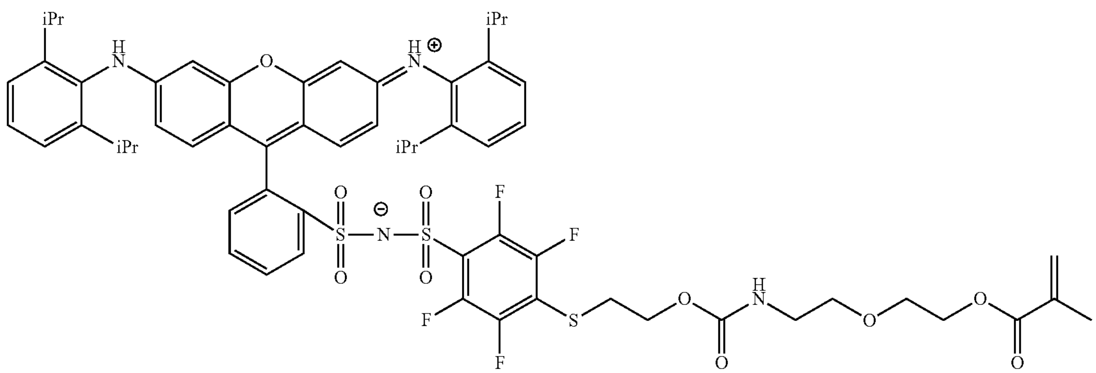
M-44
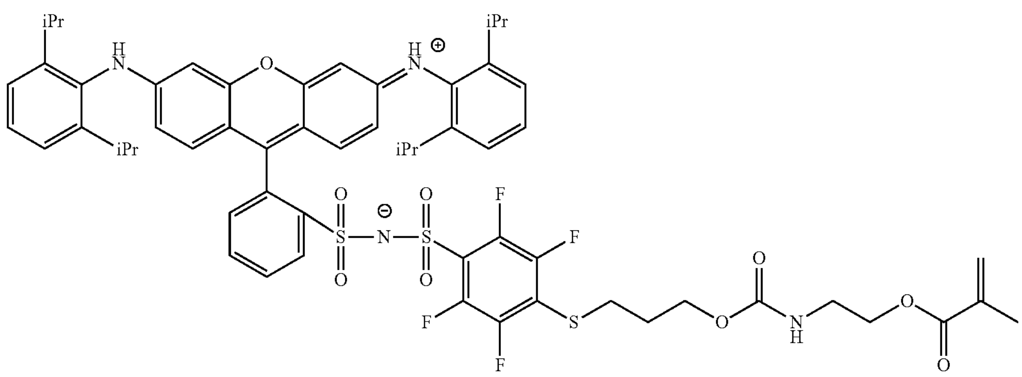
M-45
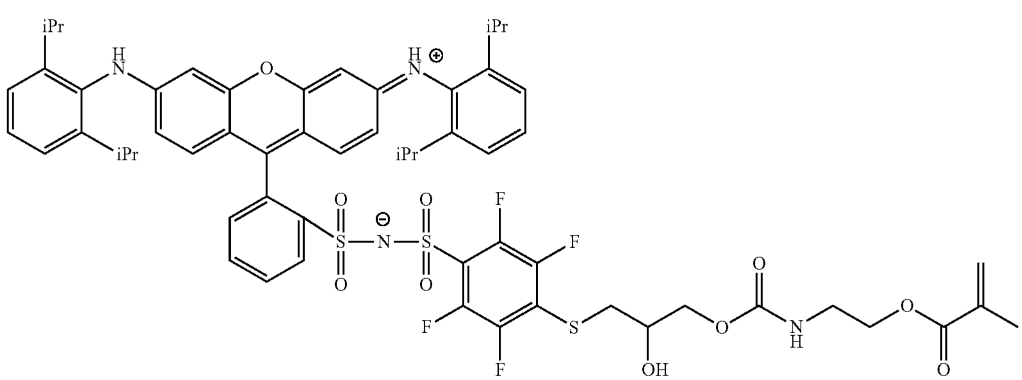

-continued
M-46
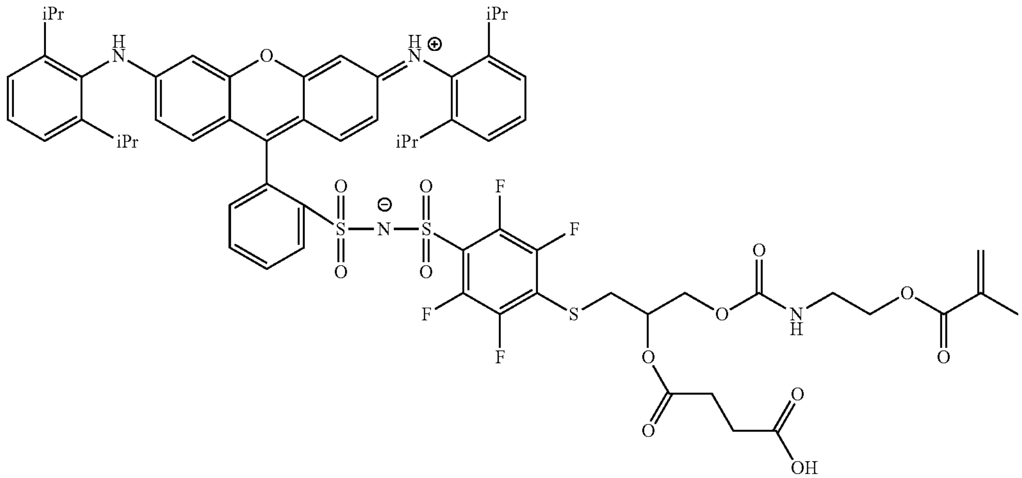
M-47
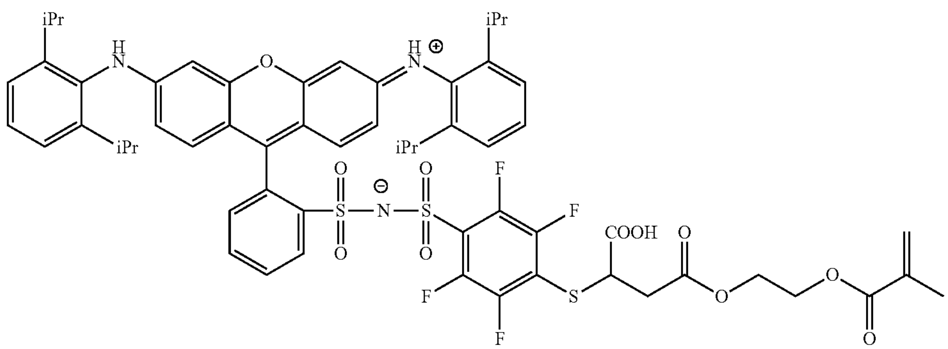
M-48
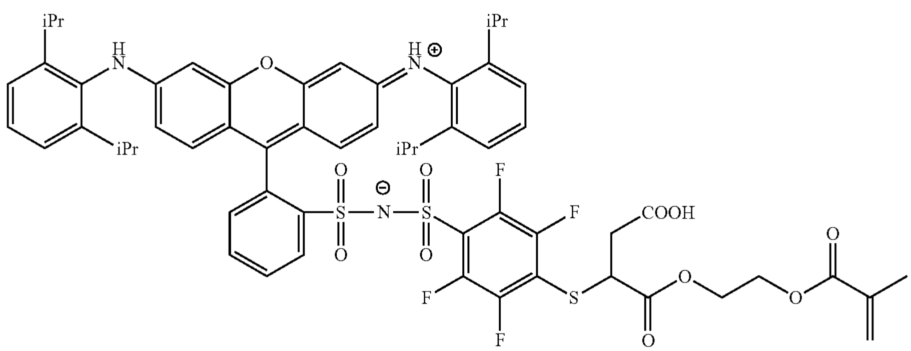
M-49
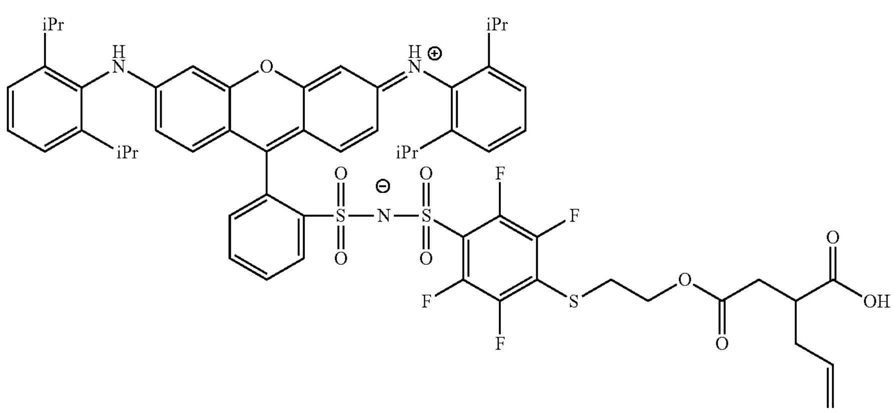

-continued

M-50

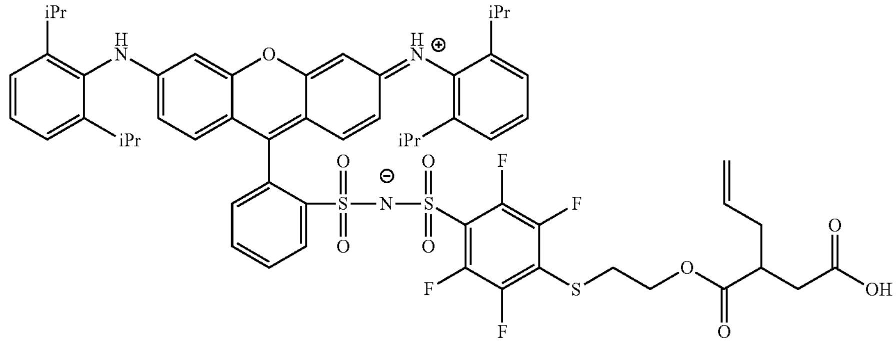

The compound having a xanthene skeleton can be synthesized using the method described in the literature. Specifically, the methods described in Tetrahedron Letters, 2003, vol. 44, No. 23, pp. 4355 to 4360; Tetrahedron Letters, 2005, vol. 61, No. 12, pp. 3097 to 3106; and the like can be applied.

The content of the colorant compound represented by General Formula (1) in a low molecular type in the coloring composition of the present invention is preferably 5% by mass to 65% by mass, and more preferably 10% by mass to 30% by mass, with respect to the total solid content of the coloring composition.

Further, in the case where the coloring composition of the present invention includes another coloring agent (for example, a pigment), in addition to the colorant compound represented by General Formula (1) in the low molecular type, the content is set in consideration of the content ratio with respect to the coloring agent.

The mass ratio (colorant multimer/pigment) of the colorant compound represented by General Formula (1) to the coloring agent is preferably 0.2 to 1, more preferably 0.25 to 0.8, and still more preferably 0.3 to 0.6.

<<High Molecular Type>>

Next, a case where the colorant compound represented by General Formula (1) is in a high molecular type will be described. Further, in the present specification, in the case where the colorant compound represented by General Formula (1) in is the high molecular type, it may be referred to as a colorant multimer in some cases.

In the case of the high molecular type, at least one substituent of the colorant compound represented by General Formula (1) is bonded to a polymer, and at least one group of $X^1$ to $X^3$, $R^7$, or $R^8$ in General Formula (1) or General Formula (2) is preferably a repeating unit of the polymer. The respective substituents in General Formula (1) and General Formula (2), other than a group bonded to the repeating unit of the polymer, have the same definitions as the low molecular type, and preferred ranges thereof are also the same.

The skeleton structure of the repeating unit in the case where the colorant compound represented by General Formula (1) is a polymer is not particularly defined, but it has preferably at least one of the structural unit represented by General Formula (A), the structural unit represented by General Formula (B), or the structural unit represented by General Formula (C) shown in paragraph Nos. 0276 to 0304 of JP2013-28764A as a skeleton, or the colorant compound represented by General Formula (1) is the colorant compound represented by General Formula (D). The descriptions in paragraph Nos. 0276 to 0304 of JP2013-28764A are hereby incorporated by reference.

In the present invention, a colorant multimer represented by the following General Formula (A) is preferably included.

The proportion of the repeating unit having a xanthene colorant structure is preferably 10% by mole to 35% by mole, and more preferably 15% by mole to 30% by mole, with respect to the total repeating units constituting the colorant multimer.

<<<Structural Unit Represented by General Formula (A)>>>

General Formula (A)

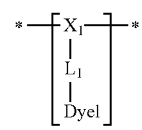

(In General Formula (A), $X_1$ represents a linking group formed by polymerization, and $L_1$ represents a single bond or a divalent linking group. DyeI is a site for bonding to at least one of $Ar^1$, $Ar^2$, $R^7$, or $R^8$ in General Formula (1).)

General Formula (A) will be described in detail below.

In General Formula (A), $X_1$ represents a linking group formed by polymerization, that is, a moiety forming a repeat unit corresponding to a main chain formed by polymerization reaction. Further, the moiety defined by two asterisks (*) forms the repeat unit. $X_1$ is not particularly limited as long as it is a linking group formed from a known polymerizable monomer, but is preferably a linking group represented by (XX-1) to (XX-24) below; more preferably a (meth)acryl-based linking chain represented by (XX-1) and (XX-2), a styrene-based linking chain represented by (XX-10) to (XX-17), and a vinyl-based linking chain represented by (XX-18) and (XX-19), and (XX-24). In (XX-1) to (XX-24); still more preferably a (meth)acryl-based linking chain represented by (XX-1) and (XX-2), a styrene-based linking chain represented by (XX-10) to (XX-17), and a vinyl-based linking chain represented by (XX-24). In (XX-1) to (XX-24); and even still more preferably a (meth)acryl-based linking chain represented by (XX-1) and (XX-2), and a styrene-based linking chain represented by (XX-11).

In (XX-1) to (XX-24), * represents a site for linking to $L_1$. Me represents a methyl group. Further, R in (XX-18) and (XX-19) represents a hydrogen atom, an alkyl group having 1 to 5 carbon atoms, or a phenyl group.

(XX-1)
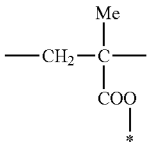
(XX-2)
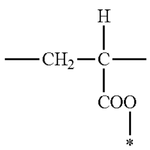
(XX-3)
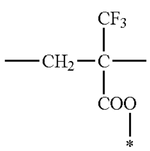
(XX-4)
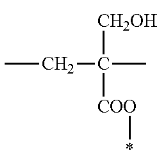
(XX-5)
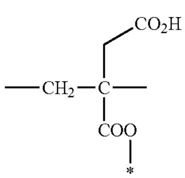
(XX-6)
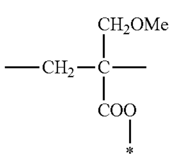
(XX-7)
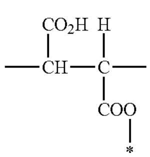
(XX-8)
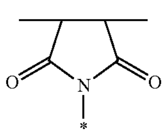
(XX-9)
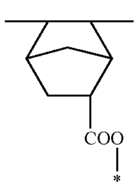
-continued
(XX-10)
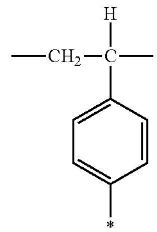
(XX-11)
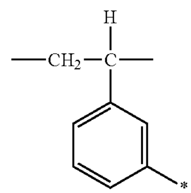
(XX-12)
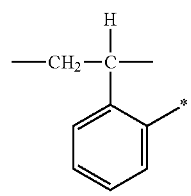
(XX-13)
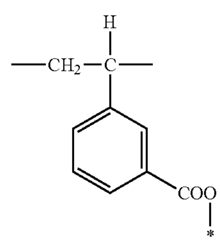
(XX-14)
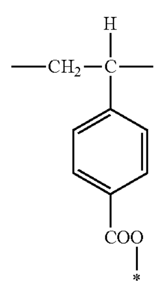
(XX-15)
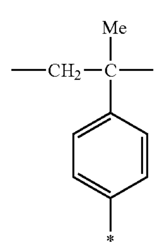

-continued (XX-16)

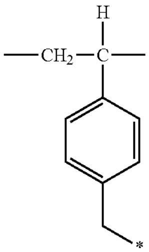

(XX-17)

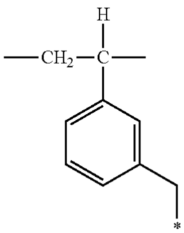

(XX-18)

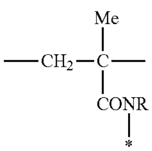

(XX-19)

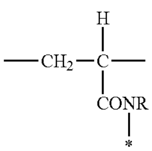

(XX-20)

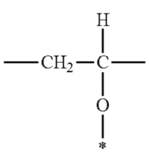

(XX-21)

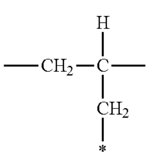

(XX-22)

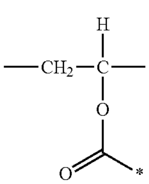

(XX-23)

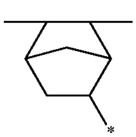

(XX-24)

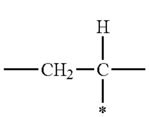

-continued (XX-25)

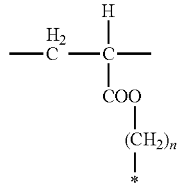

(XX-26)

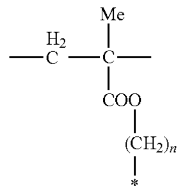

(XX-27)

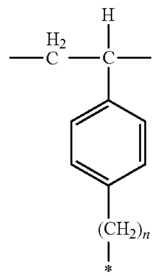

(XX-28)

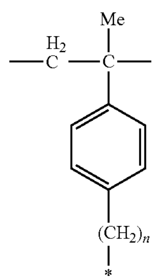

(XX-29)

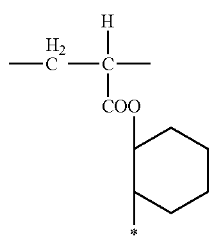

(XX-30)

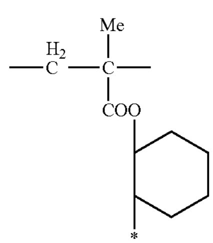

In General Formula (A), $L_1$ represents a single bond or a divalent linking group. In the case where $L_1$ represents a divalent linking group, the divalent linking group represents a substituted or unsubstituted alkylene group having 1 to 30 carbon atoms (for example, a methylene group, an ethylene group, a trimethylene group, a propylene group, and a butylene group), a substituted or unsubstituted arylene group having 6 to 30 carbon atoms (for example, a phenylene group and a naphthalene group), a substituted or unsubstituted heterocyclic linking group, —CH═CH—, —O—, —S—, —C(═O)—, —$CO_2$—, —NR—, —CONR—, —$O_2C$—, —SO—, —$SO_2$—, and a linking group formed of two or more of these linked to each other. Further, a configuration in which $L_1$ includes an anion is also preferable. $L_1$ is more preferably a single bond or an alkylene group, and still more preferably a single bond or —$(CH_2)_n$— (n is an integer of 1 to 5). Herein, R's each independently represent a hydrogen atom, an alkyl group, an aryl group, or a heterocyclic group. Examples of the case where $L_1$ includes an anion will be described later.

In General Formula (A), DyeI represents a site for bonding to any one of $Ar^1$, $Ar^2$, $R^7$, and $R^8$ in General Formula (1). In the case of bonding to $Ar^1$ or $Ar^2$, any one position of $X^1$ to $X^3$ in General Formula (2) is preferable as a boding position.

In the present invention, DyeI is more preferably a site for bonding to $R^7$ in General Formula (1).

The colorant multimer having the repeating unit represented by General Formula (A) can be synthesized by (1) a method for synthesizing the multimer by means of addition polymerization using monomers having a colorant residue, or (2) a method for synthesizing the multimer by causing a reaction between a polymer having a highly reactive functional group such as an isocyanate group, an acid anhydride group, and an epoxy group, and a colorant having a functional group (a hydroxyl group, a primary or secondary amino group, a carboxyl group, or the like) which can react with the highly reactive group.

For the addition polymerization, known addition polymerization (radical polymerization, anionic polymerization, or cationic polymerization) can be applied. Among these, it is particularly preferable that the colorant multimer is synthesized by radical polymerization, since the reaction condition can be set to be mild conditions, and the colorant structure is not degraded. For the radical polymerization, known reaction conditions can be applied. That is, the colorant multimer used in the present invention is preferably an addition polymer.

Among these, from the viewpoint of heat resistance, the colorant multimer having the repeating unit represented by General Formula (A) in the present invention is preferably a radical polymer which is obtained by radical polymerization using a colorant monomer having an ethylenically unsaturated bond.

In particular, it is preferable that one group selected from the substituents $X^1$ to $X^3$, $R^7$, and $R^8$ is a repeating unit structure represented by the following General Formula (4).

General Formula (4)

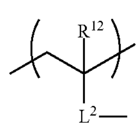

$R^{12}$ represents a hydrogen atom, a methyl group, a hydroxymethyl group, or an alkoxymethyl group. $L^2$ represents a single bond or a divalent linking group.

In the case where $L^2$ represents a divalent linking group, specific examples thereof are the same as $L^1$ in General Formula (3), and preferred ranges thereof are also the same.

<<<Other Functional Groups and Repeating Units>>>

In the colorant multimer of the present invention, the colorant multimer may have other functional groups in the colorant structure moiety of the aforementioned colorant multimer. Examples of such other functional groups include a polymerizable group and an alkali-soluble group (preferably an acid group).

Furthermore, the colorant multimer of the present invention may include other repeating units in addition to the repeating unit including the aforementioned colorant structure. Such other repeating unit may have a functional group.

Moreover, examples of such other repeating units include repeating units including at least one of a polymerizable group or an alkali-soluble group (preferably an acid group).

That is, the colorant multimer of the present invention may have other repeating units, in addition to the repeating units represented by General Formulae (A) to (C). One kind or two or more kinds of other repeating unit may be included in one colorant multimer.

In addition, the colorant multimer of the present invention may have other functional groups in the colorant multimers represented by General Formulae (A) to (D). Details thereof will be described below.

<<<<Polymerizable Group Contained in Colorant Multimer>>>>

The colorant multimer of the present invention preferably includes a polymerizable group. One kind or two or more kinds of the polymerizable group may be included.

For the polymerizable group, the colorant structure may contain a polymerizable group, or include other moieties. In the present invention, it is preferable that the colorant structure contains a polymerizable group. By adopting this configuration, heat resistance tends to be improved.

Furthermore, in the present invention, an embodiment in which other moiety other than the colorant structure contains a polymerizable group is also preferable.

As the polymerizable group, known polymerizable groups which can be crosslinked by a radical, an acid, or heat can be used, and examples thereof include a group including an ethylenically unsaturated bond, a cyclic ether group (an epoxy group and an oxetane group), and a methylol group. Particularly, a group including an ethylenically unsaturated bond is preferable, a (meth)acryloyl group is more preferable, and (meth)acryloyl groups derived from glycidyl (meth)acrylate and 3,4-epoxy-cyclohexyl methyl(meth) acrylate are still more preferable.

The polymerizable group is preferably included as a repeating unit having a polymerizable group in the colorant multimer, and is more preferably included as a repeating unit having an ethylenically unsaturated bond. That is, one examples of preferred embodiments of the colorant multimer of the present invention is an embodiment in which the colorant multimer contains a repeating unit including a colorant monomer and a repeating unit having a polymerizable group, and more preferably an embodiment in which the colorant multimer contains a repeating unit including a colorant monomer and a repeating unit having an ethylenically unsaturated bond.

As the method for introducing the polymerizable group, there are (1) a method for introducing the polymerizable group by modifying the colorant multimer with a polymerizable group-containing compound, (2) a method for introducing the polymerizable group by copolymerizing the colorant multimer with a polymerizable group-containing compound, and the like. Hereinafter, the methods will be described in detail.

(1) Method for Introducing Polymerizable Group by Modifying Colorant Multimer with Polymerizable Group-Containing Compound:

As the method for introducing the polymerizable group by modifying the colorant multimer with a polymerizable group-containing compound, known methods can be used without particular limitation. For example, from the viewpoint of production, (a) a method of reacting a carboxylic acid contained in the colorant multimer with an unsaturated bond-containing epoxy compound, (b) a method of reacting a hydroxyl group or an amino group contained in the colorant multimer with an unsaturated bond-containing isocyanate compound, and (c) a method of reacting an epoxy compound contained in the colorant multimer with an unsaturated bond-containing carboxylic acid compound are preferable from the viewpoint of production.

Examples of the unsaturated bond-containing epoxy compound include (a) the method of reacting a carboxylic acid contained in the colorant multimer with an unsaturated bond-containing epoxy compound include glycidyl methacrylate, glycidyl acrylate, allylglycidyl ether, 3,4-epoxy-cyclohexylmethyl acrylate, and 3,4-epoxy-cyclohexylmethyl methacrylate, and the like. Glycidyl methacrylate and 3,4-epoxy-cyclohexylmethyl methacrylate are particularly preferable since these compounds have excellent crosslinking properties and storage stability. Known conditions can be used as the reaction conditions.

Examples of the unsaturated bond-containing isocyanate compound in (b) the method of reacting a hydroxyl group or an amino group contained in the colorant multimer with an unsaturated bond-containing isocyanate compound include 2-isocyanatoethyl methacrylate, 2-isocyanatoethyl acrylate, and 1,1-bis(acryloyloxymethyl)ethyl isocyanate. Among these, 2-isocyanatoethyl methacrylate is preferable since it has excellent crosslinking properties and storage stability. Known conditions can be used as the reaction conditions.

As the unsaturated bond-containing carboxylic acid compound in (c) the method of reacting an epoxy compound contained in the colorant multimer with an unsaturated bond-containing carboxylic acid compound, any carboxylic acid compounds can be used without particular limitation as long as the compound has a known (meth)acryloyloxy group. Among these, methacrylic acid and acrylic acid are preferable, and methacrylic acid is particularly preferable since this acid has excellent crosslinking properties and storage stability. Known conditions can be used as the reaction conditions.

(2) Method for Introducing Polymerizable Group by Copolymerizing Colorant Monomer and Polymerizable Group-Containing Compound:

As (2) the method for introducing a polymerizable group by copolymerizing a colorant monomer and a polymerizable group-containing compound, any known methods can be used without particular limitation. Among these, (d) a method of copolymerizing a radically polymerizable colorant monomer with a polymerizable group-containing compound which can be radically polymerized, and (e) a method of copolymerizing a colorant monomer which can be subjected to polyaddition with a polymerizable group-containing compound which can be subjected to polyaddition are preferable.

Examples of the polymerizable group-containing compound which can be radically polymerized in (d) a method of copolymerizing a radically polymerizable colorant monomer with a polymerizable group-containing compound which can be radically polymerized particularly include an allyl group-containing compound (for example, allyl (meth) acrylate or the like), an epoxy group-containing compound (for example, glycidyl (meth)acrylate, 3,4-epoxy-cyclohexyl methyl (meth)acrylate), an oxetane group-containing compound (for example, 3-methyl-3-oxetanyl methyl (meth)acrylate or the like), and a methylol group-containing compound (for example, N-(hydroxymethyl)acrylamide or the like). Among these, an epoxy group-containing compound and an oxetane group-containing compound are particularly preferable. Known conditions can be used as the reaction conditions.

Examples of the polymerizable group-containing compound which can be subjected to polyaddition in (e) a method of copolymerizing a colorant monomer which can be subjected to polyaddition with a polymerizable group-containing compound which can be subjected to polyaddition include an unsaturated bond-containing diol compound (for example, 2,3-dihydroxypropyl (meth)acrylate), and the like. Known conditions can be used as the reaction conditions.

As the method for introducing a polymerizable group, a method of reacting a carboxylic acid contained in the colorant multimer with an unsaturated bond-containing epoxy compound is particularly preferable.

The amount of the polymerizable group contained in the colorant multimer is preferably 0.1 mmol to 2.0 mmol, more preferably 0.2 mmol to 1.5 mmol, and particularly preferably 0.3 mmol to 1.0 mmol, with respect to 1 g of the colorant multimer.

Furthermore, the proportion of the repeating units containing the repeating unit in which the colorant multimer contains a polymerizable group is preferably for example, 5 moles to 50 moles, and more preferably 10 moles to 20 moles, with respect to 100 moles of the total repeating units.

As the method for introducing a polymerizable group, a method in which a carboxylic acid contained in the colorant multimer is reacted with a carboxylic acid contained in the colorant multimer and an unsaturated bond-containing epoxy compound is particularly preferable.

Specific examples of repeating units having the polymerizable group will be shown below, but the present invention is not limited thereto.

(G-3)

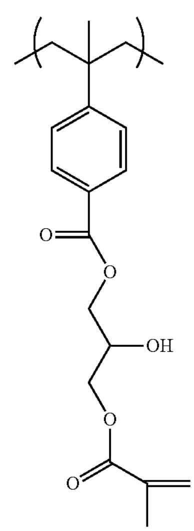

-continued
(G-4)
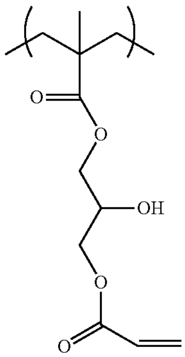
(G-5)
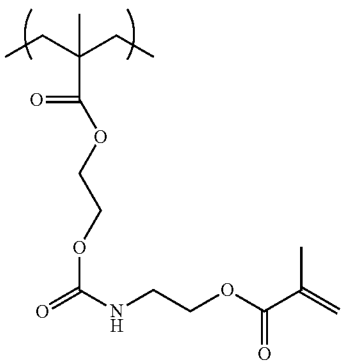
(G-6)
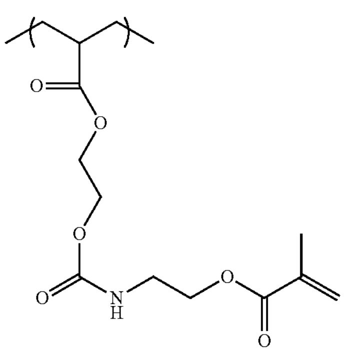
(G-7)
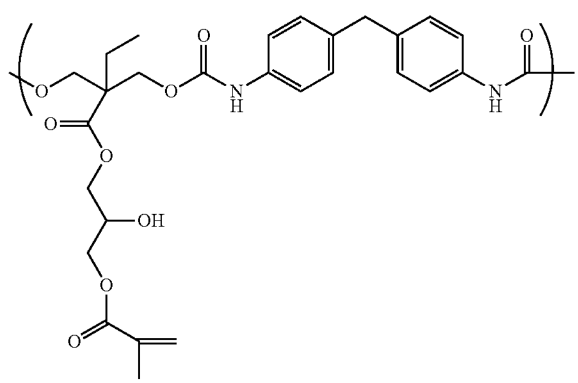
-continued
(G-8)
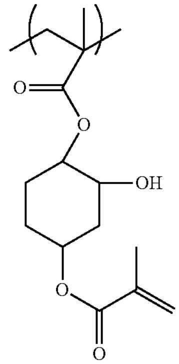
(G-9)
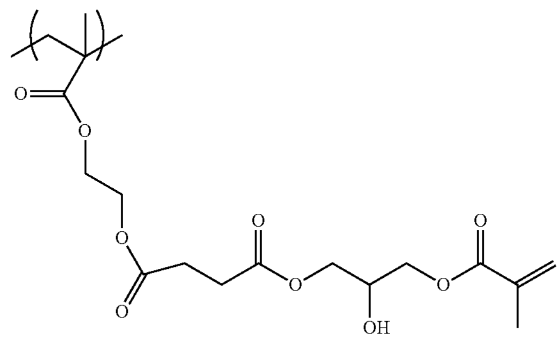
(G-10)
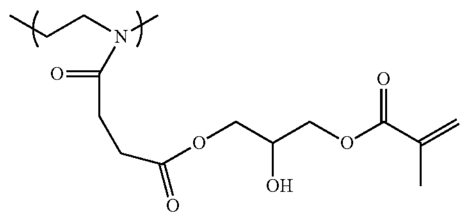
(G-11)
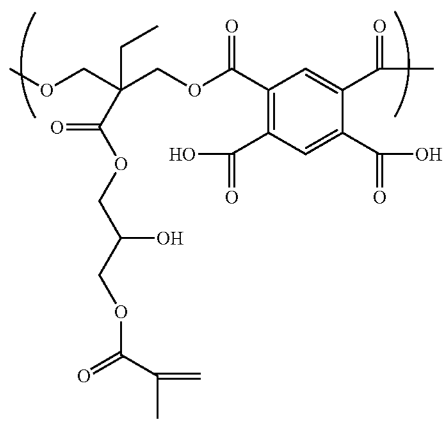
(G-12)
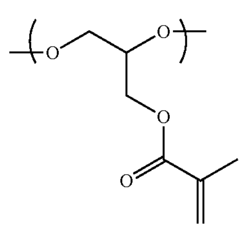

-continued (G-13)

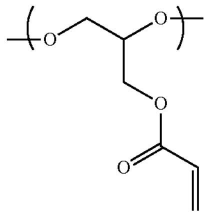

(G-14)

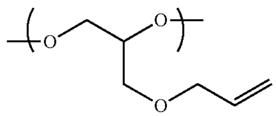

(G-15)

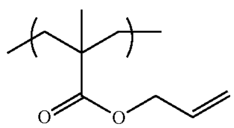

(G-16)

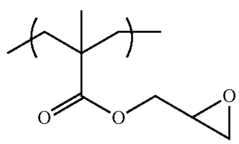

(G-17)

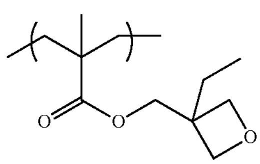

<<<Alkali-Soluble Group Contained in Colorant Multimer>>>

Example of the alkali-soluble group which may contained in the colorant multimer in the present invention is an acid group, examples of the acid group include a carboxylic acid group, a sulfonic acid group, and a phosphoric acid group.

In the present invention, it is preferable that an alkali-soluble group (preferably an acid group) is included in the colorant multimer as a repeating unit having an alkali-soluble group (an acid group).

Examples of the method for introducing the alkali-soluble group into the colorant multimer include a method in which an alkali-soluble group is introduced into a colorant monomer in advance and a method of copolymerizing monomers (a caprolactone-modified derivative of (meth)acrylic acids and acrylic acids, a succinic anhydride-modified derivative of 2-hydroxyethyl (meth)acrylate, a phthalic anhydride-modified derivative of 2-hydroxyethyl (meth)acrylate, a 1,2-cyclohexane dicarboxylic acid anhydride-modified derivative of 2-hydroxyethyl (meth)acrylate, carboxylic acid-containing monomers such as styrene carboxylic acid, itaconic acid, maleic acid, and norbornene carboxylic acid, phosphoric acid-containing monomers such as acid phosphoxyethyl methacrylate, and vinyl phosphonic acid, and sulfonic acid-containing monomers such as vinyl sulfonic acid and 2-acrylamide-2-methylsulfonic acid) other than a colorant monomer having an alkali-soluble group. It is preferable to use both of the methods.

The amount of the alkali-soluble groups contained in the colorant multimer is preferably 0.3 mmol to 2.0 mmol, more preferably 0.4 mmol to 1.5 mmol, and particularly preferably 0.5 mmol to 1.0 mmol, with respect to 1 g of the colorant multimer.

Further, in the case where the colorant multimer contains a repeating unit including a colorant monomer and a repeating unit having an acid group, the proportion of the repeating unit containing the repeating unit having an acid group is, for example, preferably 5 moles to 70 moles, and more preferably 10 moles to 50 moles, with respect to 100 moles of the repeating unit including a colorant monomer.

The colorant multimer used in the present invention may include a repeating unit having a group composed of 2 to 20 unsubstituted repeating alkyleneoxy chains in the side chain (hereinafter referred to as a "(b) repeating unit" in some cases) as a repeating unit including an alkali-soluble group.

The repeating number of the alkyleneoxy chains contained in the repeating unit (b) is preferably 2 to 10, more preferably 2 to 15, and still more preferably 2 to 10.

One alkyleneoxy chain is represented by $—(CH_2)_nO—$, and n is an integer. n is preferably 1 to 10, more preferably 1 to 5, and still more preferably 2 or 3.

The group composed of 2 to 20 unsubstituted repeating alkyleneoxy chains in the present invention may include one kind or two or more kinds of alkyleneoxy chain.

In the present invention, the (b) repeating unit is preferably represented by the following General Formula (P).

General Formula (P)

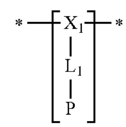

(In General Formula (P), $X_1$ represents a linking group formed by polymerization, $L_1$ represents a single bond or a divalent linking group, and P represents a group including a group composed of repeating alkyleneoxy chains.)

$X_1$ and $L_1$ in General Formula (P) each have same definitions as $X_1$ and $L_1$ in General Formula (A), and preferred ranges thereof are also the same.

P represents a group including a group composed of repeating alkyleneoxy chains, and is more preferably composed of a-group composed of repeating alkyleneoxy chains-terminal atom or terminal group.

As the terminal atom or terminal group, a hydrogen atom, an alkyl group, an aryl group, or a hydroxyl group is preferable, a hydrogen atom, an alkyl group having 1 to 5 carbon atoms, a phenyl group, or a hydroxyl group is more preferable, a hydrogen atom, a methyl group, a phenyl group, or a hydroxyl group is still more preferable, and a hydrogen atom is particularly preferable.

The ratio of the (b) repeating unit having a group composed of 2 to 20 unsubstituted repeating alkyleneoxy chains in the side chain is preferably 2% by mole to 20% by mole, and more preferably 5% by mole to 15% by mole, with respect to the total repeating units constituting the colorant multimer.

Hereinafter, examples of the (b) repeating unit which can be used in the present invention are shown below, but it is certain that the present invention is not limited thereto.

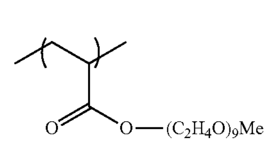

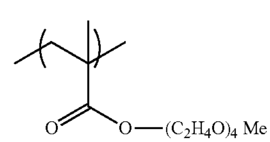

-continued

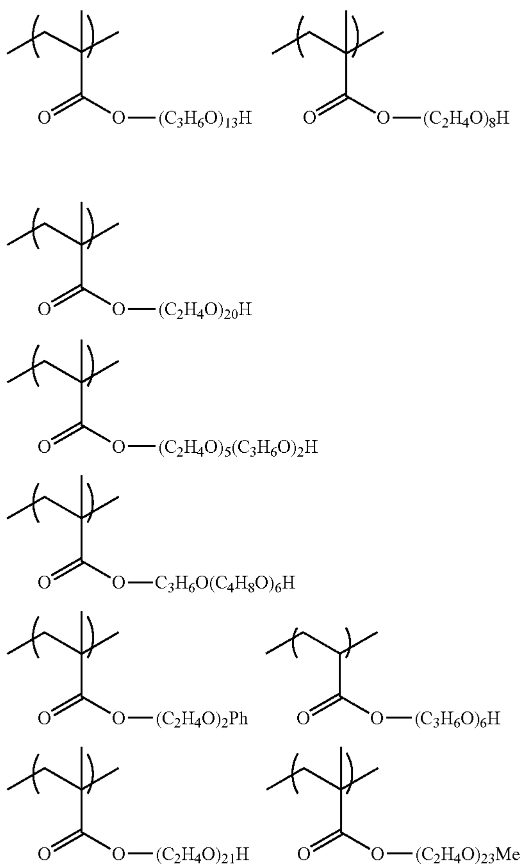

-continued

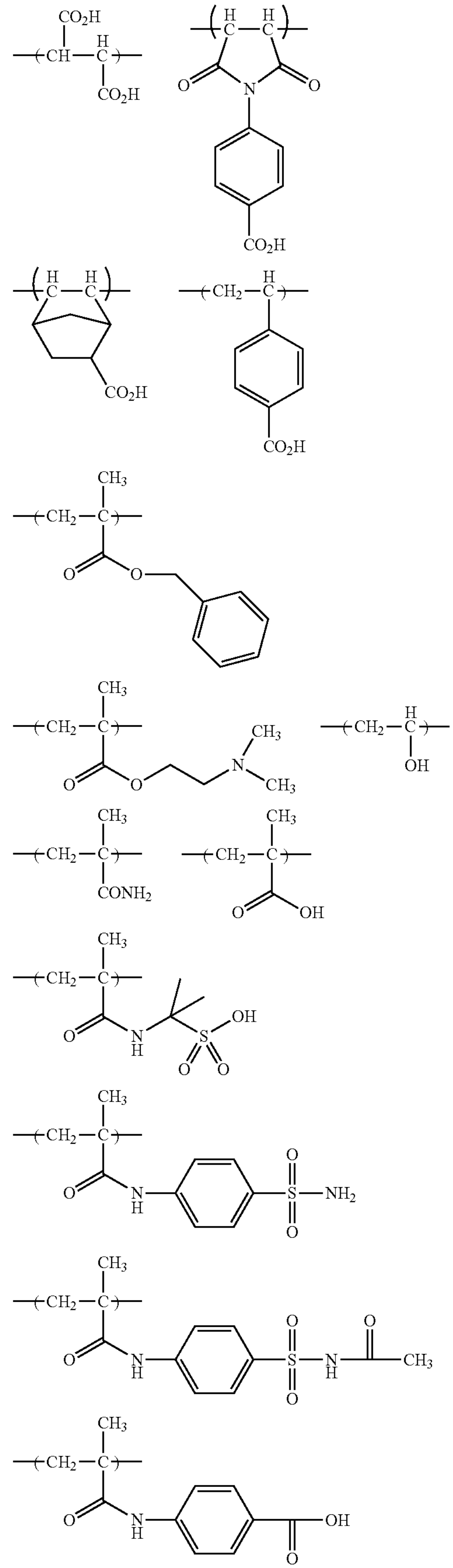

Examples of other functional groups contained in the colorant multimer include a development accelerator such as lactone, acid anhydride, amide, —$COCH_2CO$—, and a cyano group, and a hydrophobicity- or hydrophilicity-regulating group such as a long-chained alkyl group, a cyclic alkyl group, an aralkyl group, an aryl group, a polyalkylene oxide group, a hydroxyl group, a maleimide group, and an amino group. These can be appropriately introduced.

Examples of the method for introducing the functional group include a method for introducing the functional group in advance to the colorant monomer and a method of copolymerizing a monomer having the functional group.

Specific examples of the repeating units having a functional group other than an alkali-soluble group which may be contained in the colorant multimer are shown below, but the present invention is not limited thereto.

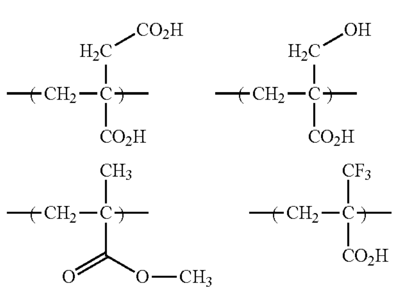

-continued (H-22)

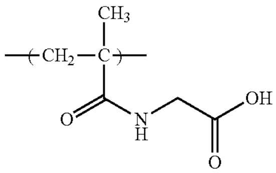

(H-23)

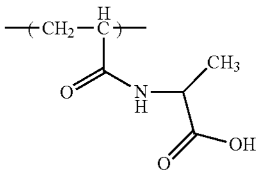

(H-24)

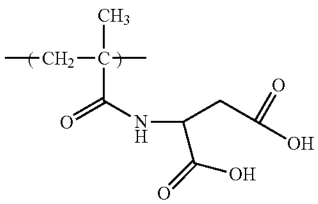

(H-25)

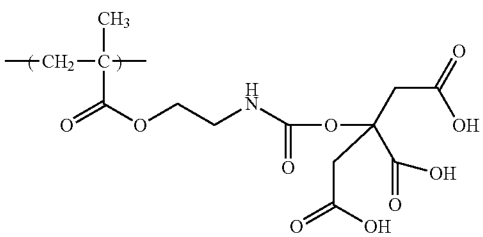

(H-26)

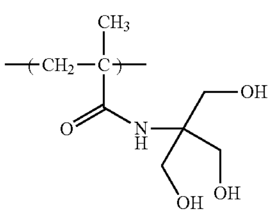

(H-27)

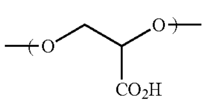

(H-28)

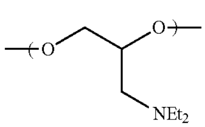

(H-29)

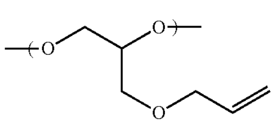

(H-30)

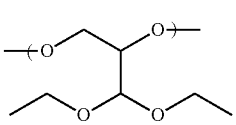

-continued (H-31)

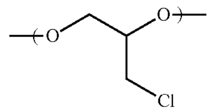

(H-32)

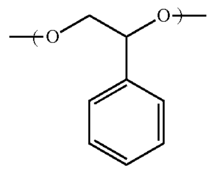

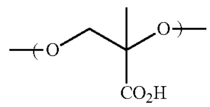

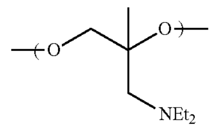

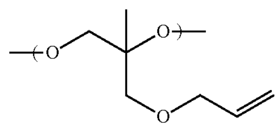

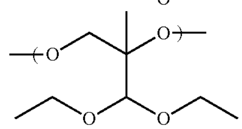

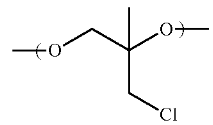

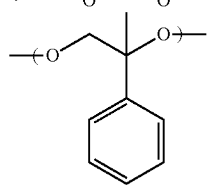

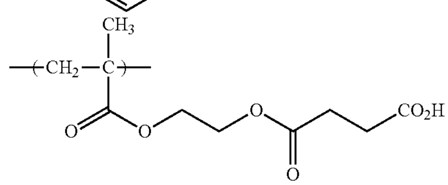

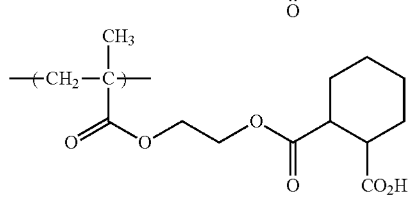

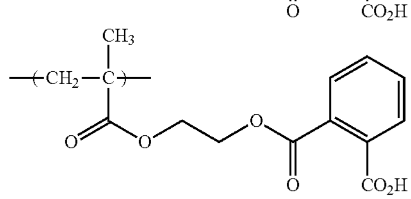

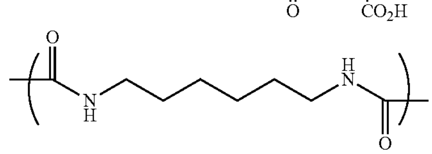

<<<<Structural Unit Having at Least One of Structure Represented by Formula (1), . . . , or Structure Represented by Formula (5)>>>>

The colorant multimer used in the present invention may have at least one of the structure represented by Formula (1), the structure represented by Formula (2), the structure represented by Formula (3), the structure represented by Formula (4), or the structure represented by Formula (5) in the same molecule. In the case of preparing a cured film by adopting such a configuration, exposure sensitivity and light fastness scan be improved. Here, the structures represented by Formulae (1) to (5) function as a photo stabilizer, and thus, contribute to exposure sensitivity and light fastness. Further, adhesiveness can be improved, and also, generation of the developing residues can be suppressed. This mechanism is presumed, but by using a colorant multimer having the colorant structure and at least one of the structure represented by Formula (1), the structure represented by Formula (2), the structure represented by Formula (3), the structure represented by Formula (4), or the structure represented by Formula (5) in the same molecule, the distance between the colorant structure and the structures represented by Formulae (1) to (5) is shortened. As a result, it can be thought that exposure sensitivity and light fastness can be more effectively improved.

The structures represented by Formula (1) are collectively referred to as hindered amines. The structures represented by Formula (2) are collectively referred to as hindered phenols. The structures represented by Formula (3) are collectively referred to as benzotriazoles. The structures represented by Formula (4) are collectively referred to as hydroxybenzophenones. The structures represented by Formula (5) are collectively referred to as triazines.

(1)

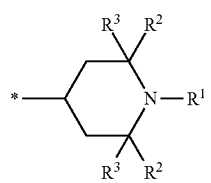

In Formula (1), $R^1$ represents a hydrogen atom, an alkyl group having 1 to 18 carbon atoms, an aryl group, or an oxy radical. $R^2$ and $R^3$ each independently represent an alkyl group having 1 to 18 carbon atoms. $R^2$ and $R^3$ may be bonded to each other to represent an aliphatic ring having 4 to 12 carbon atoms. "*" represents the bonding hand of a polymer skeleton with the structure represented by Formula (1).

In Formula (1), $R^1$ represents a hydrogen atom, an alkyl group having 1 to 18 carbon atoms, an aryl group, or an oxy radical, with the alkyl group having 1 to 18 carbon atoms being preferable.

The alkyl group having 1 to 18 carbon atoms may be linear, branched, or cyclic, and preferably linear. The number of carbon atoms of the alkyl group having 1 to 18 carbon atoms is preferably 1 to 12, more preferably 1 to 8, still more preferably 1 to 3, and particularly preferably 1 or 2. In particular, the alkyl group having 1 to 18 carbon atoms is preferably a methyl group or an ethyl group, and more preferably a methyl group.

The number of carbon atoms of the aryl group may be 6 to 18, 6 to 12, or 6. Specific examples of the aryl group include a phenyl group.

In the case where $R^1$ in Formula (1) represents an alkyl group having 1 to 18 carbon atoms or an aryl group, the alkyl group having 1 to 18 carbon atoms and the aryl group may have a substituent and may be unsubstituted. Examples of the substituent which may be contained include the substituent selected from the substituent group A.

In Formula (1), $R^2$ and $R^3$ each independently represent a methyl group or an ethyl group, and is preferably a methyl group. $R^2$ and $R^3$ may be bonded to represent an aliphatic ring having 4 to 12 carbon atoms.

In Formula (1), "*" represents the bonding hand of a polymer skeleton with the structure represented by Formula (1). The bonding hand may be bonded to the polymer skeleton directly or through a linking group, or bonded to the colorant structure directly or through a linking group. In particular, "*" in Formula (1) is preferably bonded to the polymer skeleton directly or through a linking group.

Hereinafter, specific examples of the structure represented by Formula (1) are shown below, but are not limited thereto. In the following structures, "*" represents the bonding hand of a polymer skeleton with the structure represented by Formula (2).

(2)

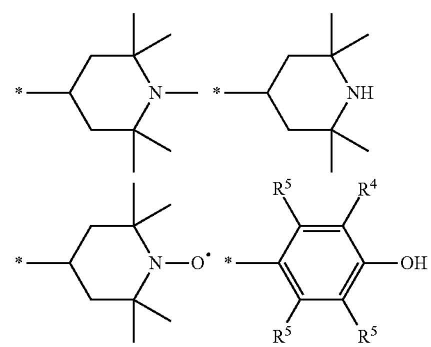

In Formula (2), $R^4$ represents the following Formula (2A), an alkyl group having 1 to 18 carbon atoms, or an aryl group. $R^5$'s each independently a hydrogen atom or an alkyl group having 1 to 18 carbon atoms. "*" represents the bonding hand of a polymer skeleton with the structure represented by Formula (2).

In Formula (2), $R^4$ represents the Formula (2A), an alkyl group having 1 to 18 carbon atoms, or an aryl group, and is preferably represented by Formula (2A). The alkyl group having 1 to 18 carbon atoms and the aryl group have the same definitions as the alkyl group having 1 to 18 carbon atoms and the aryl group mentioned for $R^1$ in Formula (1). Further, "*" has the same definition as the bonding bond mentioned in Formula (1).

(2A)

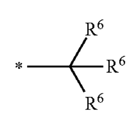

In Formula (2A), $R^6$'s each independently represent an alkyl group having 1 to 18 carbon atoms. "*" represents the bonding hand with the structure represented by Formula (2A) and the structure represented by Formula (2).

In Formula (2A), $R^6$ has the same definition as the alkyl group having 1 to 18 carbon atoms mentioned for $R^1$ in Formula (1). Further, "*" has the same definition as the bonding bond mentioned in Formula (1).

Hereinafter, specific examples of the structure represented by Formula (2) are shown below, but are not limited thereto. In the structures, "*" represents the bonding hand of a polymer skeleton with the structure represented by Formula (2).

(3)

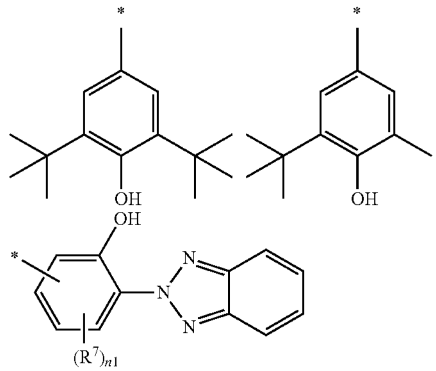

In Formula (3), $R^7$ represents an alkyl group having 1 to 18 carbon atoms; and n1 represents an integer of 0 to 3. In the case where n1 is 2 or 3, each $R^7$'s may be the same as or different from each other. "*" represents the bonding hand of a polymer skeleton with the structure represented by Formula (3).

In Formula (3), $R^7$ has the same definition as the alkyl group having 1 to 18 carbon atoms mentioned for $R^1$ in Formula (1).

In Formula (3), n1 represents an integer of 0 to 3, preferably an integer of 0 to 2, and preferably 0 or 1.

In Formula (3), "*" has the same definition as the bonding bond mentioned in Formula (1).

Specific examples of the structure represented by Formula (3) are shown below, but are not limited thereto. In the structures, "*" represents the bonding hand of a polymer skeleton with the structure represented by Formula (3).

(4)

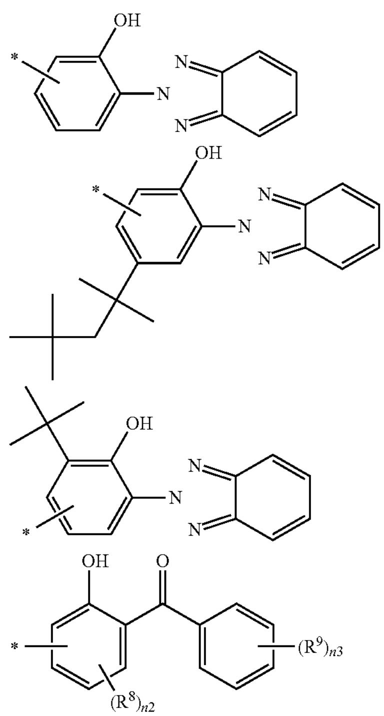

In Formula (4), $R^8$ and $R^9$ each independently represent an alkyl group having 1 to 18 carbon atoms. n2 represents an integer of 0 to 3. n3 represents an integer of 0 to 4. In the case where n2 is 2 or 3, each $R^8$'s may be the same as or different from each other. In the case where n3 represents an integer of 2 to 4, each $R^9$'s may be the same as or different from each other. "*" represents the bonding hand of a polymer skeleton with the structure represented by Formula (4).

In Formula (4), $R^8$ and $R^9$ have the same definition as the alkyl group having 1 to 18 carbon atoms mentioned for $R^1$ in Formula (1).

In Formula (4), n2 represents an integer of 0 to 3, preferably 0 to 2, and preferably 0 or 1.

In Formula (4), n3 represents an integer of 0 to 4, preferably 0 to 2, and preferably 0 or 1.

In Formula (4), "*" has the same definition as the bonding bond mentioned in Formula (1).

Specific examples of the structure represented by Formula (4) are shown below, but are not limited thereto. In the structures, "*" represents the bonding hand of a polymer skeleton with the structure represented by Formula (4).

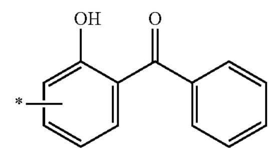

(5)

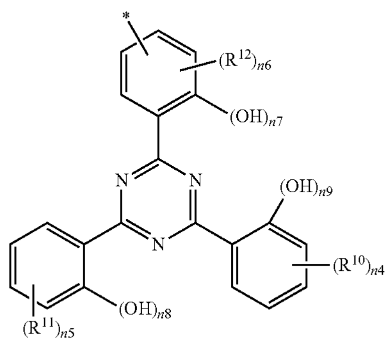

In Formula (5), $R^{10}$ to $R^{12}$ each independently represent an alkyl group having 1 to 18 carbon atoms or an alkoxy group having 1 to 8 carbon atoms. n4 to n6 each independently represent an integer of 0 to 5. n7 to n9 each independently represent 0 or 1, and at least one of n7, . . . or n9 represents 1. "*" represents the bonding hand of a polymer skeleton with the structure represented by Formula (5).

In the case where $R^{10}$ in Formula (5) represents an alkyl group having 1 to 18 carbon atoms, the group has the same definition as the alkyl group having 1 to 18 carbon atoms mentioned for $R^1$ in Formula (1), and is preferably an alkyl group having 1 to 3 carbon atoms, and more preferably a methyl group. In the case where $R^{10}$ represents an alkoxy group having 1 to 8 carbon atoms, the number of carbon atoms of the alkoxy group is preferably 1 to 6, more preferably 1 to 5, and still more preferably 1 to 4.

$R^{10}$ in Formula (5) may further have a substituent. Examples of the substituent which may be contained include the substituents selected from the substituent group A.

In Formula (5), n4 represents an integer of 0 to 5, preferably 1 to 4, and more preferably 2 or 3. In the case where n4 represents an integer of 2 to 5, each $R^{10}$'s may be the same as or different from each other.

$R^{11}$ in Formula (5) has the same definition as $R^{10}$ in Formula (5), and preferred ranges thereof are also the same.

In Formula (5), n5 represents an integer of 0 to 5, preferably 1 to 3, and more preferably 1 or 2. In the case where n5 represents an integer of 2 to 5, each $R^{11}$'s may be the same as or different from each other.

$R^{12}$ in Formula (5) has the same definition as $R^{10}$ in Formula (5), and preferred ranges thereof are also the same.

In Formula (5), n6 represents an integer of 0 to 5, preferably 0 to 3, and more preferably 0 or 1. In the case where n6 represents an integer of 2 to 5, each $R^{12}$'s may be the same as or different from each other.

In Formula (5), n7 to n9 each independently represent 0 or 1, and at least one of n7, . . . or n9 represent 1. In particular, it is preferable that only n7 represents 1 or only n8 and n9 represent 1, or that only any one of n7, n8, or n9 represents 1.

In Formula (5), "*" has the same definition as the bonding bond mentioned in Formula (1).

Specific examples of the structure represented by Formula (5) are shown below, but are not limited thereto. In the structures, "*" represents the bonding hand of a polymer skeleton with the structure represented by Formula (5).

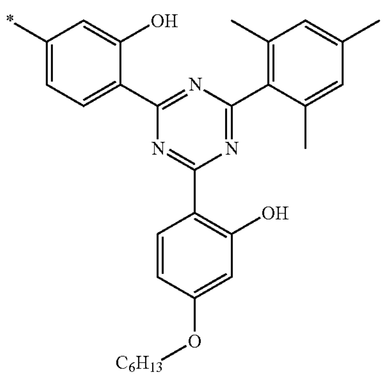

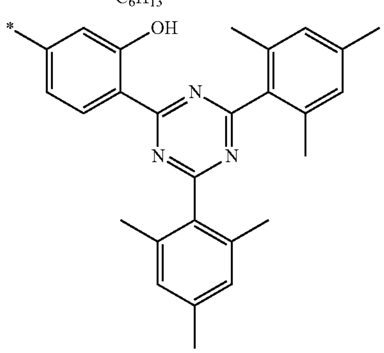

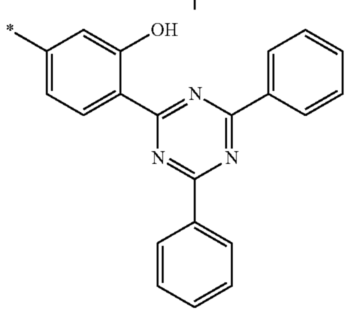

-continued

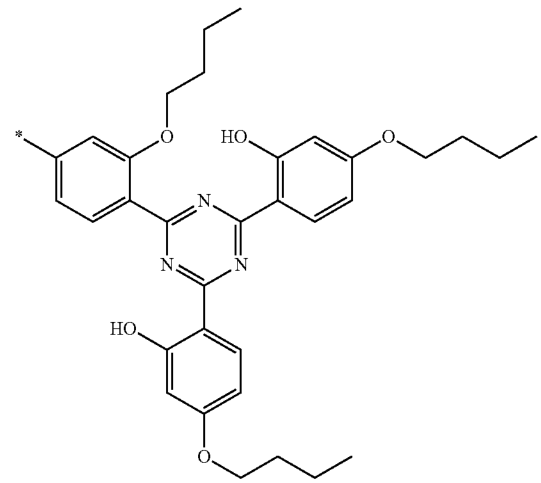

It is preferable that the structural unit having at least one of the structure represented by Formula (1), the structure represented by Formula (2), the structure represented by Formula (3), the structure represented by Formula (4), or the structure represented by Formula (5), contained in the colorant multimer used in the present invention is represented by the following Formula (E).

Formula (E)

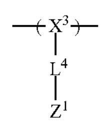

In General Formula (E), $X^3$ has the same definition as $X_1$ in General Formula (A). $L^4$ has the same definition as $L^1$ in General Formula (A). $Z^1$ represents the structure represented by Formulae (1) to (5).

Specific examples of the structural unit having at least one of the structure represented by Formula (1), the structure represented by Formula (2), the structure represented by Formula (3), the structure represented by Formula (4), or the structure represented by Formula (5) are shown below, but the present invention is not limited thereto.

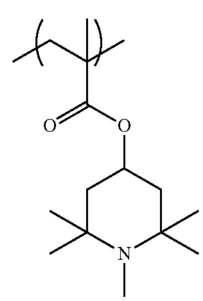

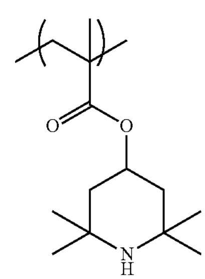

-continued
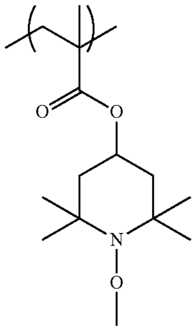
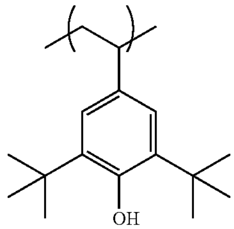
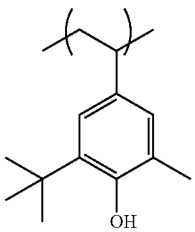
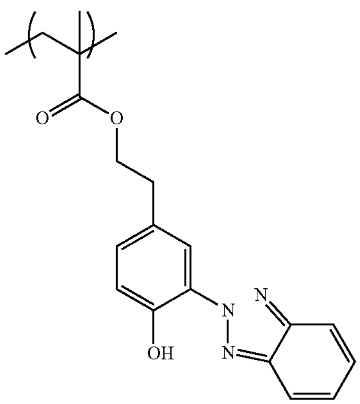
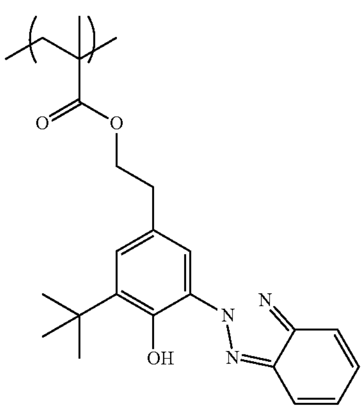
-continued
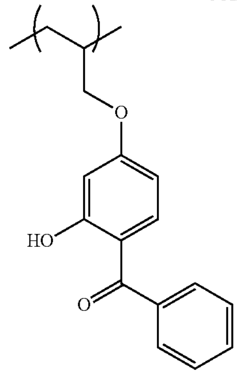
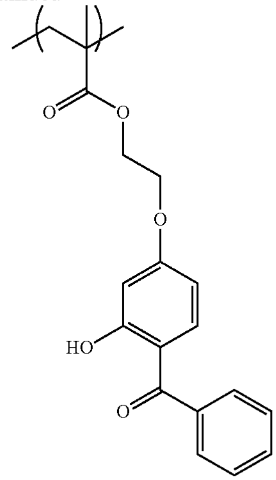
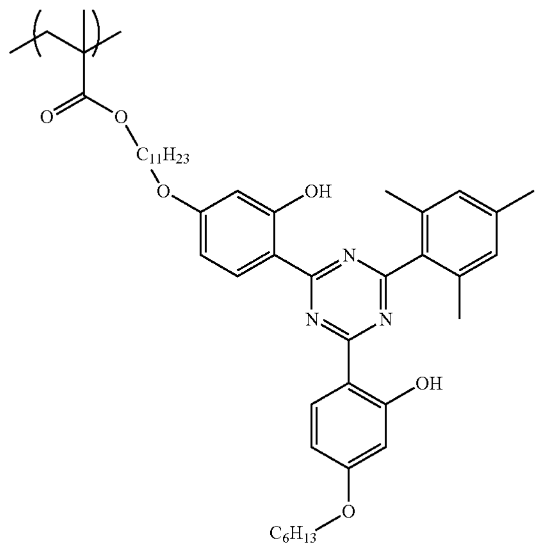
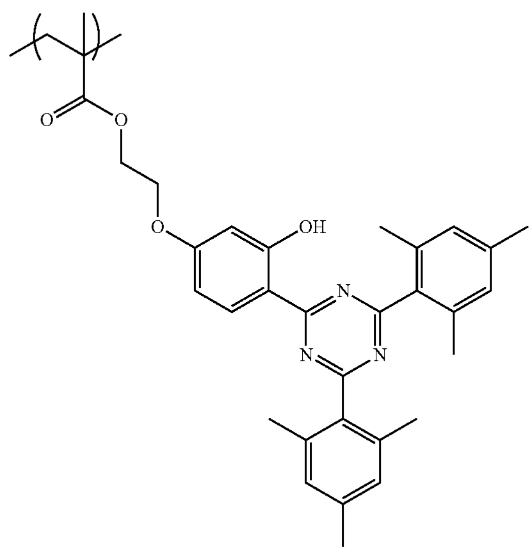

-continued

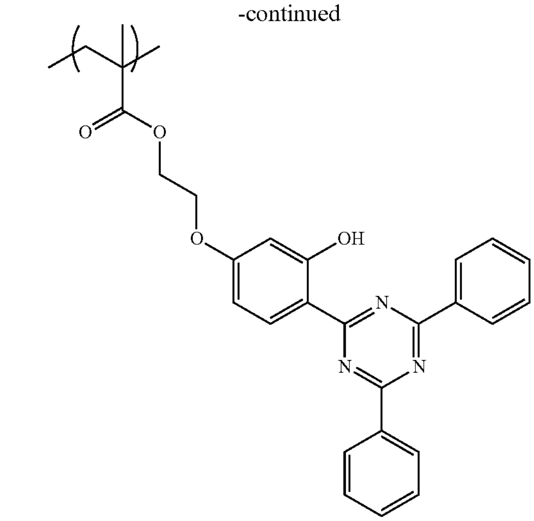

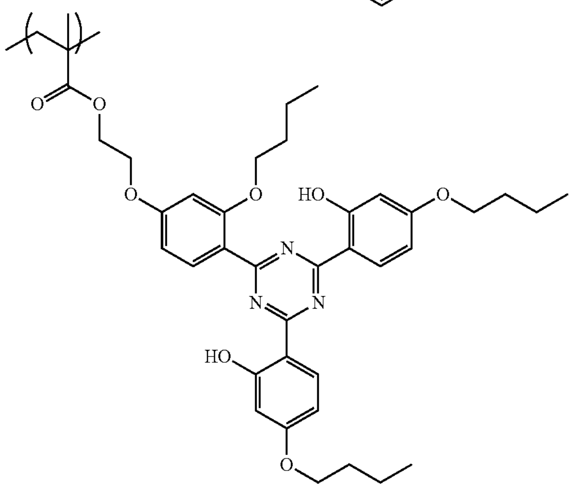

The colorant multimer may not have a structural unit having at least one of the structure represented by Formula (1), the structure represented by Formula (2), the structure represented by Formula (3), the structure represented by Formula (4), or the structure represented by Formula (5), but in the case where the colorant multimer has the structural unit, the content of the structural units having at least one of the structure represented by Formula (1), the structure represented by Formula (2), the structure represented by Formula (3), the structure represented by Formula (4), or the structure represented by Formula (5) is preferably 0.5% by mass to 20% by mass, more preferably 1% by mass to 10% by mass, and particularly preferably 1% by mass to 5% by mass, with respect to 100% by mass of all the structural units in the colorant multimer.

<<<<Specific Terminal Group>>>>

It is preferable that the colorant multimer used in the present invention has a group represented by General Formula (I) or a group represented by General Formula (II) (hereinafter referred to as a "specific terminal group" in some cases). By adopting such a configuration, solvent resistance and light fastness can be imparted. Further, for example, since the colorant multimer can be synthesized by living radical polymerization, the dispersity (Mw/Mn) of the colorant multimer can be reduced. That is, with the colorant multimer, the light fastness can further be improved by reducing the proportion of the high-molecular-weight components, and the solvent resistance can be improved by reducing the proportion of the low-molecular-weight components. In addition, heat resistance, coatability, and developability can further be improved.

General Formula (I)

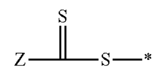

In General Formula (I), Z represents a hydrogen atom or a monovalent substituent. * represents a bonding position with a terminal of the main chain.

In General Formula (I), Z represents a monovalent substituent. Z is preferably a hydrogen atom, a halogen atom, a carboxyl group, a cyano group, an alkyl group having 1 to 30 carbon atoms, a monovalent aromatic hydrocarbon group having 6 to 30 carbon atoms, a monovalent heterocyclic group having a total number of carbon atoms and hetero atoms of 3 to 30, —$OR^1$, —$SR^1$, —$OC(=O)R^1$, —$N(R^1)(R^2)$, —$C(=O)OR^1$, —$C(=O)N(R^1)(R^2)$, —$P(=O)(OR^1)_2$, —$P(=O)(R^1)_2$, or a monovalent group having a polymer chain. It is preferably selected from —$SR^1$, an aryl group, a heteroaryl group, an amino group substituted with an alkyl group and/or an aryl group, an alkoxy group, and an aryloxy group, more preferably selected from —$SR^1$ (preferably an alkylthio group or an arylthio group), and an aryl group, still more preferably an alkylthio group or an aryl group, and particularly preferably an alkylthio group.

The aryl group as Z is preferably a phenyl group or a naphthyl group. The heteroaryl group as Z is preferably a nitrogen-containing 5- or 6-membered compound. The amino group substituted with an alkyl group and/or an aryl group as Z is preferably an amino group substituted with an alkyl group having 1 to 5 carbon atoms or a phenyl group. The alkoxy group as Z is preferably an alkoxy group having 2 to 5 carbon atoms, and the aryloxy group as Z is preferably a phenoxy group.

$R^1$ and $R^2$ each independently represent an alkyl group having 1 to 30 carbon atoms, an alkenyl group having 2 to 30 carbon atoms, a monovalent aromatic hydrocarbon group having 6 to 30 carbon atoms, or a monovalent heterocyclic group having a total number of carbon atoms and hetero atoms of 3 to 30, and each of the alkyl group having 1 to 30 carbon atoms, the monovalent aromatic hydrocarbon group having 6 to 30 carbon atoms, the monovalent heterocyclic group having a total number of carbon atoms and hetero atoms of 3 to 30, $R^1$ and $R^2$ may or may not be substituted. Examples of the substituent in the case of being substituted include an alkyl group and an aryl group.

$R^1$ and $R^2$ are each independently preferably represent an alkyl group having 1 to 20 carbon atoms or a monovalent aromatic hydrocarbon group having 6 to 30 carbon atoms, and more preferably an alkyl group having 1 to 15 carbon atoms or a phenyl group.

General Formula (II)

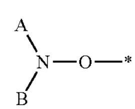

In General Formula (II), A and B each independently represent a monovalent substituent. A and B may be linked to each other to form a ring. * represents a bonding position with a terminal of the main chain.

The monovalent substituents represented by A and B are each independently preferably an alkyl group having 1 to 30 carbon atoms or an aryl group having 6 to 30 carbon atoms. The alkyl group having 1 to 30 carbon atoms more preferably has 3 to 10 carbon atoms.

In particular, it is preferable that one of A and B is a secondary or tertiary alkyl group having 1 to 30 carbon atoms, and the other is an alkyl group having 1 to 30 carbon atoms or an aryl group having 6 to 30 carbon atoms. It is more preferable that one of A and B is a tertiary alkyl group having 1 to 30 carbon atoms, and the other is an alkyl group having 1 to 30 carbon atoms, and it is particularly preferable that one of A and B is a tertiary alkyl group having 1 to 30 carbon atoms, and the other is a secondary or tertiary alkyl group having 1 to 30 carbon atoms (more preferably a secondary alkyl group having 1 to 30 carbon atoms).

As the substituent which may be contained in the alkyl group having 1 to 30 carbon atoms, an aryl group is preferable, and a phenyl group is more preferable. As the substituent which may be contained in the aryl group, an aryl group is preferable. Further, these groups may be substituted with other substituents. A and B may be bonded to each other to form a ring.

In the present invention, in particularly, it is preferable that Z in General Formula (I) is —$SR^1$ or an aryl group, and A and B in General Formula (II) are each a secondary or tertiary alkyl group having 1 to 30 carbon atoms (provided that A and B may be bonded to each other to form a ring).

Specific examples of the terminal group are shown, but the present invention is not limited thereto.

(I-1)

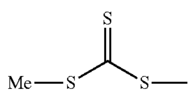

(I-2)

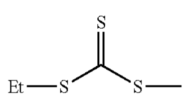

(I-3)

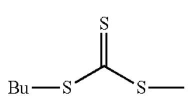

(I-4)

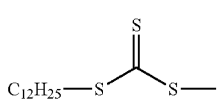

(I-5)

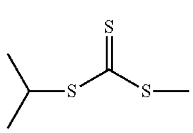

(I-6)

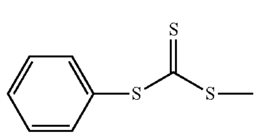

-continued (I-7)

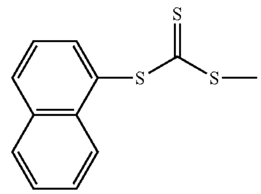

(I-8)

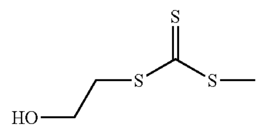

(I-9)

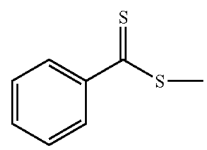

(I-10)

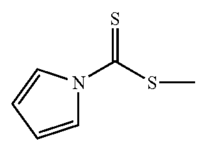

(I-11)

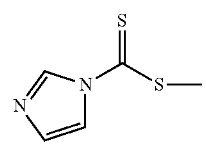

(I-12)

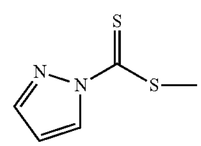

(I-13)

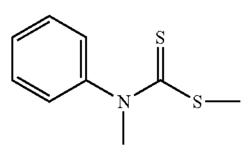

(I-14)

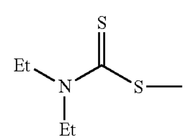

(I-15)

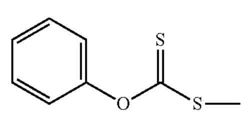

(I-16)

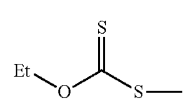

(II-1)

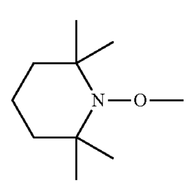

-continued
(II-2)
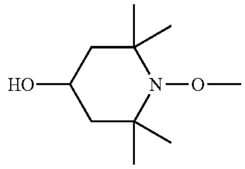
(II-3)
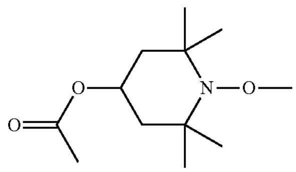
(II-4)
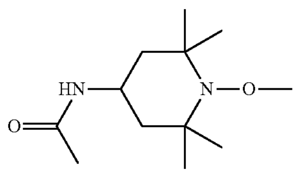
(II-5)
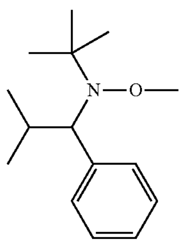
(II-6)
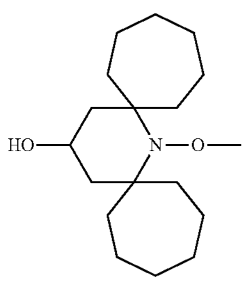
(II-7)
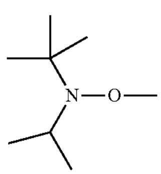
(II-8)
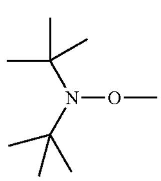
(II-9)
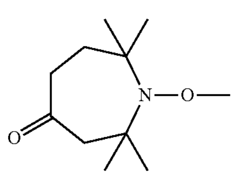
-continued
(II-10)
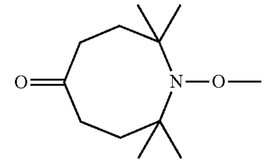
(II-11)
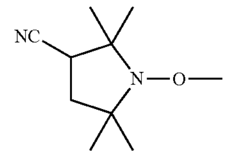
(II-12)
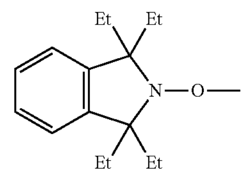
(II-13)
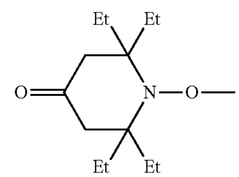
(II-14)
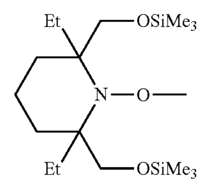
(II-15)
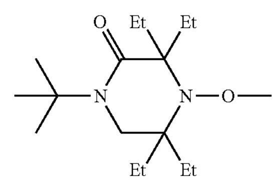
(II-16)
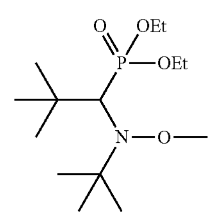
(II-17)
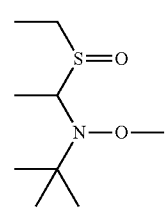

-continued (II-18)

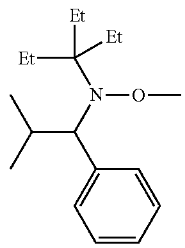

(II-19)

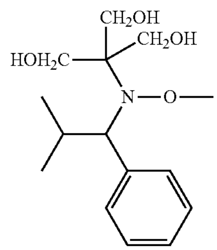

As a method for introducing a terminal group represented by General Formula (I) or (II) into the polymer main chain, a method in which a polymerizable compound having a colorant structure is subjected to radial polymerization in the presence of at least one of a compound represented by General Formula (Ia), a compound represented by General Formula (IIa), or a radical represented by General Formula (IIb) is preferable.

General Formula (Ia)

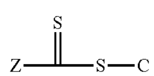

In General Formula (Ia), Z has the same definition as in General Formula (I). C represents a monovalent organic group.

General Formula (IIa)

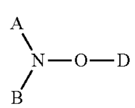

In General Formula (IIa), Z has the same definition as in General Formula (II). D represents a monovalent organic group.

General Formula (IIb)

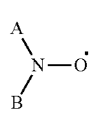

In General Formula (IIb), A and B have the same definitions as in General Formula (II).

By blending such additives, the activation/deactivation of the terminal during the radical polymerization becomes an equilibrium state, and thus, it becomes a state where radials are not inactivated apparently. By carrying out polymerization in such living radical polymerization, a multimer having a low dispersity is obtained.

The weight-average molecular weight (Mw) of the colorant multimer is preferably 2,000 to 50,000, more preferably 3,000 to 30,000, and particularly preferably 6,000 to 20,000.

Moreover, a ratio [(Mw)/(Mn)] between the weight-average molecular weight (Mw) and the number-average molecular weight (Mn) of the colorant multimer is preferably 1.0 to 2.0, more preferably 1.1 to 1.8, and particularly preferably 1.1 to 1.5.

The glass transition temperature (Tg) of the colorant multimer according to the present invention is preferably 50° C. or higher, and more preferably 100° C. or higher. Further, a 5% weight reduction temperature measured by thermogravimetric analysis (TGA measurement) is preferably 120° C. or higher, more preferably 150° C. or higher, and still more preferably 200° C. or higher. Within this region, when the coloring composition of the present invention is applied to preparation of a color filter and the like, the change in concentration due to a heating process can be decreased.

In the case where the colorant multimer used in the present invention includes a repeating unit having a colorant structure and another repeating unit, it is a random polymer of a polymerizable compound including a colorant and another polymerizable compound. By using the random polymer, the colorant structure is randomly present in the colorant multimer, and the effects of the present invention can be exerted more effectively.

<<<Counter Anion>>>

In the case where the colorant compound represented by General Formula (1) is a high molecular type, it has a counter anion inside and/or outside the molecule. The counter anion is included according to the valency of the cation included in the colorant compound represented by General Formula (1). The cation is usually primary or secondary, and preferably primary with respect to one xanthene structure.

In the present embodiment, the counter anion be inside the molecule means that the counter anion is in the same repeating unit of the colorant multimer, that is, a case where a cation and an anion are bonded via a covalent bond in the repeating unit having a colorant structure.

On the other hand, the counter anion be outside the molecule means a case other than the above, in which a cation and an anion are not bonded via a covalent bond in the repeating unit having a colorant structure, or in which a cation and an anion are each included as an individual repeating unit of the colorant multimer.

In the present invention, it is preferable that an anion is present at least inside the molecule.

Furthermore, the anion in the present invention is not particularly defined, but low-nucleophilicity anion is preferable. The low-nucleophilicity anion represents an anionic structure in which organic acids having a pKa lower than that of sulfuric acid are dissociated.

Case where Counter Anion is Inside the Same Repeating Unit

The anionic moiety in the case where the counter anion is present in the same repeating unit is the same as in the first embodiment of the anion in a low molecular type and preferred ranges thereof are also the same. The bond position of the counter anion is preferably $R^7$ and/or $R^8$, and more preferably $R^7$ of General Formula (1).

Case where Counter Anion is Different Molecule

The counter anion in the case where the counter anion is another molecule is the same as in the second embodiment of the anion in a low molecular type and preferred ranges thereof are also the same.

Case where Cation and Anion are Included in Different Repeating Units of Colorant Multimer It means a case where a cation and an anion are each included in independent repeating units of the colorant multimer in the third embodiment in the present invention.

In the case of the present embodiment, the anion may be included in the side chain or the main chain of the colorant multimer, and the counter anion may be included both of the main chain and the side chain, and preferably the side chain.

Preferred examples of the repeating unit including the anion include a repeating unit represented by General Formula (C) and a repeating unit represented by General Formula (D).

General Formula (C)

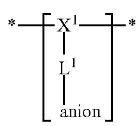

(In General Formula (C), $X^1$ represents the main chain of the repeating unit. $L^1$ represents a single bond or a divalent linking group. The anion represents the counter anion.)

In General Formula (C), $X^1$ represents the main chain of the repeating unit, and it usually represents a linking group formed by a polymerization reaction, and for example, (meth)acryl-based, styrene-based, vinyl-based linking groups, and the like are preferable, and the (meth)acryl-based linking groups are more preferable. Further, the moiety represented by two *'s becomes a repeating unit.

In the case where $L^1$ represents a divalent linking group, the divalent linking group represents an alkylene group having 1 to 30 carbon atoms (a methylene group, an ethylene group, a trimethylene group, a propylene group, a butylene group, and the like), an arylene group having 6 to 30 carbon atoms (a phenylene group, a naphthalene group, and the like), a heterocyclic linking group, —CH═CH—, —O—, —S—, —C(═O)—, —CO—, —NR—, —CONR—, —OC—, —SO—, $—SO_2—$, and a linking group formed by combination of two or more thereof. Here, R's each independently represent a hydrogen atom, an alkyl group, an aryl group, or a heterocyclic group.

In particular, $L^1$ is preferably a single bond, or a linking group formed by combination of two or more of an alkylene group having 1 to 10 carbon atoms (preferably $—(CH_2)n$- (n is an integer of 5 to 10)), an arylene group having 6 to 12 carbon atoms (preferably a phenylene group or a naphthalene group), —NH—, $—CO_2—$, —O—, and $—SO_2—$.

Specific examples of $X^1$ include the preferred examples of $X^1$ in General Formula (A).

$$*\text{—}[L^2\text{-anion-}L^3]\text{—}* \qquad \text{General Formula (D)}$$

(In General Formula (D), $L^2$ and $L^3$ each independently represent a single bond or a divalent linking group. The anion represents the counter anion.)

In General Formula (D), in the case where $L^2$ and $L^3$ represent a divalent linking group, they are preferably an alkylene group having 1 to 30 carbon atoms, an arylene group having 6 to 30 carbon atoms, a heterocyclic linking group, —CH═CH—, —O—, —S—, —C(═O)—, $—CO_2—$, —NR—, —CONR—, $—O_2C—$, —SO—, $—SO_2—$ and a linking group formed by combination of two or more thereof. Here, R's each independently represent a hydrogen atom, an alkyl group, an aryl group, or a heterocyclic group.

$L^2$ is preferably an arylene group having 6 to 12 carbon atoms (particularly a phenylene group). The arylene group having 6 to 30 carbon atoms is preferably substituted with a fluorine atom.

$L^3$ is preferably a group formed by combination of an arylene group having 6 to 12 carbon atoms (particularly a phenylene group) and —O—, and at least one arylene group having 6 to 12 carbon atoms is preferably substituted with a fluorine atom.

Specific examples of the repeating unit including anion in the present embodiment are shown, but the present invention is not limited thereto.

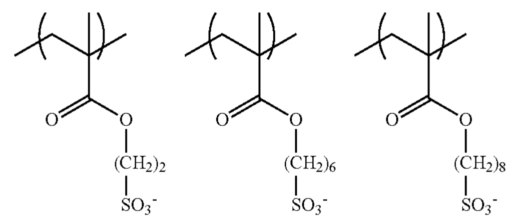

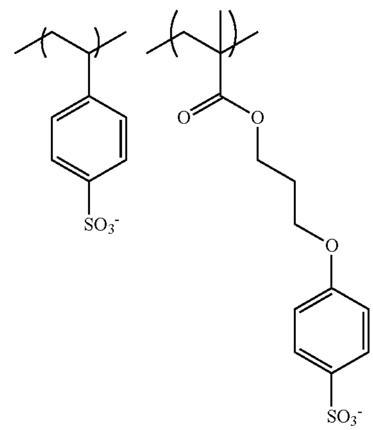

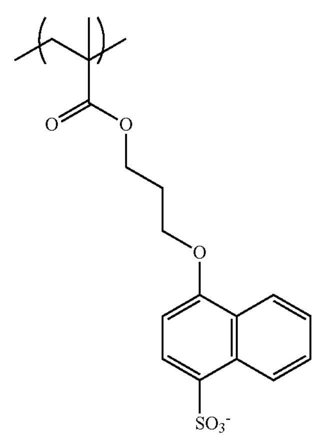

-continued
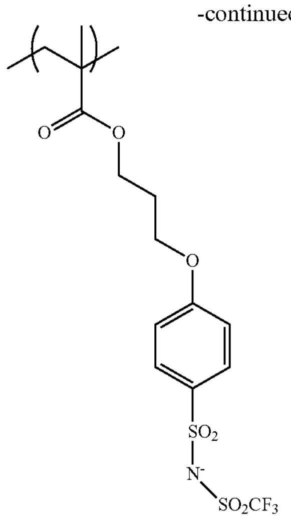
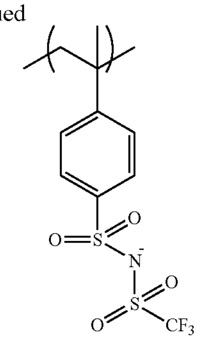
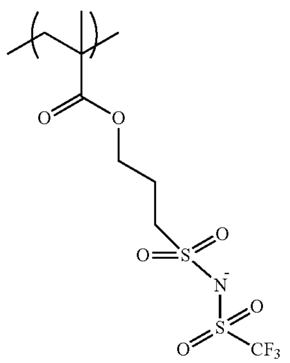
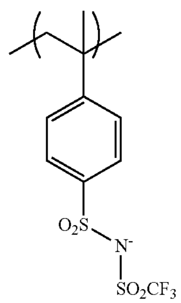
-continued
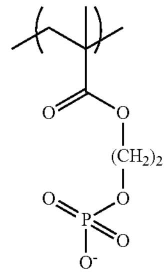
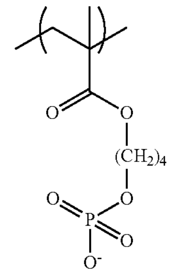
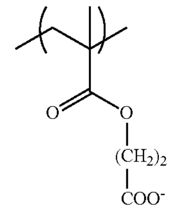
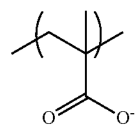
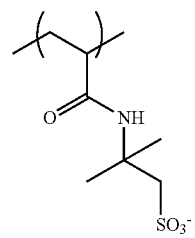
The following specific examples represent a state in which anionic structures are not dissociated, but it is certain that a state in which anionic structures are dissociated is also included in the range of the present invention.
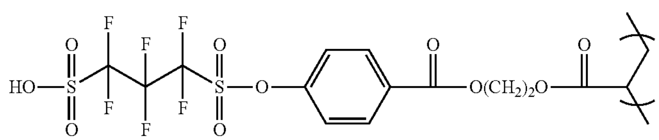
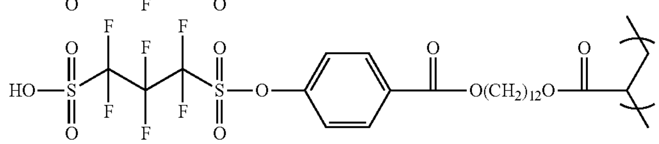
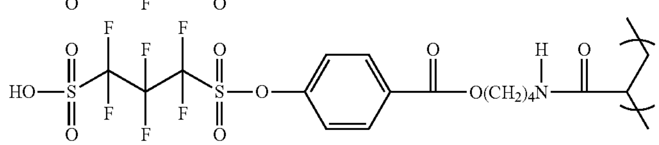
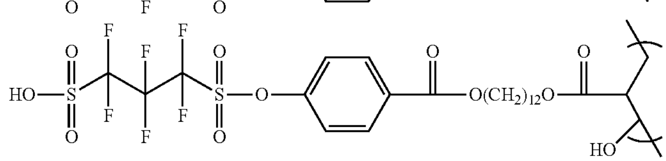
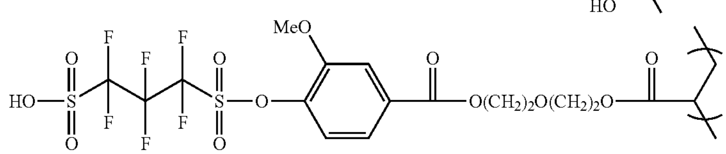
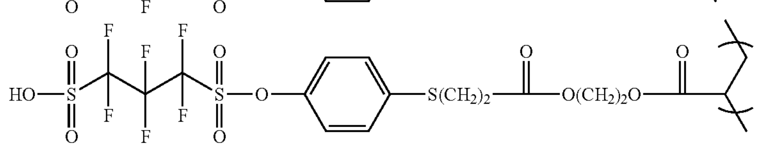

-continued
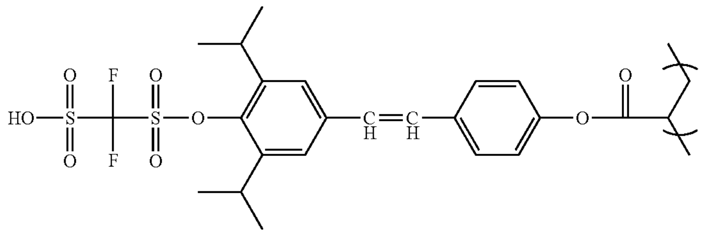
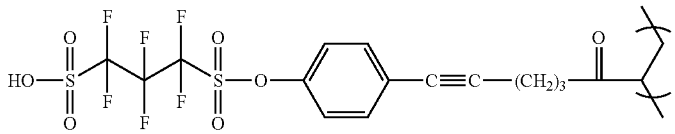
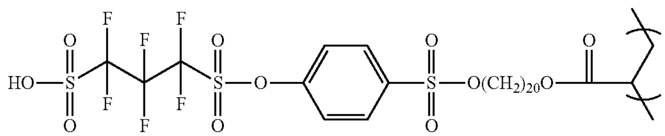
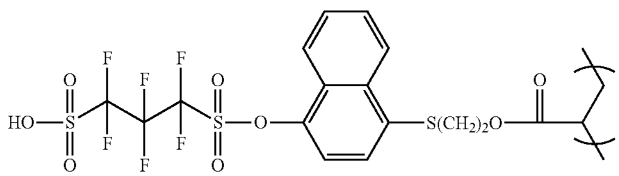
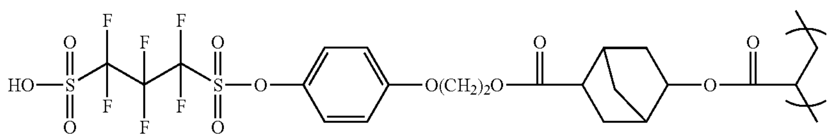
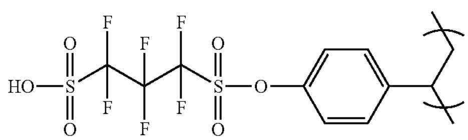
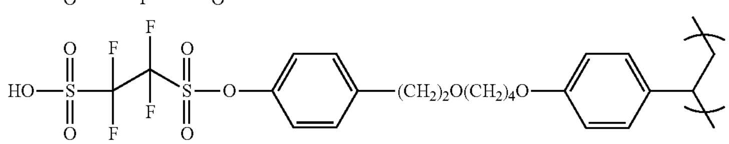
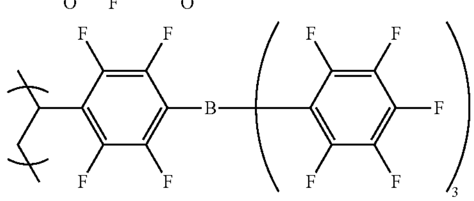
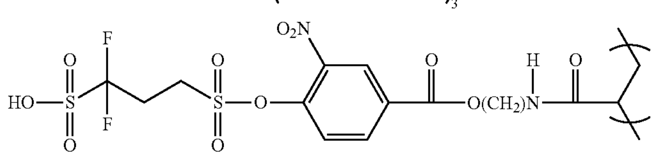
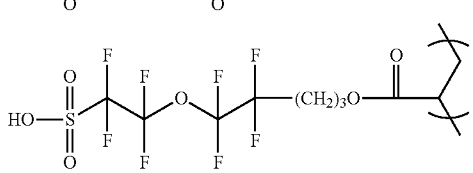
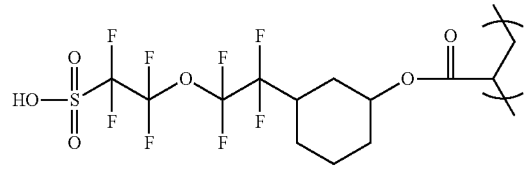
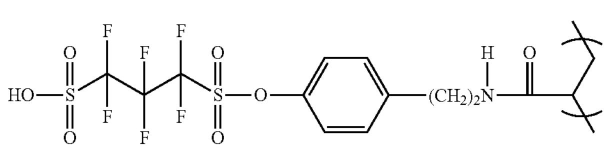

-continued
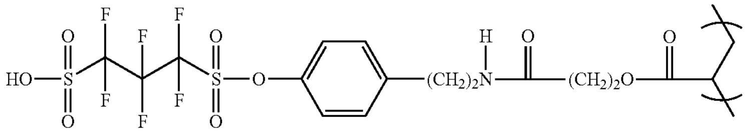
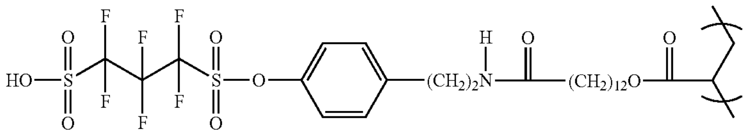
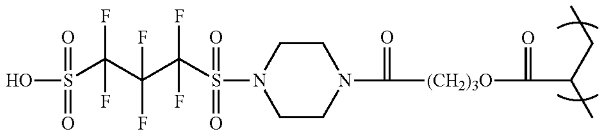
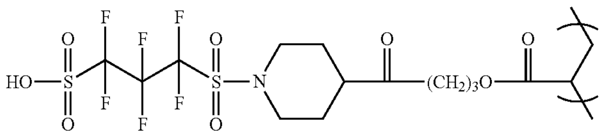
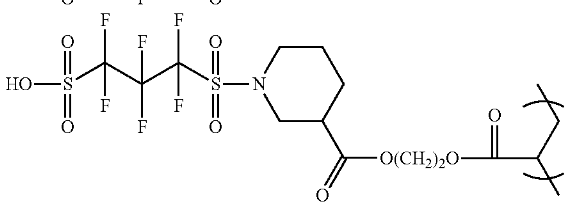
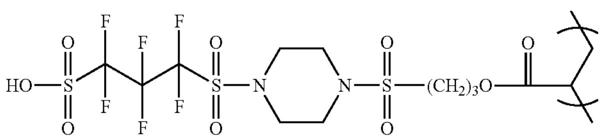
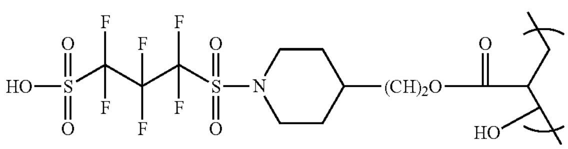
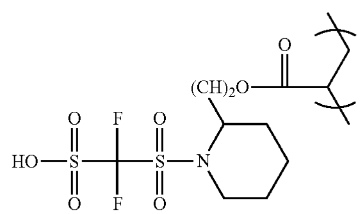
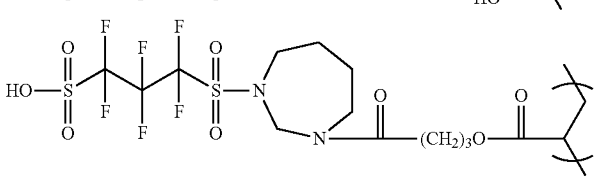
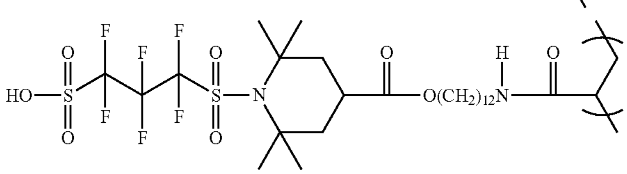
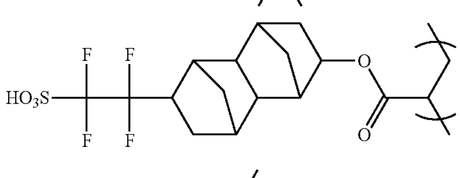
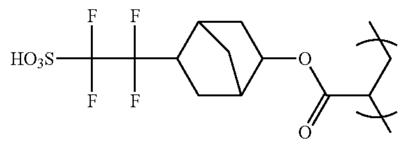
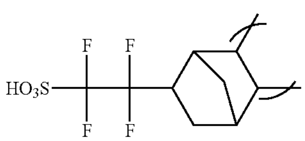
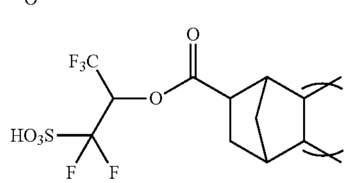
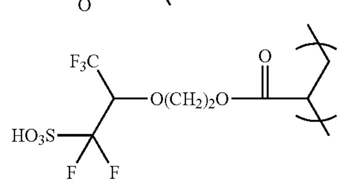

-continued
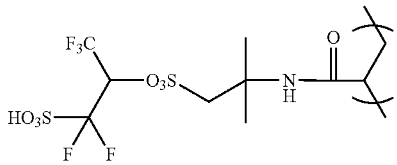
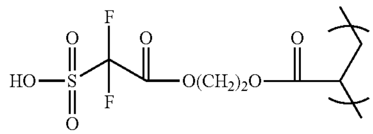
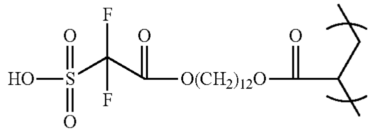
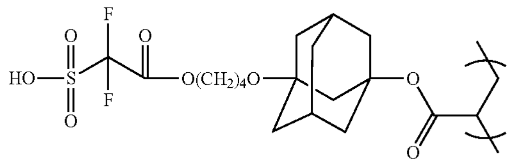
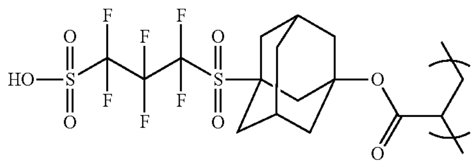
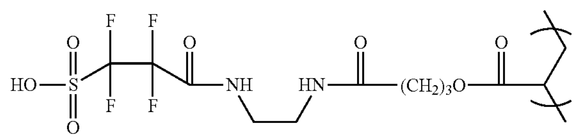
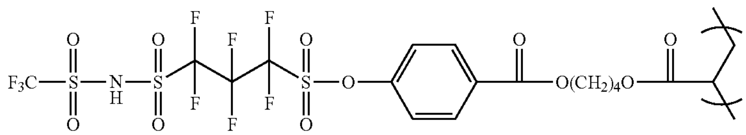
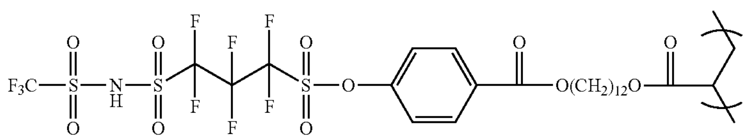
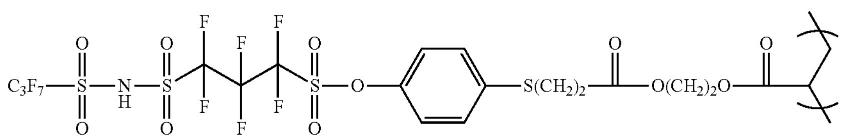
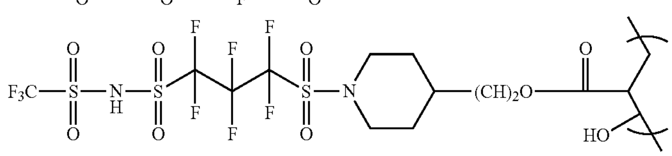
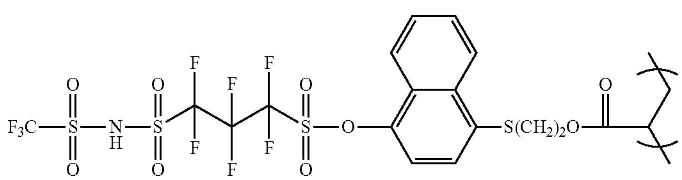
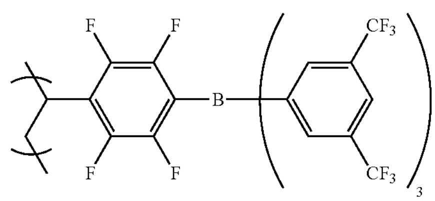
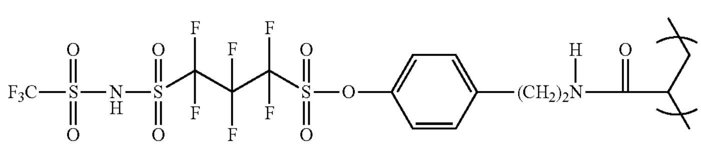
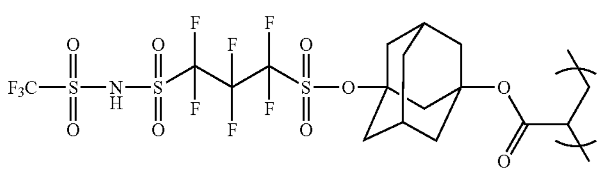
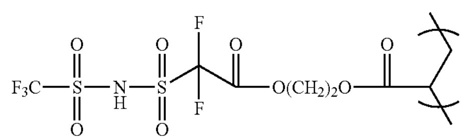
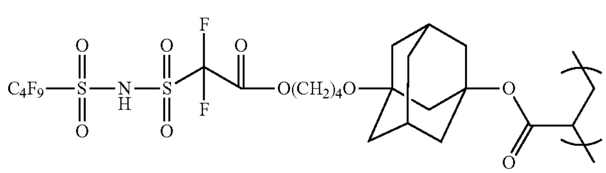

-continued
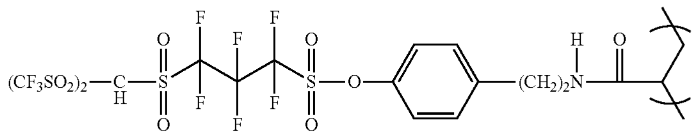
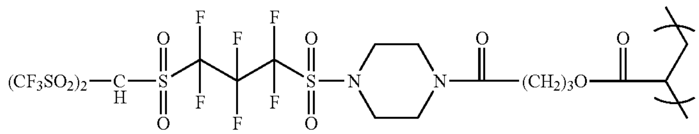
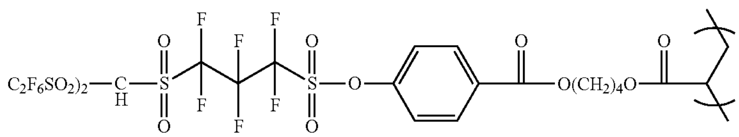
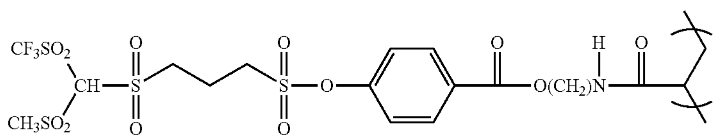
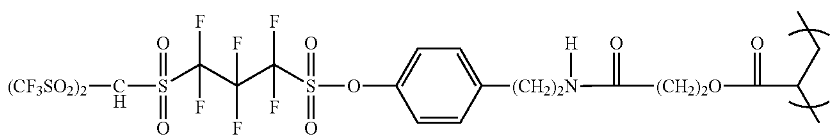
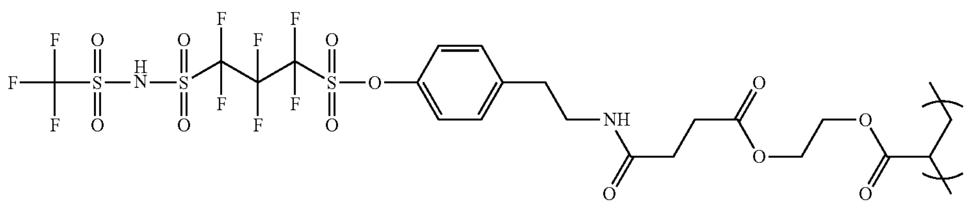
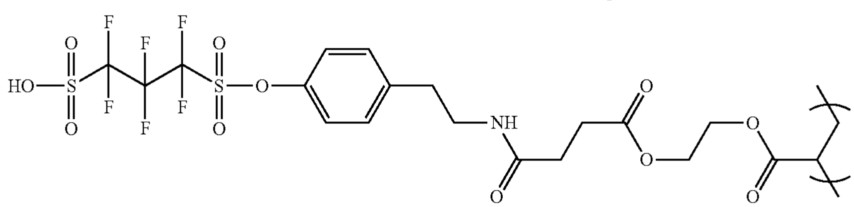
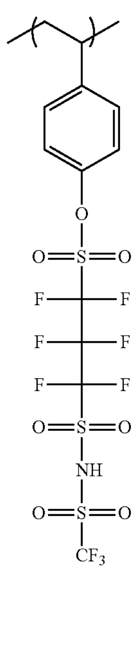
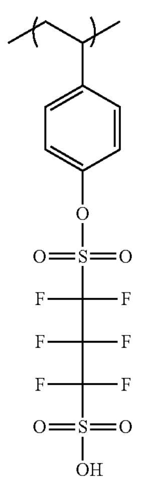
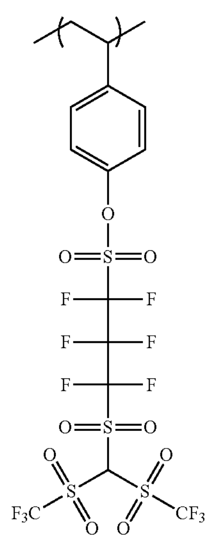
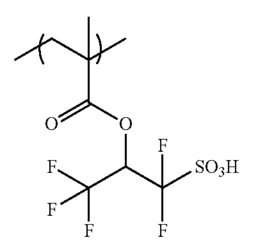

-continued
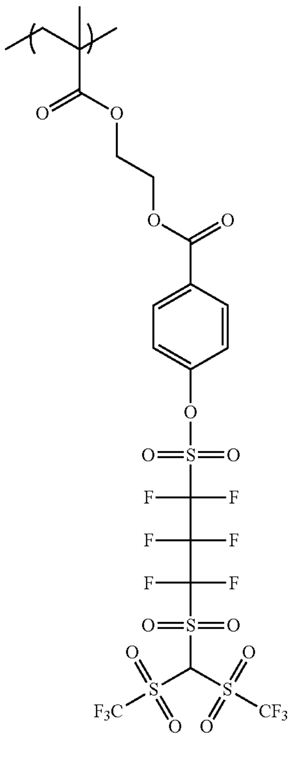
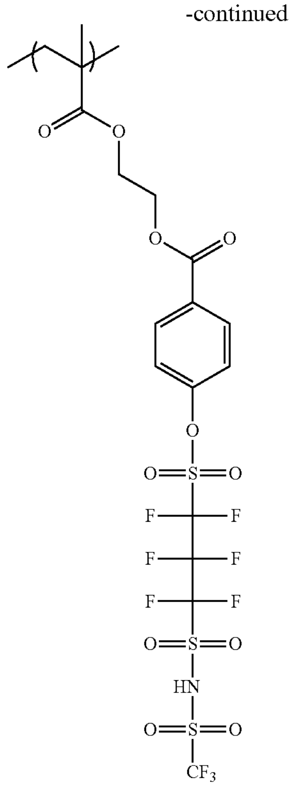
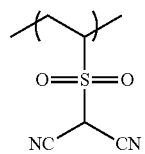
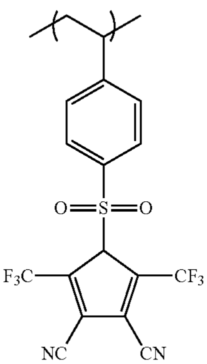
Examples of other repeating units preferably used by the colorant multimer of the present invention are show below, but it is certain that the present invention is not limited to these repeating units.
(B-1)
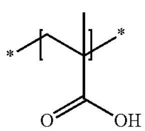
(B-2)
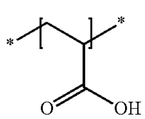
(B-3)
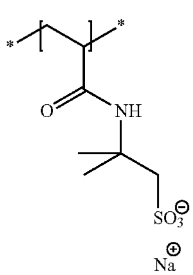
-continued
(B-4)
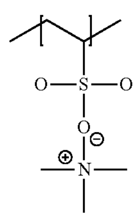
(B-5)
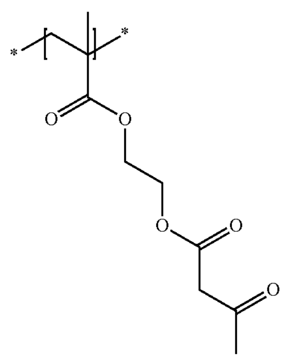
(B-6)
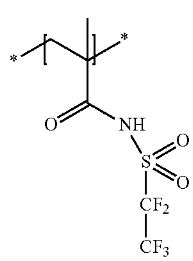

-continued
(B-7)
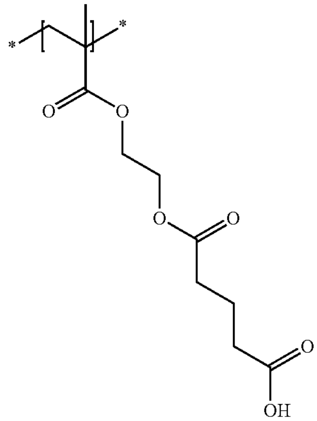
(B-8)
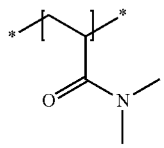
(B-9)
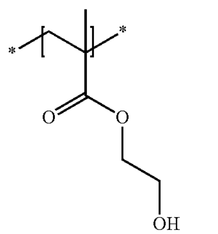
(B-10)
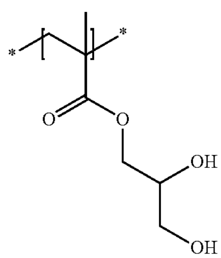
(B-11)
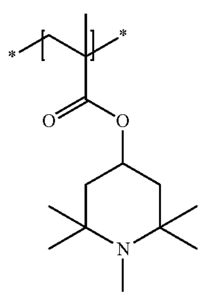
(B-12)
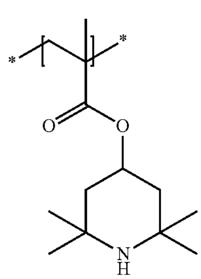
-continued
(B-13)
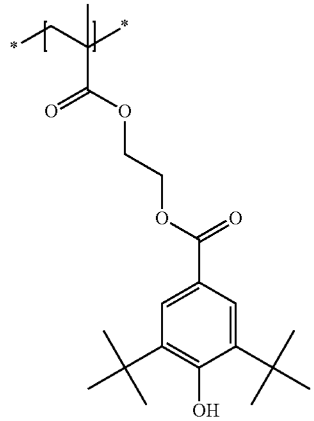
(B-14)
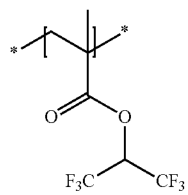
(B-15)
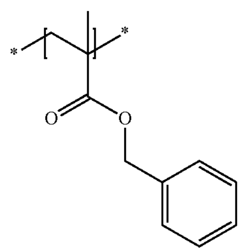
(B-16)
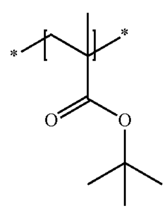
(B-17)
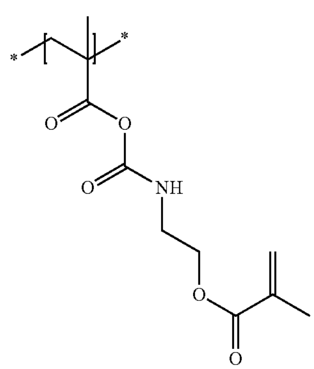

-continued
(B-18)
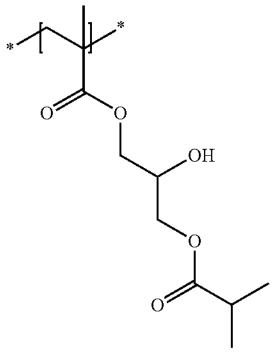
(B-19)
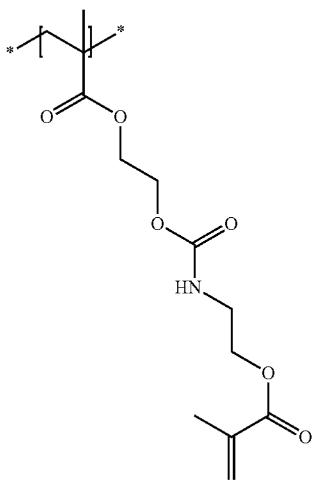
(B-20)
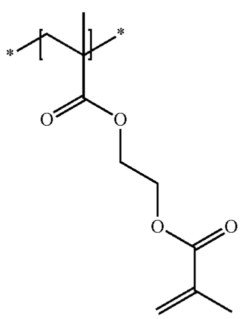
(B-21)
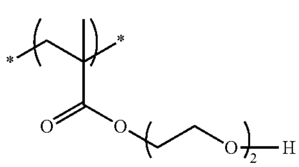
(B-22)
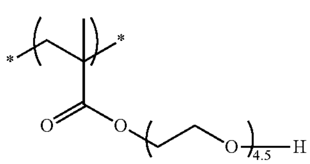
(B-23)
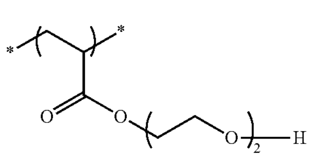
-continued
(B-24)
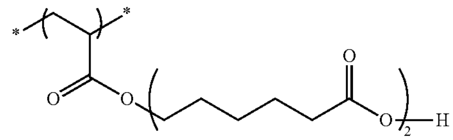
(B-25)
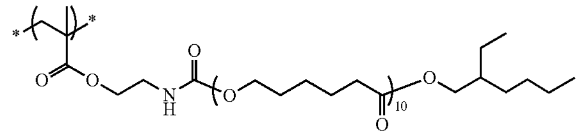
(B-26)
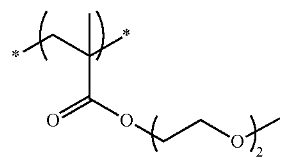
(B-27)
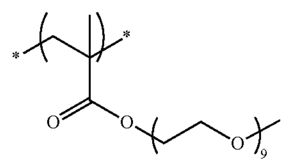
(B-28)
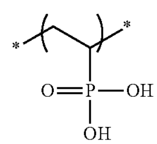
(B-29)
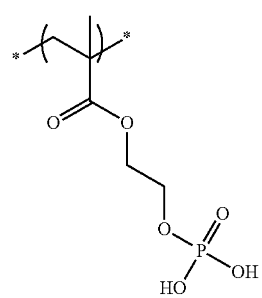
(B-30)
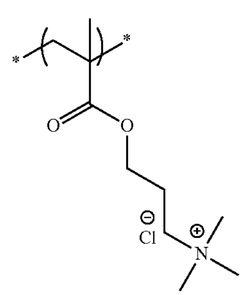

-continued (B-31)

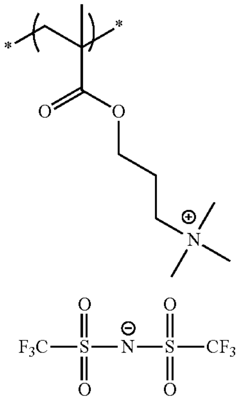

(B-32)

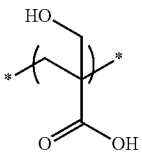

(B-33)

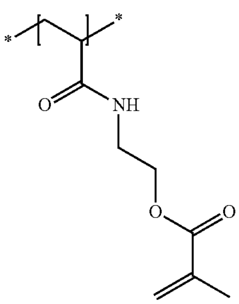

Next, examples of the colorant compound in a high molecular type used in the present invention are shown.

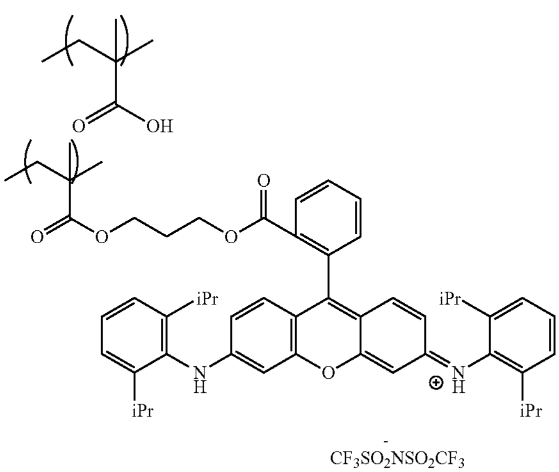

-continued

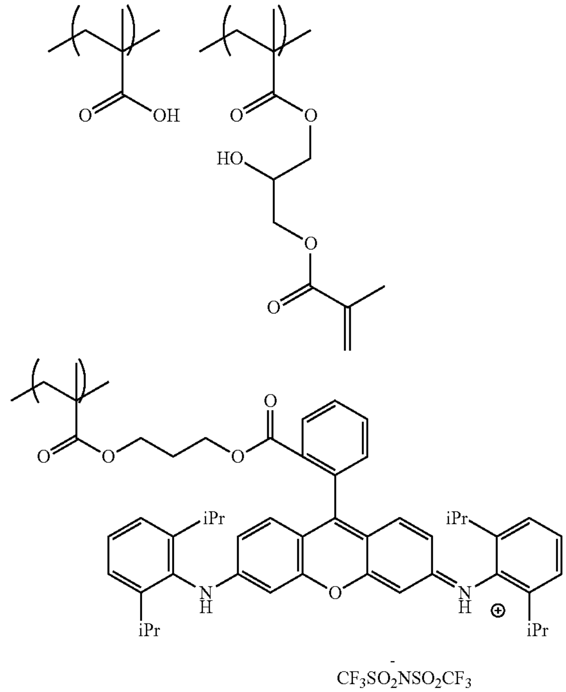

In the examples of the colorant compound in a high molecular type used in the present invention shown below, the repeating unit 1 means a repeating unit derived from any one of the exemplary compounds M-17 to M-37. Further, the repeating units 2 to 4 mean any one of the repeating units (B-1) to (B-33) as described above.

TABLE 1

| Colorantcompound (colorantmultimer) | Repeating unit 1 | Repeating unit 2 | Repeating unit 3 | Repeating unit 4 |
|---|---|---|---|---|
| P-1 | M-17 | B-1 | | |
| P-2 | M-18 | B-1 | B-18 | |
| P-3 | M-19 | B-2 | B-19 | |
| P-4 | M-20 | B-1 | B-18 | |
| P-5 | M-19 | B-1 | B-20 | |
| P-6 | M-23 | B-1 | | |
| P-7 | M-23 | B-1 | B-20 | |
| P-8 | M-22 | B-2 | B-18 | |
| P-9 | M-30 | B-1 | | |
| P-10 | M-26 | B-7 | B-19 | |
| P-11 | M-23 | B-1 | B-20 | B-21 |
| P-12 | M-27 | B-1 | B-18 | B-23 |
| P-13 | M-24 | B-1 | B-20 | B-27 |
| P-14 | M-30 | B-7 | B-19 | B-32 |
| P-15 | M-32 | B-1 | B-17 | B-9 |
| P-16 | M-43 | B-1 | B-18 | B-21 |
| P-17 | M-45 | B-1 | B-18 | B-21 |
| P-18 | M-46 | B-1 | B-18 | B-21 |
| P-19 | M-30 | B-1 | B-20 | B-21 |
| P-20 | M-42 | B-7 | B-19 | B-22 |
| P-21 | M-44 | B-1 | B-20 | B-10 |
| P-22 | M-47 | B-2 | B-20 | |
| P-23 | M-48 | B-1 | B-17 | |
| P-24 | M-49 | B-1 | B-18 | B-9 |
| P-25 | M-50 | B-1 | B-25 | |
| P-26 | M-30 | B-32 | B-18 | B-10 |
| P-27 | M-22 | B-7 | B-26 | |
| P-28 | M-45 | B-1 | B-5 | |
| P-29 | M-46 | B-1 | B-18 | |
| P-30 | M-23 | B-6 | B-27 | |
| P-31 | M-43 | B-1 | B-20 | B-15 |

The content of the colorant compound represented by General Formula (1) in a high molecular type in the coloring composition of the present invention is preferably 10% by mass to 70% by mass, and more preferably 15% by mass to 45% by mass, with respect to the total solid content of the coloring composition.

Incidentally, in the case where the coloring composition of the present invention includes another coloring agent (for example, a pigment), in addition to the colorant compound represented by General Formula (1) in a high molecular type, the mass ratio is set after consideration of its content ratio with respect to the coloring agent.

The mass ratio of the colorant compound represented by General Formula (1) to the coloring agent (colorant multimer/pigment) is preferably 0.3 to 1, more preferably 0.35 to 0.8, and still more preferably 0.45 to 0.75.

The coloring composition of the present invention is used for formation of a colored layer of the color filter. The coloring composition used in the present invention preferably includes a curable compound and a solvent, in addition to the colorant compound represented by General Formula (1). Examples of the curable compound include a polymerizable compound and an alkali-soluble resin (including an alkali-soluble resin containing a polymerizable group), and the curable compound is suitably selected according to the purpose or production method therefor. Furthermore, the coloring composition of the present invention preferably includes a photopolymerization initiator. In addition, the coloring composition may include a coloring agent (preferably a pigment), in addition to the colorant compound represented by General Formula (1).

For example, in the case of forming a colored layer by a photoresist, the coloring composition of the present invention is preferably a composition including the colorant compound represented by General Formula (1), a curable compound, a solvent, and a photopolymerization initiator. Further, the coloring composition may include a surfactant, and a coloring agent (preferably a pigment), in addition to the colorant compound represented by General Formula (1).

In addition, in the case of forming a colored layer by dry etching, the coloring composition is preferably a composition including the colorant compound represented by General Formula (1), a curable compound, a solvent, and a photopolymerization initiator. Further, the coloring composition may include a coloring agent (preferably a pigment), in addition to the colorant compound represented by General Formula (1).

Details thereof will be described below.

<Curable Compound>

The coloring composition of the present invention contains a polymerizable compound. The curable compound preferably includes at least a polymerizable compound.

As the curable compound, known curable compounds which can be crosslinked by a radical, an acid, or heat can be used. Examples thereof include compounds having an ethylenically unsaturated bond, a cyclic ether (epoxy or oxetane), methylol, alkoxymethyl, block isocyanate, or the like. From the viewpoint of sensitivity, the curable compound is suitably selected from polymerizable compounds having at least one, and preferably two or more ethylenically unsaturated terminal bonds. Among these, polyfunctional polymerizable compounds having 4 or more functional groups are preferable, and polyfunctional polymerizable compounds having 5 or more functional groups are more preferable.

Such compound groups are widely known in the industrial field of the relevant art and can be used in the present invention without particular limitation. These may be in any type of chemical forms such as a monomer, a prepolymer, that is, a dimer, a trimer, an oligomer, a mixture thereof, and a multimer thereof. The curable compound in the present invention may be used singly or in combination of two or more kinds thereof.

More specifically, examples of the monomer and prepolymer include unsaturated carboxylic acids (for example, acrylic acid, methacrylic acid, itaconic acid, crotonic acid, isocrotonic acid, and maleic acid) or esters thereof, amides, and multimers of these, and among these, an ester of unsaturated carboxylic acid and an aliphatic polyhydric alcohol compound, amides of unsaturated carboxylic acid and an aliphatic polyamine compound, and multimers of these are preferable. Moreover, products of an addition reaction between unsaturated carboxylic esters or amides having nucleophilic substituent such as a hydroxyl group, an amino group, or a mercapto group and monofunctional or polyfunctional isocyanates or epoxies, products of a dehydration condensation reaction between the unsaturated carboxylic esters or amides and a monofunctional or polyfunctional carboxylic acid, and the like are also suitably used. In addition, products of an addition reaction between unsaturated carboxylic esters or amides having an electrophilic substituent such as an isocyanate group or an epoxy group and monofunctional or polyfunctional alcohols, amines, or thiols, and products of a substitution reaction between unsaturated carboxylic esters or amides having an eliminatable substituent such as a halogen group or tosyloxy group and monofunctional or polyfunctional alcohols, amines, or thiols are also suitable. As other examples, instead of the above unsaturated carboxylic acid, vinyl benzene derivatives of unsaturated phosphonic acid, styrene, and the like and compound groups substituted with vinyl ether, allyl ether, or the like can also be used.

As these specific compounds, the compounds described in paragraph Nos. 0095 to 0108 of JP2009-288705A can also be suitably used in the present invention.

Moreover, as the polymerizable compound, a compound which has at least one addition-polymerizable ethylene group and has an ethylenically unsaturated group having a boiling point of 100° C. or higher under normal pressure is also preferable. Examples of the compound include a monofunctional acrylate or methacrylate such as polyethylene glycol mono(meth)acrylate, polypropylene glycol mono (meth)acrylate, and phenoxyethyl (meth)acrylate; a compound which is obtained by adding ethylene oxide or propylene oxide to a polyfunctional alcohol, and then (meth) acrylating the resultant, such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta (meth)acrylate, dipentaerythritol hexa(meth)acrylate, hexanediol (meth)acrylate, trimethylolpropane tri(acryloyloxypropyl)ether, tri(acryloyloxyethyl) isocyanurate, glycerin, and trimethylolethane; the urethane (meth)acrylates described in JP1973-41708B (JP-S48-41708B), JP1975-6034B (JP-S50-6034B), and JP1976-37193A (JP-S51-37193A); the polyester acrylates described in JP1973-64183A (JP-S48-64183A), JP1974-43191B (JP-S49-43191B), and JP1977-30490B (JP-S52-30490B); a polyfunctional acrylate or methacrylate such as epoxy acrylate as a product of a reaction between an epoxy resin and a (meth)acrylic acid; and a mixture thereof.

Other examples thereof include a polyfunctional (meth) acrylate which is obtained by reacting a polyfunctional carboxylic acid with a compound having a cyclic ether group such as glycidyl (meth)acrylate, and an ethylenically unsaturated group.

Furthermore, as other preferred polymerizable compounds, the compounds having a fluorene ring and an ethylenically unsaturated group having 2 or more functional groups described in JP2010-160418A, JP2010-129825A, and JP4364216B, and a cardo resin can also be used.

Moreover, as the compound which has a boiling point of 100° C. or higher under normal pressure and has at least one addition-polymerizable ethylenically unsaturated group, compounds described in paragraph Nos. 0254 to 0257 of JP2008-292970A are also suitable.

In addition to those above, radically polymerizable monomers represented by the following General Formulae (MO-1) to (MO-5) can also be used. Incidentally, in the formulae, in the case where T is an oxyalkylene group, the terminal at a carbon atom side binds to R.

(MO-1)

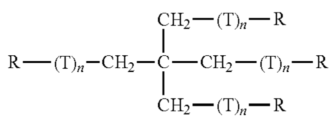

(MO-2)

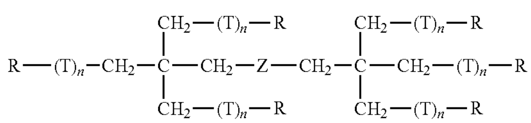

(MO-3)

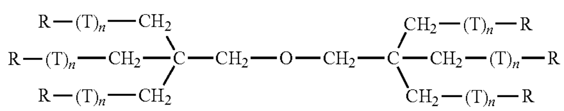

(MO-4)

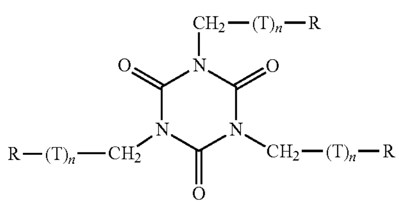

(MO-5)

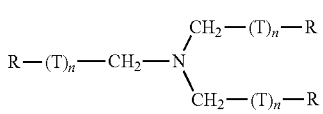

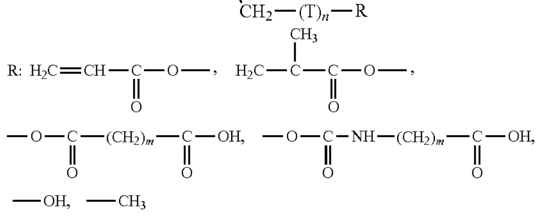

T: $*$—$(CH_2)_m$—$*$, —$OCH_2$—, —$OCH_2CH_2$—, —$OCH_2CH_2CH_2$—, —$OCH_2CH_2CH_2CH_2$—, —O(CO)—$(CH_2)_m$—, —COO—$(CH_2)_m$—, $OCH(CH_3)$—$CH_2$—, —$OCH_2CH(CH_3)$—

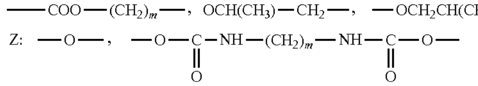

In General Formulae, n is 0 to 14, and m is 1 to 8. A plurality of R's and T's which are present in the same molecule may be the same as or different from each other.

In each of the polymerizable compounds represented by General Formulae (MO-1) to (MO-5), at least one of R's that are present in a plural number represents a group represented by —OC(═O)CH═$CH_2$, or —OC(═O)C($CH_3$)═$CH_2$.

As specific examples of the polymerizable compounds represented by General Formulae (MO-1) to (MO-5), the compounds described in paragraph Nos. 0248 to 0251 of JP2007-269779A can also be suitably used in the present invention.

In addition, a compound which is obtained by adding ethylene oxide or propylene oxide to the polyfunctional alcohol, which is described as General Formulae (1) and (2) in JP1998-62986A (JP-H10-62986A) together with the specific examples thereof, and then (meth)acrylated can also be used as the polymerizable compound.

Among these, as the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth) acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd.), ethyleneoxy-modified dipentaerythritol hexaacrylate (A-DPH-12E as a commercially available product; manufactured by Shin-Nakamura Kayaku Co., Ltd.), and a structure in which an ethylene glycol or propylene glycol residue is interposed between these (meth) acryloyl groups are preferable. Oligomer types of these can also be used.

The polymerizable compound is a polyfunctional monomer and may have an acid group such as a carboxyl group, a sulfonic acid group, and a phosphoric acid group. If an ethylenic compound has an unreacted carboxyl group as in a case where the ethylene compound is a mixture described above, this compound can be used as is, but if desired, a hydroxyl group of the above ethylenic compound may be reacted with a non-aromatic carboxylic anhydride so as to introduce an acid group. In this case, specific examples of the non-aromatic carboxylic anhydride used include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, as a monomer having an acid group, preferable is a polyfunctional monomer which is an ester obtained between an aliphatic polyhydroxy compound and an unsaturated carboxylic acid and provides an acid group by reacting an unreacted hydroxyl group of the aliphatic polyhydroxy compound with a non-aromatic carboxylic anhydride. A monomer in which the aliphatic polyhydroxy compound in the ester is pentaerythritol and/or dipentaerythritol is particularly preferable. Examples of commercially available products thereof include M-510 and M-520, which are polybasic modified acryl oligomers manufactured by TOAGOSEI, CO., LTD.

These monomers may be used singly, but since it is difficult to use a single compound in production, two or more kinds thereof may be used as a mixture. Moreover, if desired, a polyfunctional monomer not having an acid group and a polyfunctional monomer having an acid group may be used in combination therewith as the monomer.

The acid value of the polyfunctional monomer having an acid group is preferably 0.1 mg KOH/g to 40 mg KOH/g, and particularly preferably 5 mg KOH/g to 30 mg KOH/g.

If the acid value of the polyfunctional monomer is too low, the development solubility characteristics deteriorates. If the acid value is too high, difficulty is caused in the production and handleability, hence a photopolymerization performance deteriorates, which leads to deterioration of curability such as surface smoothness of pixels. Therefore, in the case where a combination of two or more kinds of polyfunctional monomers having different acid groups is used, or when a combination of polyfunctional monomers not having an acid group is used, it is preferable to adjust the acid value such that the acid groups as all the polyfunctional monomers fall within the above range.

Moreover, it is also a preferred embodiment that a polyfunctional monomer having a caprolactone structure is contained as a polymerizable monomer.

The polyfunctional monomer having a caprolactone structure is not particularly limited as long as it has a caprolactone structure in a molecule thereof, and examples thereof include ϵ-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and ϵ-caprolactone. Among these, a polyfunctional monomer having a caprolactone structure represented by the following General Formula (Z-1) is preferable.

(Z-1)

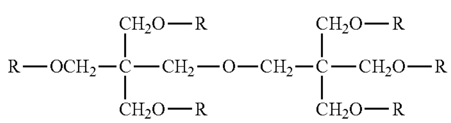

In General Formula (Z-1), all of six R's are a group represented by the following General Formula (Z-2). Alternatively, one to five out of six R's are a group represented by the following General Formula (Z-2), and the remainder is a group represented by the following General Formula (Z-3).

(Z-2)

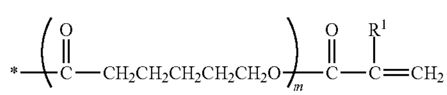

In General Formula (Z-2), $R^1$ represents a hydrogen atom or a methyl group, m represents a number 1 or 2, and "*" represents a direct bond.

(Z-3)

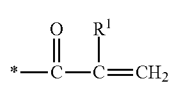

In General Formula (Z-3), $R^1$ represents a hydrogen atom or a methyl group, and "*" represents a direct bond.

The polyfunctional monomer having such a caprolactone structure is commercially available from Nippon Kayaku Co., Ltd., as a KAYARAD DPCA series, and examples thereof include DPCA-20 (a compound in which m=1 in Formulae (1) to (3), the number of the group represented by Formula (2)=2, and all of $R^1$'s are hydrogen atoms), DPCA-30 (a compound in which m=1 in the same Formulae, the number of the group represented by Formula (2)=3, and all of $R^1$'s are hydrogen atoms), DPCA-60 (a compound in which m=1 in the same Formulae, the number of the group represented by Formula (2)=6, and all of $R^1$'s are hydrogen atoms), and DPCA-120 (a compound in which m=2 in the same Formulae, the number of the group represented by Formula (2)=6, and all of $R^1$'s are hydrogen atoms).

In the present invention, the polyfunctional monomer having a caprolactone structure can be used singly or as a mixture of two or more kinds thereof.

Moreover, the specific monomer in the present invention is preferably at least one kind selected from a group of compounds represented by the following General Formula (Z-4) or (Z-5).

(Z-4)

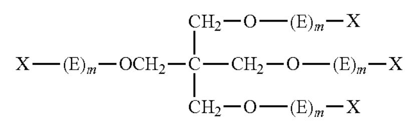

(Z-5)

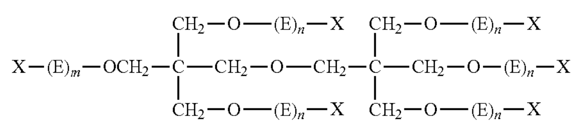

In General Formulae (Z-4) and (Z-5), E's each independently represent $—((CH_2)_yCH_2O)—$ or $—((CH_2)_yCH(CH_3)O)—$, y's each independently represent an integer of 0 to 10, and X's each independently represent an acryloyl group, a methacryloyl group, a hydrogen atom, or a carboxyl group.

In General Formula (Z-4), the sum of the acryloyl group and the methacryloyl group is 3 or 4, m's each independently represent an integer of 0 to 10, and the sum of the respective m's is an integer of 0 to 40. Herein, in the case where the sum of the respective m's is 0, any one of X's is a carboxyl group.

In General Formula (Z-5), the sum of the acryloyl group and the methacryloyl group is 5 or 6, n's each independently represent an integer of 0 to 10, and the sum of the respective n's is an integer of 0 to 60. Herein, in the case where the sum of the respective n's is 0, one of X's is a carboxyl group.

In General Formula (Z-4), m is preferably an integer of 0 to 6, and more preferably an integer of 0 to 4. Further, the sum of the respective m's is preferably an integer of 2 to 40, more preferably an integer of 2 to 16, and particularly preferably an integer of 4 to 8.

In General Formula (Z-5), n is preferably an integer of 0 to 6, and more preferably an integer of 0 to 4.

Furthermore, the sum of the respective n's is preferably an integer of 3 to 60, more preferably an integer of 3 to 24, and particularly preferably an integer of 6 to 12.

In addition, $—((CH_2)_yCH_2O)—$ or $—((CH_2)_yCH(CH_3)O)—$ in General Formula (Z-4) or (Z-5) is preferably in the form in which the terminal at an oxygen atom side binds to X.

The compound represented by General Formula (Z-4) or (Z-5) may be used singly or in combination of two or more kinds thereof. In particular, a form in which all of six X's in General Formula (Z-5) are an acryloyl group is preferable.

Moreover, the total content of the compound represented by General Formula (Z-4) or (Z-5) in the polymerizable compound is preferably 20% by mass or more, and more preferably 50% by mass or more.

The compound represented by General Formula (Z-4) or (Z-5) can be synthesized by steps known in the related art, which includes a step of binding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. Since the respective steps are well-known, a person skilled in the art can easily synthesize the compound represented by General Formula (Z-4) or (Z-5).

Among the compounds represented by General Formula (Z-4) or (Z-5), a pentaerythritol derivative and/or a dipentaerythritol derivative is/are more preferable.

Specific examples of the compounds include compounds represented by the following Formulae (a) to (f) (hereinafter also referred to as "exemplary compounds (a) to (f)"). Among these, the exemplary compounds (a), (b), (e), and (f) are preferable.

(a)

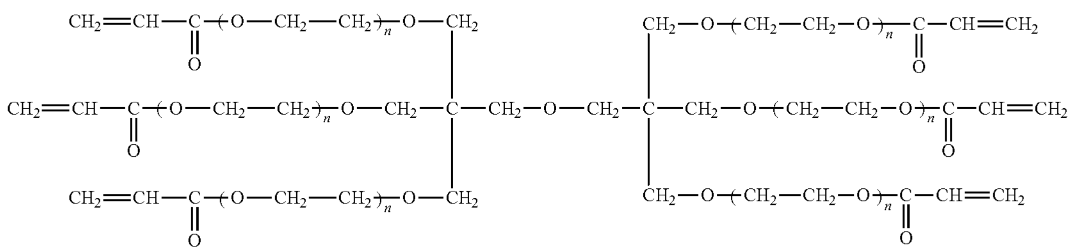

(the sum of the respective n's is 6)

(b)

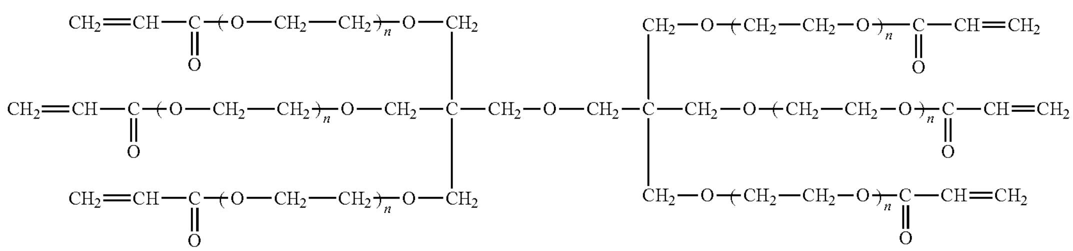

(the sum of the respective n's is 12)

(c)

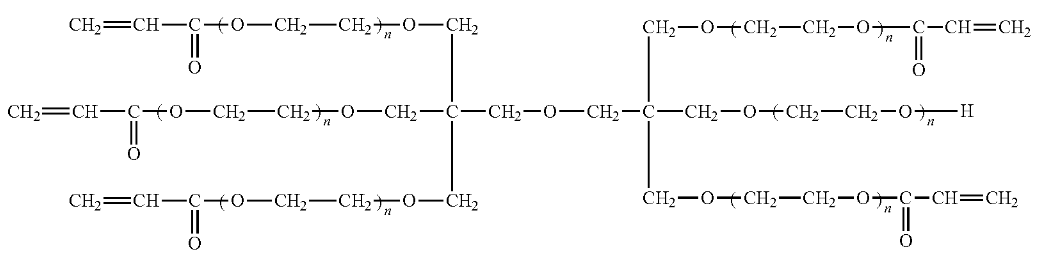

(the sum of the respective n's is 12)

(d)

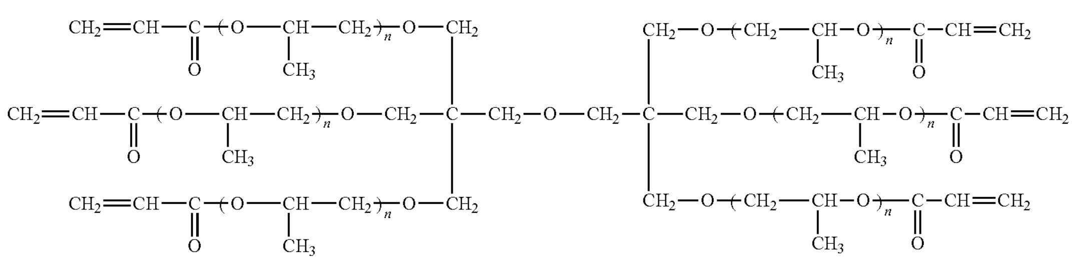

(the sum of the respective n's is 6)

-continued (e)

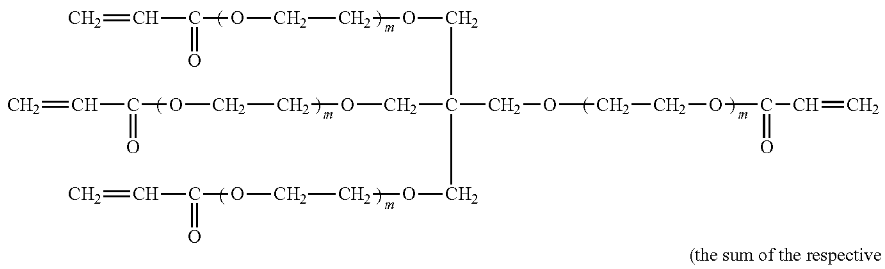

(the sum of the respective m's is 4)

(f)

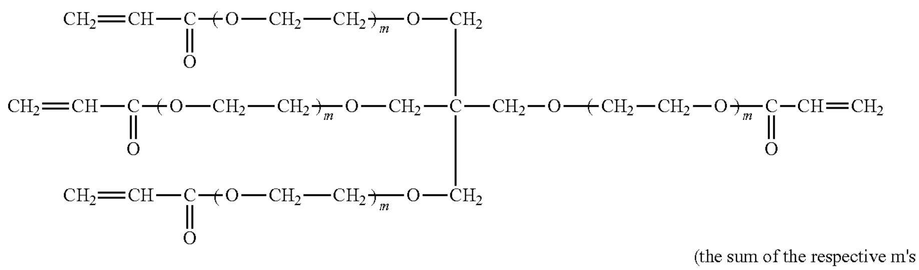

(the sum of the respective m's is 12)

Examples of commercially available products of the polymerizable compounds represented by General Formulae (Z-4) and (Z-5) include SR-494 which is a tetrafunctional acrylate having four ethyleneoxy chains, manufactured by Sartomer, and DPCA-60 which is a hexafunctional acrylate having six pentyleneoxy chains and TPA-330 which is a trifunctional acrylate having three isobutyleneoxy chains, manufactured by Nippon Kayaku Co., Ltd.

Moreover, as the polymerizable compounds, the urethane acrylates described in JP1973-41708B (JP-S48-41708B), JP1976-37193A (JP-S51-37193A), JP1990-32293B (JP-H02-32293B), and JP1990-16765B (JP-H02-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also preferable. Furthermore, if addition-polymerizable compounds, which have an amino structure or a sulfide structure in a molecule and are described in JP1988-277653A (JP-S63-277653A), JP1988-260909A (JP-S63-260909A), and JP1989-105238A (JP-H01-105238A), are used as the polymerizable compounds, a curable composition which is extremely excellent in photosensitization speed can be obtained.

Examples of commercially available products of the polymerizable compounds include urethane oligomers UAS-10 and UAB-140 (manufactured by Sanyo-Kokusaku Pulp, Co., Ltd.), UA-7200 (manufactured by SHIN-NAKAMURA CHEMICAL CO., LTD.), DPHA-40H (manufactured by Nippon Kayaku Co., Ltd.), and UA-30611, UA-306T, UA-306I, AH-600, T-600, and AI-600 (manufactured by KYOEISHA CHEMICAL CO., LTD.).

As the cyclic ether (epoxy or oxetane), examples of a bisphenol A type epoxy resin, which have an epoxy group, include JER-827, JER-828, JER-834, JER-1001, JER-1002, JER-1003, JER-1055, JER-1007, JER-1009, and JER-1010 (all manufactured by Japan Epoxy Resins Co., Ltd.), and EPICLON860, EPICLON1050, EPICLON1051, and EPICLON1055 (all manufactured by DIC Corporation); examples of a bisphenol F type epoxy resin include JER-806, JER-807, JER-4004, JER-4005, JER-4007, and JER-4010 (all manufactured by Japan Epoxy Resins Co., Ltd.), EPICLON 830 and EPICLON 835 (both manufactured by DIC Corporation), and LCE-21 and RE-602S (all manufactured by Nippon Kayaku Co., Ltd.); examples of a phenol novolac type epoxy resin include JER-152, JER-154, JER-157 S70, and JER-157 S65 (all manufactured by Japan Epoxy Resins Co., Ltd.), and EPICLON N-740, EPICLON N-770, and EPICLON N-775 (all manufactured by DIC Corporation); examples of a cresol novolac type epoxy resin include EPICLON N-660, EPICLON N-665, EPICLON N-670, EPICLON N-673, EPICLON N-680, EPICLON N-690, and EPICLON N-695 (all manufactured by DIC Corporation), and EOCN-1020 (manufactured by Nippon Kayaku Co., Ltd.); and examples of an aliphatic epoxy resin include ADEKA RESIN EP-4080S, ADEKA RESIN EP-4085S, and ADEKA RESIN EP-4088S (all manufactured by ADEKA CORPORATION), CELLOXIDE 2021P, CELLOXIDE 2081, CELLOXIDE 2083, CELLOXIDE 2085, EHPE-3150 (a 1,2-epoxy-4-(2-oxylanyl(cyclohexane adduct of 2,2-bis(hydroxymethyl)-1-butanol), EPOLEAD PB 3600, and EPOLEAD PB 4700 (all manufactured by Daicel Chemical Industries, Ltd.), DENACOL EX-211L, EX-212L, EX-214L, EX-216L, EX-321L, and EX-850L (all manufactured by Nagase ChemteX Corporation), ADEKA RESIN EP-4000S, ADEKA RESIN EP-4003S, ADEKA RESIN EP-4010S, and ADEKA RESIN EP-4011S (all manufactured by ADEKA CORPORATION), NC-2000, NC-3000, NC-7300, XD-1000, EPPN-501, and EPPN-502 (all manufactured by ADEKA CORPORATION), and JER-1031S (manufactured by Japan Epoxy Resins Co., Ltd.). Such compounds are suitable for a case of forming a pattern by a dry etching method.

Further, as the compound having an epoxy group, the following compounds can also be used.

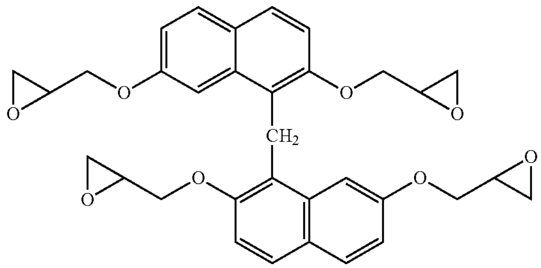

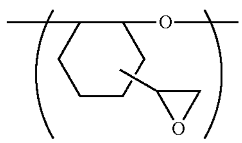

Examples of the compound containing an alkoxymethyl group or a methylol group include a compound in which an alkoxymethyl group or a methylol group is bonded to a nitrogen atom or a carbon atom which forms an aromatic ring.

As the compound in which an alkoxymethyl group or a methylol group is bonded to a nitrogen atom, alkoxymethylated melamine, methylolated melamine, alkoxymethylated benzoguanamine, methylolated benzoguanamine, alkoxymethylated glycoluril, methylolated glycoluril, alkoxymethylated urea, methylolated urea, or the like is preferable. Further, reference can be made to the description of paragraphs 0134 to 0147 of JP2004-295116A, the contents of which are hereby incorporated by reference.

Preferred examples of the structure of the compound in which an alkoxymethyl group or a methylol group is bonded to a nitrogen atom include compounds represented by the following Formulae (8-1) to (8-4).

(8-1)

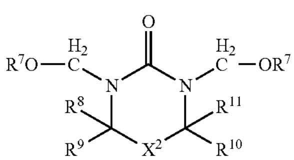

(8-2)

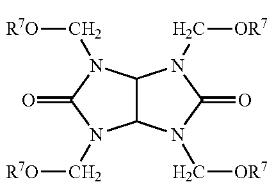

(8-3)

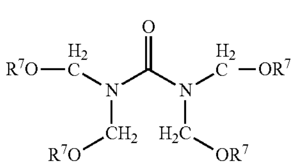

-continued (8-4)

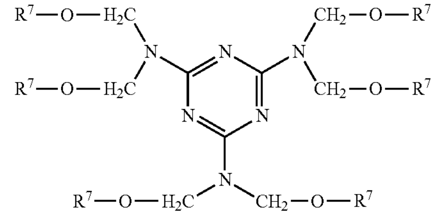

Examples of the compound in which an alkoxymethyl group or a methylol group is bonded to a carbon atom which forms an aromatic ring include those represented by the following General Formulae (4) and (5).

(4)

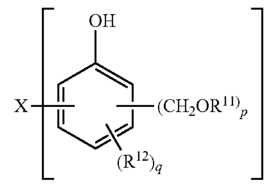

(In Formula (4), X represents a single bond or a monovalent to tetravalent organic group, $R^{11}$ and $R^{12}$ each independently a hydrogen atom or a monovalent organic group, n is an integer of 1 to 4, and p and q are each independently an integer of 0 to 4.)

(5)

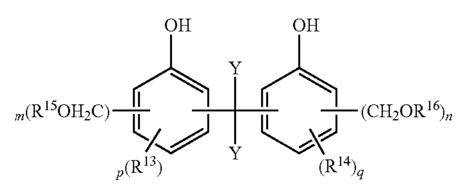

(In Formula (5), two Y's may each independently include a hydrogen atom or an alkyl group having 1 to 10 carbon atoms, an oxygen atom, or a fluorine atom, $R^{13}$ to $R^{16}$ each independently represent a hydrogen atom or a monovalent organic group, m and n are each independently an integer of 1 to 3, and p and q are each independently an integer of 0 to 4.)

Specific examples of the compound containing an alkoxymethyl group or a methylol group include those shown below. Me represents a methyl group.

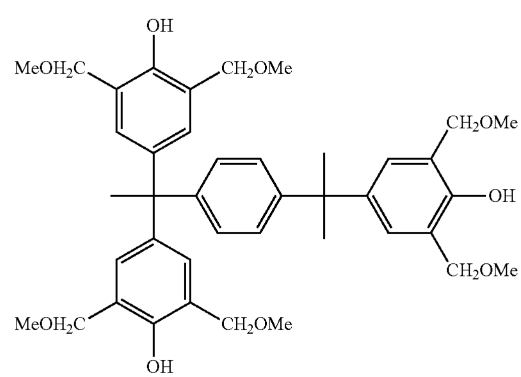

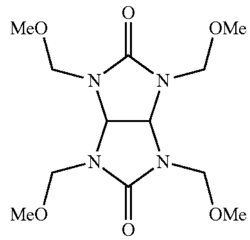

In the present invention, as the curable compound, a compound containing a block isocyanate group can also be used. The block isocyanate group in the present invention is a group capable of producing an isocyanate group by heat, and preferred examples thereof include a group formed by reacting a blocking agent and an isocyanate group and protecting the isocyanate group. In addition, the block isocyanate group is preferably a group capable of producing an isocyanate group by heat at 90° C. to 250° C.

Moreover, the block isocyanate compound is not particularly limited in its skeleton, and may be aliphatic, alicyclic, or aromatic polyisocyanate.

Examples of the parent structure of the block isocyanate compound include a biuret type, an isocyanurate type, an adduct type, and a bifunctional prepolymer type.

Examples of the blocking agent that forms the block structure of the block isocyanate compound include an oxime compound, a lactam compound, a phenol compound, an alcohol compound, an amine compound, an active methylene compound, a pyrazole compound, a mercaptan compound, an imidazole-based compound, and an imide-based compound. Among these, a blocking agent selected from an oxime compound, a lactam compound, a phenol compound, an alcohol compound, an amine compound, an active methylene compound, and a pyrazole compound is particularly preferable.

Specific examples of the compound containing a block isocyanate group include the following compounds.

For example, from the viewpoint of sensitivity, a structure in which the content of an unsaturated group per molecule is large is preferable, and in many cases, it is preferable that the polymerizable compound has 2 or more functional groups. Moreover, from the viewpoint of enhancing the strength of a cured film formed of the coloring composition, it is preferable that the polymerizable compound has 3 or more functional groups. In addition, a method for adjusting both the sensitivity and the strength by using a combination of compounds which differ in the number of functional groups and have different polymerizable groups (for example, an acrylic ester, a methacrylic ester, a styrene-based compound, and a vinylether-based compound) is also effective. Further, it is preferable to use curable compounds having 3 or more functional groups and differing in the length of an ethylene oxide chain since the developability of the coloring composition can be adjusted, and excellent pattern formability is obtained.

In addition, from the viewpoints of the compatibility with other components (for example, a photopolymerization initiator, a substance to be dispersed, and an alkali-soluble resin) contained in the coloring composition, and the dispersibility, how to select and use the curable compound is an important factor. For example, if a low-purity compound is used or a combination of two or more kinds thereof is used, the compatibility can be improved in some cases. In addition, from the viewpoint of improving the adhesiveness of the composition to a hard surface of a support or the like, specific structures may be selected in some cases.

In the case where of the curable compound is blended into the coloring composition of the present invention, the content thereof is preferably 0.1% by mass to 90% by mass, more preferably 1.0% by mass to 60% by mass, and particularly preferably 2.0% by mass to 40% by mass, with respect to the total solid contents of the coloring composition.

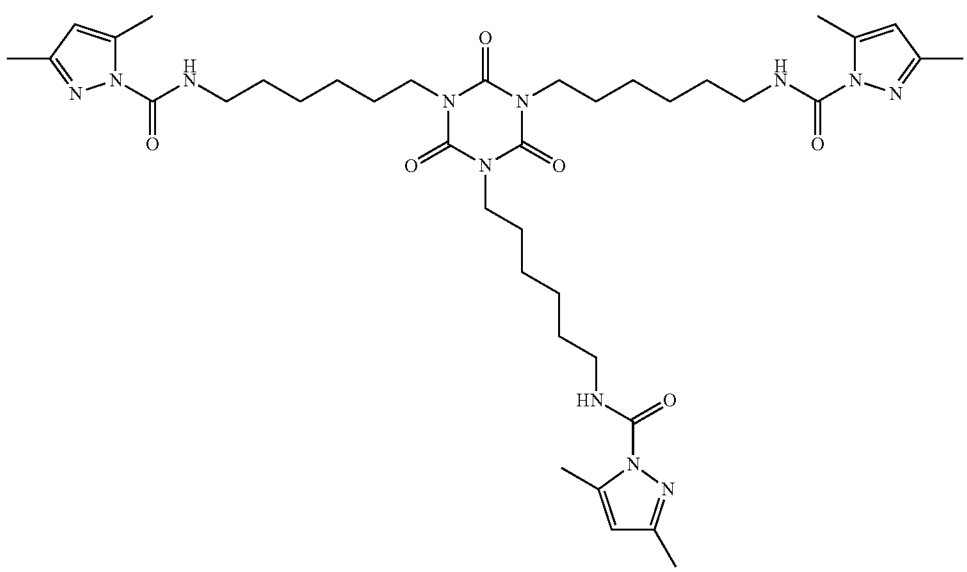

Details of how to use these curable compounds, such as the structure, whether the curable compounds are used singly or used in combination thereof, and the amount of the curable compounds added, can be arbitrarily set according to the designed final performance of the coloring composition.

The composition of the present invention may include one kind or two or more kinds of curable compound. In the case where the composition includes two or more kinds of curable compound, the total amount thereof is preferably within the range.

<<Polyfunctional Thiol Compound>>

The coloring composition of the present invention may include a polyfunctional thiol compound having two or more mercapto groups in the molecule for the purpose of promoting the reaction of the polymerizable compound. The polyfunctional thiol compounds are preferably secondary alkanethiols, and particularly preferably compounds having a structure represented by the following General Formula (I).

General Formula (I)

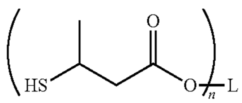

(In the formula, n represents an integer of 2 to 4, and L represents a di- to tetra-valent linking group.)

In General Formula (I), the linking group L is preferably an aliphatic group having 2 to 12 carbon atoms, n is 2, and L is particularly preferably an alkylene group having 2 to 12 carbon atoms. Specific examples of the polyfunctional thiol compound include the compounds represented by the following Structural Formulae (II) to (IV), with the compound represented by (II) being particularly preferable. These polyfunctional thiols can be used singly in combination of a plurality thereof.

(II)

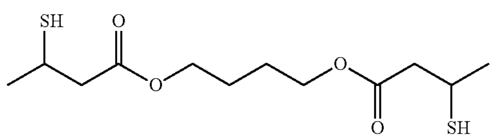

(III)

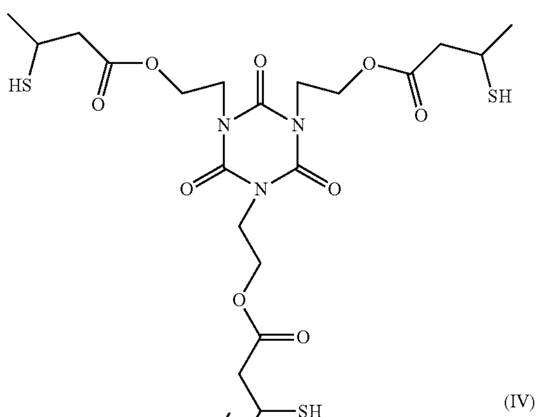

(IV)

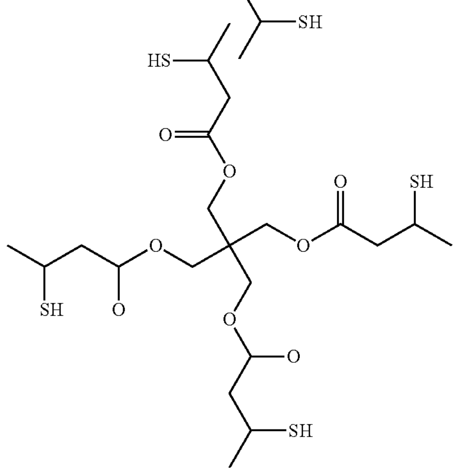

The blending amount of the polyfunctional thiol in the composition of the present invention is preferably in the range of 0.3% by weight to 8.9% by weight, and more preferably 0.8% by weight to 6.4% by weight, with respect to the total solid content excluding the solvent. Further, the polyfunctional thiol may be added for the purpose of improving stability, odors, resolution, developability, adhesion, and the like.

As the polyfunctional thiol compound, for example, 1,4-bis(3-mercaptobutyryloxy)butane can be used, and may also be used in combination with other curable compounds.

<<Alkali-Soluble Resin>>

It is more preferable that the coloring composition of the present invention contains an alkali-soluble resin.

The molecular weight of the alkali-soluble resin is not particularly defined, but Mw is preferably 5,000 to 100,000. Further, Mn is preferably 1,000 to 20,000.

The alkali-soluble resin can be appropriately selected from alkali-soluble resins which are linear organic high molecular-weight polymers and have at least one group promoting alkali-solubility in the molecule (preferably a molecule having an acryl-based copolymer or a styrene-based copolymer as a main chain). From the viewpoint of heat resistance, a polyhydroxystyrene-based resin, a polysiloxane-based resin, an acryl-based resin, an acrylamide-based resin, and an acryl/acrylamide copolymer resin are preferable. Further, from the viewpoint of controlling developability, an acryl-based resin, an acrylamide-based resin, and an acryl/acrylamide copolymer resin are preferable.

Examples of the group promoting alkali-solubility (hereinafter also referred to as an "acid group") include a carboxyl group, a phosphoric acid group, a sulfonic acid group, a phenolic hydroxyl group, and the like. The group promoting alkali-solubility is preferably a group which is soluble in an organic solvent and can be developed by an aqueous weak alkaline solution, and particularly preferred examples thereof include a (meth)acrylic acid. These acid groups may be used singly or in combination of two or more kinds thereof.

Examples of the monomer which can give the acid group after polymerization include monomers having a hydroxyl group, such as 2-hydroxyethyl (meth)acrylate, monomers having an epoxy group, such as glycidyl (meth)acrylate, and monomers having an isocyanate group, such as 2-isocyanatoethyl (meth)acrylate. The monomers for introducing these acid groups may be used singly or in combination of two or more kinds thereof. In order to introduce the acid group into the alkali-soluble resin, for example, the monomer having the acid group and/or the monomer which can give the acid group after polymerization (hereinafter referred to as a "monomer for introducing an acid group" in some cases) may be polymerized as a monomer component.

Incidentally, in the case where a monomer which can give the acid group after polymerization is used as a monomer component to introduce the acid group, a treatment for giving the acid group, which will be described later, needs to be performed after polymerization.

For production of the alkali-soluble resin, for example, a method using known radical polymerization can be applied. Various polymerization conditions for producing the alkali-soluble resin by radical polymerization, such as a temperature, a pressure, the type and amount of a radical initiator, and the type of a solvent, can be easily set by those skilled in the art, and the conditions can also be determined experimentally.

As the linear organic high-molecular-weight polymer used as the alkali-soluble resin, polymers having a carboxylic acid in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxylic acid in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, an aryl (meth)acrylate, and a vinyl compound. Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth) acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer disclosed in JP1998-300922A (JP-H10-300922A) include N-phenylmaleimide and N-cyclohexylmaleimide. Incidentally, other monomers copolymerizable with a (meth)acrylic acid may be used singly or in combination of two or more kinds thereof.

It is also preferable that the coloring composition contains, as the alkali-soluble resin, a polymer (a) obtained by polymerizing monomer components including a compound represented by the following General Formula (ED) and/or a compound represented by the following General Formula (ED2) (these compounds may hereinafter also be referred to as an “ether dimer” in some cases) as an essential component.

General Formula (ED)

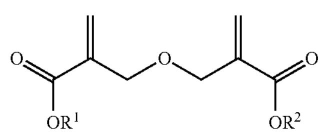

In General Formula (ED), $R^1$ and $R^2$ each independently represent a hydrogen atom or a hydrocarbon group having 1 to 25 carbon atoms, which may have a substituent.

General Formula (ED2)

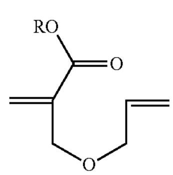

In General Formula (ED2), R represents a hydrogen atom or an organic group having 1 to 30 carbon atoms. With respect to specific examples of General Formula (ED2), reference can be made to the description of JP2010-168539A.

Thus, the coloring composition of the present invention can form a cured coated film which is extremely excellent in heat resistance as well as transparency. In General Formula (ED) which represents the ether dimer, the hydrocarbon group having 1 to 25 carbon atom, represented by $R^1$ and $R^2$, which may have a substituent, is not particularly limited, and examples thereof include linear or branched alkyl groups such as methyl, ethyl, n-propyl, isopropyl, n-butyl, isobutyl, tert-butyl, tert-amyl, stearyl, lauryl, and 2-ethylhexyl; aryl groups such as phenyl; alicyclic groups such as cyclohexyl, tert-butylcyclohexyl, dicyclopentadienyl, tricyclodecanyl, isobornyl, adamantyl, and 2-methyl-2-adamantyl; alkyl groups substituted with alkoxy such as 1-methoxyethyl and 1-ethoxyethyl; and alkyl groups substituted with an aryl group such as benzyl. Among these, from the viewpoints of heat resistance, substituents of primary or secondary carbon, which are not easily eliminated by an acid or heat, such as methyl, ethyl, cyclohexyl, and benzyl, are preferable.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(tert-butyl)-2,2'-[oxybis(methylene)]bis-2-propenoate, di(tert-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(tert-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are particularly preferable. These ether dimers may be used singly or in combination of two or more kinds thereof. The structure derived from the compound represented by General Formula (ED) may be copolymerized with other monomers.

Furthermore, the alkali-soluble resin may include a structure unit derived from an ethylenically unsaturated monomer represented by the following Formula (X).

General Formula (X)

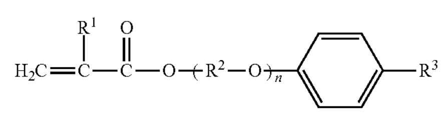

(In Formula (X), $R^1$ represents a hydrogen atom or a methyl group, $R^2$ represents an alkylene group having 2 to 10 carbon atoms, $R^3$ represents a hydrogen atom or an alkyl group having 1 to 20 carbon atoms, which may contain a benzene ring, and n represents an integer of 1 to 15.)

In Formula (X), the number of carbon atoms of the alkylene group of $R^2$ is preferably 2 to 3. Further, the number of carbon atoms of the alkyl group of $R^3$ is 1 to 20, and more preferably 1 to 10, and the alkyl group of $R^3$ may contain a benzene ring. Examples of the alkyl group containing a benzene ring, represented by $R^3$, include a benzyl group and a 2-phenyl(iso)propyl group.

Moreover, in order to improve the crosslinking efficiency of the coloring composition in the present invention, an alkali-soluble resin having a polymerizable group is preferably used. If such the alkali-soluble resin is used, solvent resistance tends to increase. Further, light fastness or heat resistance also tends to increase. As the alkali-soluble resin having a polymerizable group, an alkali-soluble resins and the like containing an allyl group, a (meth)acryl group, an allyloxyalkyl group, and the like on a side chain thereof are useful. Examples of the polymer containing the above polymerizable group include DIANAL NR SERIES (manufactured by Mitsubishi Rayon Co., Ltd.), Photomer 6173 (a polyurethane acrylic oligomer containing COOH, manufactured by Diamond Shamrock Co., Ltd.), BISCOAT R-264 and KS RESIST 106 (all manufactured by OSAKA ORGANIC CHEMICAL INDUSTRY LTD.), CYCLOMER P SERIES and PLACCEL CF200 SERIES (all manufactured by DAICEL Corporation), and Ebecryl 3800 (manufactured by DAICEL-UCB Co., Ltd.). As the alkali-soluble resin containing a polymerizable group, a polymerizable double bond-containing acryl-based resin modified with urethane, which is a resin obtained by reacting an isocyanate group and an OH group in advance to leave one unreacted isocyanate group and performing a reaction between a compound having a (meth)acryloyl group and an acryl-based resin having a carboxyl group, an unsaturated bond-containing acryl-based resin which is obtained by a reaction between an acryl-based resin having a carboxyl group and a compound having both an epoxy group and a polymerizable double bond in a molecule, a polymerizable double bond-containing acryl-based resin which is obtained by a reaction between an acid pendant type epoxy acrylate resin, an acryl-based resin having an OH group, and a dibasic acid anhydride having a polymerizable double bond, a resin obtained by a reaction between an acryl-based resin having an OH group and a compound having isocyanate and a polymerizable group, a resin which is obtained by treating a resin, which has an ester group having an elimination group such as a halogen atom or a sulfonate group in an α-position or a β-position described in JP2002-229207A and JP2003-335814A on a side chain, with a base, and the like are preferable.

As the alkali-soluble resin, a benzyl (meth)acrylate/(meth)acrylic acid copolymer or a multicomponent copolymer including benzyl (meth)acrylate/(meth)acrylic acid/other monomers is particularly suitable. Examples thereof also include a benzyl (meth)acrylate/(meth)acrylic acid/2-hydroxyethyl (meth)acrylate copolymer obtained by copolymerizing 2-hydroxyethyl methacrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, and a 2-hydroxyethyl methacrylate/polystyrene macromonomer/benzyl methacrylate/methacrylic acid copolymer, and particularly preferably a benzyl methacrylate/methacrylic acid copolymer.

With respect to the alkali-soluble resin, reference can be made to the descriptions in paragraphs 0558 to 0571 of JP2012-208494A ([0685] to [0700] of the corresponding US2012/0235099A), the contents of which are hereby incorporated by reference.

Furthermore, it is preferable to use the copolymers (B) described in paragraph Nos. 0029 to 0063 of JP2012-32767A and the alkali-soluble resins used in Examples of the document; the binder resins described in paragraph Nos. 0088 to 0098 of JP2012-208474A and the binder resins used in Examples of the document; the binder resins described in paragraph Nos. 0022 to 0032 of JP2012-137531A and the binder resins in Examples of the document; the binder resins described in paragraph Nos. 0132 to 0143 of JP2013-024934A and the binder resins used in Examples of the document; the binder resins described in paragraph Nos. 0092 to 0098 of JP2011-242752A and the binder resins used in Examples; or the binder resins described in paragraph Nos. 0030 to 0072 of JP2012-032770A, the contents of which are hereby incorporated by reference. More specifically, the following resins are preferable.

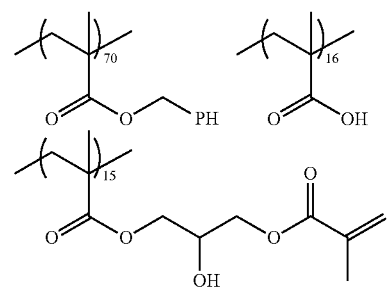

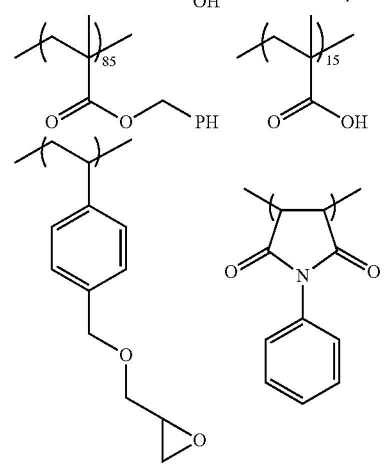

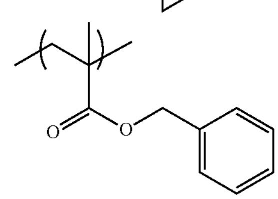

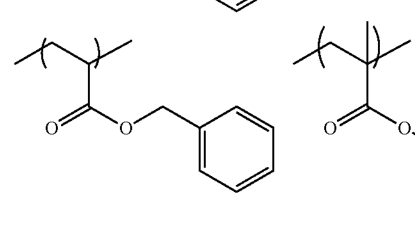

-continued
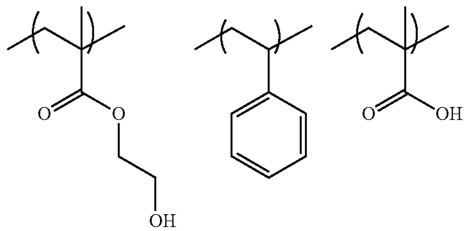
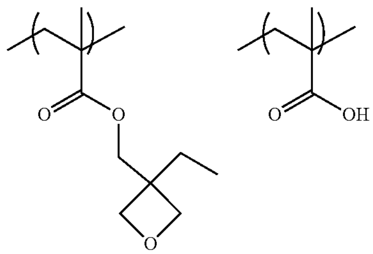
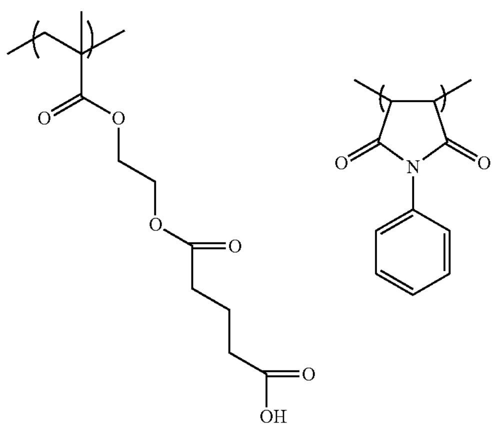
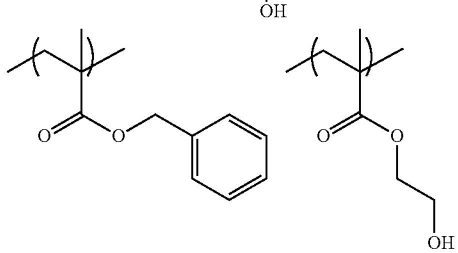
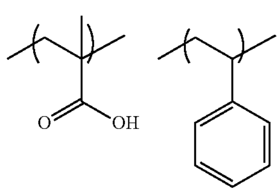
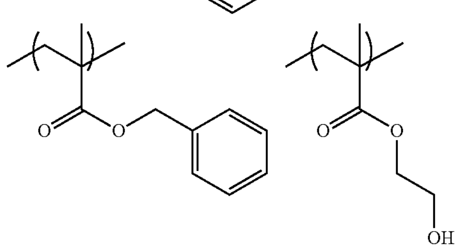
-continued
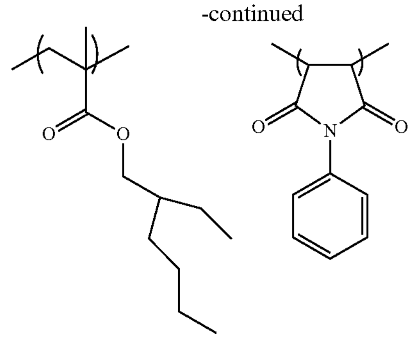
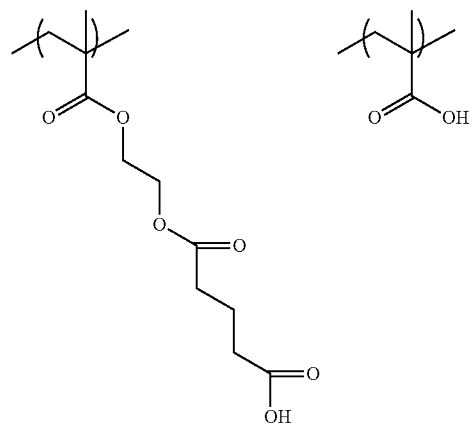
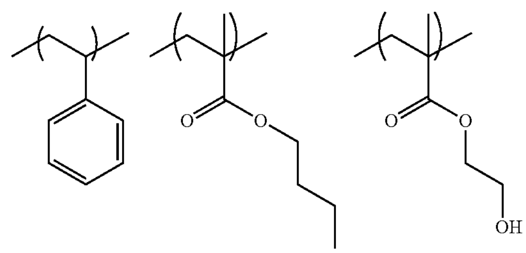
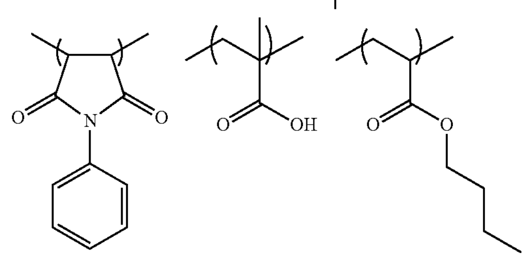
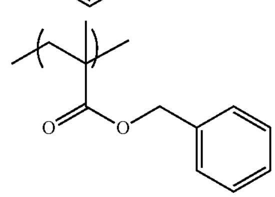
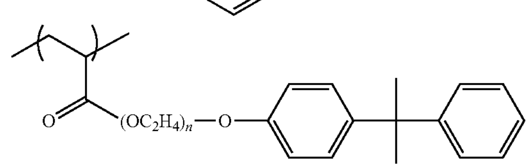

-continued

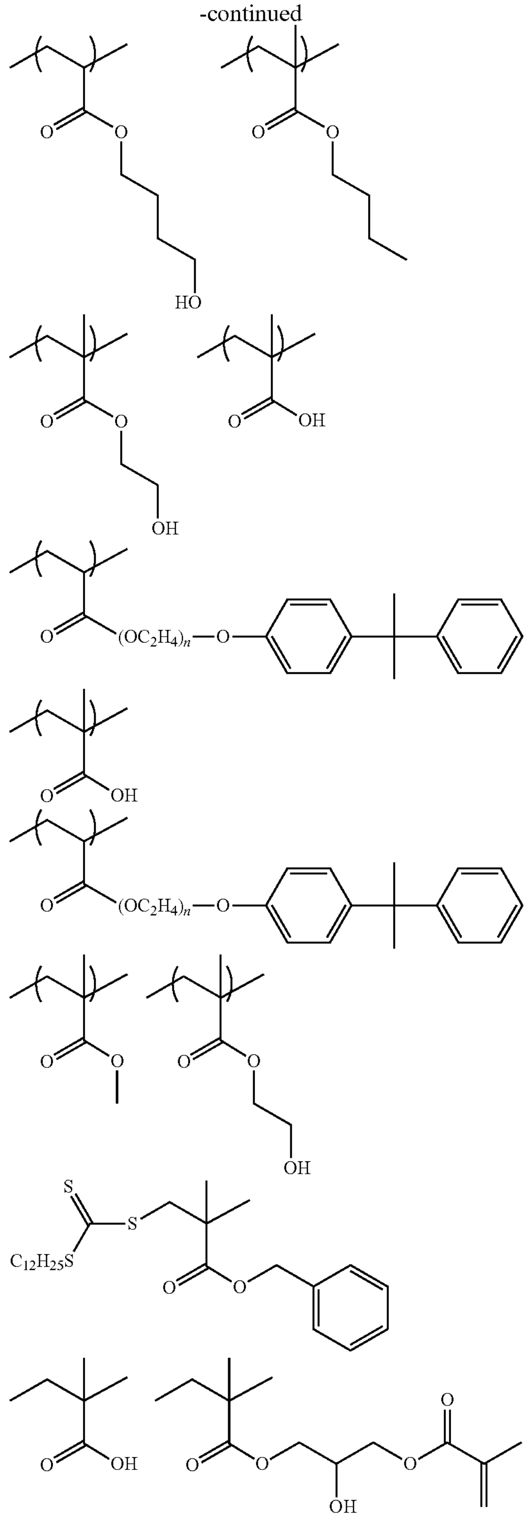

The acid value of the alkali-soluble resin is preferably 30 mgKOH/g to 200 mgKOH/g, more preferably 50 mgKOH/g to 150 mgKOH/g, and particularly preferably 70 mgKOH/g to 120 mgKOH/g.

Furthermore, the weight-average molecular weight (Mw) of the alkali-soluble resin is preferably 2,000 to 50,000, more preferably 5,000 to 30,000, and particularly preferably 7,000 to 20,000.

In the case where the coloring composition contains an alkali-soluble resin, the content of the alkali-soluble resin is preferably 1% by mass to 15% by mass, more preferably 2% by mass to 12% by mass, and particularly preferably 3% by mass to 10% by mass, with respect to the total solid contents of the coloring composition.

The composition of the present invention may include one kind or two or more kinds of alkali-soluble resin. In the case where the composition includes two or more kinds of the alkali-soluble resin, the total amount thereof is preferably within the range.

<Solvent>

The coloring composition of the present invention contains a solvent.

The solvent is not particularly limited as long as the solvent satisfies the solubility of the respective components or the coatability of the coloring composition, but in particular, it is preferable to select the solvent in consideration of the solubility, coatability, and safety of an ultraviolet absorbent, the alkali-soluble resin, the dispersant, or the like. In addition, when the coloring composition in the present invention is prepared, the coloring composition preferably includes at least two kinds of solvents. The solvent is preferably an organic solvent.

Suitable examples of the organic solvent include esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (for example, methyl oxyacetate, ethyl oxyacetate, and butyl oxyacetate (for example, methyl methoxyacetate, ethyl methoxyacetate, butyl methoxyacetate, methyl ethoxyacetate, and ethyl ethoxyacetate)), alkyl 3-oxypropionate esters (for example, methyl 3-oxypropionate and ethyl 3-oxypropionate (for example, methyl 3-methoxypropionate, ethyl 3-methoxypropionate, methyl 3-ethoxypropionate, and ethyl 3-ethoxypropionate)), alkyl 2-oxypropionate esters (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methyl propionate and ethyl 2-oxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate; ketones such as methyl ethyl ketone, cyclohexanone, 2-heptanone, and 3-butanone; and aromatic hydrocarbons such as toluene and xylene.

From the viewpoint of the solubility of an ultraviolet absorbent and the alkali-soluble resin, and improvement of the shape of the coated surface, it is also preferable to mix two or more kinds of these organic solvents. In this case, a mixed solution consisting of two or more kinds selected from the aforementioned methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, and propylene glycol methyl ether acetate is particularly preferable.

In the present invention, it is preferable that the organic solvent has a content of peroxides of 0.8 mmmpl/L or less, and it is more preferable that the organic solvent does not substantially include peroxides.

From the viewpoint of coatability, the content of the solvent in the coloring composition is set such that the concentration of the total solid contents of the composition becomes preferably 5% by mass to 80% by mass, more preferably 5% by mass to 60% by mass, and particularly preferably 10% by mass to 50% by mass.

The composition of the present invention may include one kind or two or more kinds of solvent. In the case where the composition includes two or more kinds of the solvents, the total amount thereof is preferably within the range.

<Photopolymerization Initiator>

From the viewpoint of further improving sensitivity, it is preferable that the coloring composition of the present invention contains a photopolymerization initiator.

The photopolymerization initiator is not particularly limited as long as the photopolymerization initiator has a function of initiating polymerization of the polymerizable compound, and can be appropriately selected from known photopolymerization initiators. For example, photopolymerization initiators sensitive to light rays in a range from ultraviolet region to visible light are preferable. In addition, the photopolymerization initiator may be either an activator which interacts with a photo-excited sensitizer in any way and generates active radicals or an initiator which initiates cationic polymerization according to the type of monomer.

In addition, it is preferable that the photopolymerization initiator contains at least one kind of compound having at least a molar light absorption coefficient of about 50 in a range of about 300 nm to 800 nm (more preferably 330 nm to 500 nm).

Examples of the photopolymerization initiator include halogenated hydrocarbon derivatives (for example, a derivative having a triazine skeleton, and a derivative having an oxadiazole skeleton), acyl phosphine compounds such as acyl phosphine oxide, biimidazole compounds (for example, hexaaryl biimidazole), oxime compounds such as oxime derivatives, organic peroxides, thio compounds, ketone compounds, aromatic onium salts, ketoxime ethers, aminoacetophenone compounds, and hydroxyacetophenone, and the oxime compounds are preferable.

The biimidazole-based compound is not limited in its structure as long as it is a dimer of an imidazole ring having substitutions with three aryl groups, but it is particularly preferably a compound having a structure represented by the following General Formula (II) or (III).

(II)

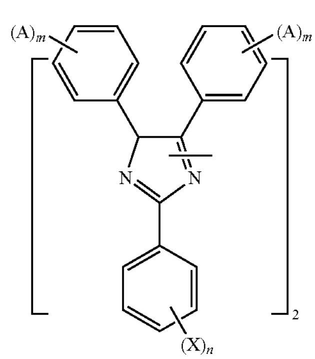

In General Formula (II), X represents a hydrogen atom, a halogen atom, a cyano group, an alkyl group having 1 to 4 carbon atoms, or an aryl group having 6 to 9 carbon atoms, A's each represent a substituted or unsubstituted alkoxy group having 1 to 12 carbon atoms, or —COO—$R^9$ (in which $R^9$ represents an alkyl group having 1 to 4 carbon atoms or an aryl group having 6 to 9 carbon atoms), n is an integer of 1 to 3, and m is an integer of 1 to 3.

(III)

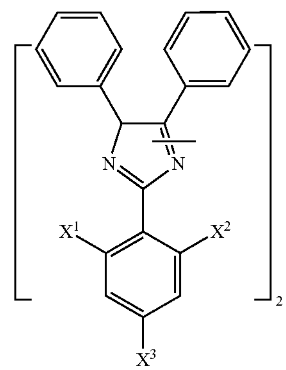

In General Formula (III), $X^1$, $X^2$, and $X^3$ each independently represent a hydrogen atom, a halogen atom, a cyano group, an alkyl group having 1 to 4 carbon atoms or an aryl group having 6 to 9 carbon atoms. However, there is no case where two or more of $X^1$, $X^2$ and $X^3$ simultaneously represent a hydrogen atom.

Examples of the biimidazole-based compound include the compounds described in paragraph Nos. 0072 to 0075 of JP2013-209623A, the contents of which are hereby incorporated by reference.

Among those, particularly preferred examples of the compound include 2,2'-bis(2-chlorophenyl)-4,4',5,5'-tetraphenylbiimidazole (commercially available products thereof include B-CIM, manufactured by Hodogaya Chemical Co., Ltd.), 2,2'-bis(o-chlorophenyl)-4,4',5,5'-tetra-(3,4-dimethoxyphenyl)biimidazole (HABI1311, DHSH Japan), 2,2'-bis(2-methylphenyl)-4,4',5,5'-tetraphenylbiimidazole (commercially available from Kurogane Kasei Co., Ltd.).

Furthermore, from the viewpoint of exposure sensitivity, the compound is preferably a compound selected from a group consisting of a trihalomethyl triazine compound, a benzyl dimethyl ketal compound, an α-hydroxyketone compound, an α-aminoketone compound, an acyl phosphine compound, a phosphine oxide compound, a metallocene compound, an oxime compound, a triallyl imidazole dimer, an onium compound, a benzothiazole compound, a benzophenone compound, an acetophenone compound and a derivative thereof, a cyclopentadiene-benzene-iron complex and a salt thereof, a halomethyl oxadiazole compound, and a 3-aryl-substituted coumarin compound.

The compound is more preferably a trihalomethyl triazine compound, an α-aminoketone compound, an acyl phosphine compound, a phosphine oxide compound, an oxime compound, a triallylimidazole dimer, a triarylimidazole compound, a benzoimidazole compound, an onium compound, a benzophenone compound, or an acetophenone compound, and particularly preferably at least one kind of compound selected from a group consisting of a trihalomethyl triazine compound, an α-aminoketone compound, an oxime compound, a triallylimidazole compound, a benzophenone compound, a triarylimidazole compound, and a benzoimidazole compound. In addition, the triarylimidazole compound may be a mixture thereof with benzoimidazole.

Specifically, the trihalomethyltriazine compound is exemplified as follows. Incidentally, Ph is a phenyl group.

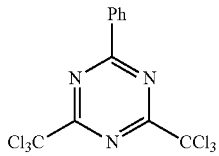

As the triarylimidazole compound and the benzoimidazole compound, the following compounds are exemplified.

(I-6a)

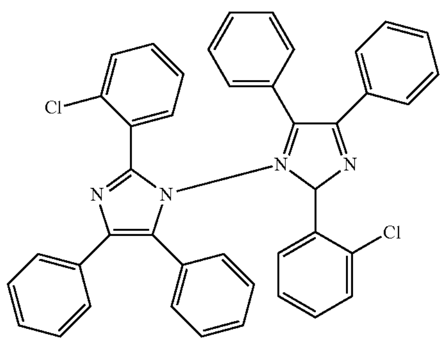

(I-6b)

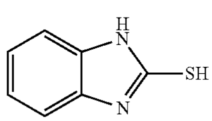

As the trihalomethyltriazine compound, a commercially available product can also be used, and for example, TAZ-107 (manufactured by Midori Kagaku Co., Ltd.) can also be used.

In particular, in the case where the coloring composition of the present invention is used for the manufacture of a color filter for a solid-state imaging device, a fine pattern needs to be formed in a sharp shape. Accordingly, it is important that the coloring composition has curability and is developed without residues in an unexposed area. From this viewpoint, an oxime compound is particularly preferable as a polymerization initiator. In particular, in the case where a fine pattern is formed in the solid-state imaging device, stepper exposure is used for exposure for curing. However, the exposure machine used at this time is damaged by halogen in some cases, so it is necessary to reduce the amount of a polymerization initiator added. In consideration of this point, in order to form a fine pattern as in a solid-state imaging device, it is particularly preferable to use an oxime compound as the photopolymerization initiator.

Examples of the halogenated hydrocarbon compound having a triazine skeleton include the compounds described in Wakabayashi, et al., Bull. Chem. Soc. Japan, 42, 2924 (1969), the compounds described in UK1388492B, the compounds described in JP1978-133428A (JP-S53-133428A), the compounds described in GE3337024B, the compound described in F. C. Schaefer, et al., J. Org. Chem.; 29, 1527 (1964), the compounds described in JP1987-58241A (JP-S62-58241A), the compounds described in JP1993-281728A (JP-H05-281728A), the compounds described in JP1993-34920A (JP-H05-34920A), and the compounds described in U.S. Pat. No. 4,212,976A, in particular, the compounds described in paragraph No. 0075 of JP2013-077009A.

In addition, as photopolymerization initiators other than those above, acridine derivatives are exemplified. Specific examples thereof include the compound described in paragraph No. 0076 of JP2013-077009A, the contents of which are hereby incorporated by reference.

Examples of the ketone compound include the compound described in paragraph No. 0077 of JP2013-077009A, the contents of which are hereby incorporated by reference.

As the photopolymerization initiator, a hydroxyacetophenone compound, an aminoacetophenone compound, and an acyl phosphine compound can also be suitably used. More specifically, for example, the aminoacetophenone-based initiator described in JP1998-291969A (JP-H10-291969A), and the acyl phosphine oxide-based initiator described in JP4225898B can also be used.

As the hydroxyacetophenone-based initiator, IRGACURE-184, DAROCUR-1173, IRGACURE-500, IRGACURE-2959, and IRGACURE-127 (trade names, all manufactured by BASF) can be used. As the aminoacetophenone-based initiator, IRGACURE-907, IRGACURE-369, and IRGACURE-379 (trade names, all manufactured by BASF) which are commercially available products can be used. In addition, as the aminoacetophenone-based initiator, the compound described in JP2009-191179A, of which an absorption wavelength matches a light source of a long wavelength of 365 nm, 405 nm, or the like, can be used. Moreover, as the acyl phosphine-based initiator, IRGACURE-819 or DAROCUR-TPO (trade name, both manufactured by BASF) which are commercially available products can be used.

Examples of the photopolymerization initiator more preferably include oxime compounds. Specific examples of the oxime compounds include the compound described in JP2001-233842A, the compound described in JP2000-80068A, and the compound described in JP2006-342166A, WO02/100903A1, and the like.

Specific examples thereof include, but are not limited to, 2-(O-benzoyloxime)-1-[4-(phenylthio)phenyl]-1,2-butanedione, 2-(O-benzoyloxime)-1-[4-(phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-heptanedione, 2-(O-benzoyloxime)-1-[4-(phenylthio)phenyl]-1,2-octanedione, 2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(O-acetyloxime)-1-[9-ethyl-6-(2-methylbenzoyl)-9H-carbazol-3-yl]ethanone, 1-(O-acetyloxime)-1-[9-methyl-6-(2-methylbenzoyl)-9H-carbazol-3-yl]ethanone, 1-(O-acetyloxime)-1-[9-propyl-6-(2-methylbenzoyl)-9H-carbazol-3-yl]ethanone, 1-(O-acetyloxime)-1-[9-ethyl-6-(2-ethylbenzoyl)-9H-carbazol-3-yl]ethanone, 1-(O-acetyloxime)-1-[9-ethyl-6-(2-butylbenzoyl)-9H-carbazol-3-yl]ethanone, 2-(benzoyloxyimino)-1-[4-(phenylthio)phenyl]-1-octanone, and 2-(acetoxyimino)-4-(4-chlorophenylthio)-1-[9-ethyl-6-(2-methylbenzoyl)-9H-carbazol-3-yl]-1-butanone. As the commercially available product, IRGACURE-OXE01 (manufactured by BASF), IRGACURE-OXE02 (manufactured by BASF), or TR-PBG-304, (manufactured by Changzhou Tronly New Electronic Materials CO., LTD.) are also suitably used.

Furthermore, as oxime compounds other than the above, the compound described in JP2009-519904A in which oxime is linked to an N-position of carbazole, the compound described in U.S. Pat. No. 7,626,957B in which a hetero-substituent is introduced into a benzophenone moiety, the compounds described in JP2010-15025A and US2009/292039A in which a nitro group is introduced into a colorant moiety, the ketoxime compound described in WO2009/131189A, the compound described in U.S. Pat. No. 7,556,910B which contains a triazine skeleton and an oxime skeleton in the same molecule, the compound described in JP2009-221114A, which has maximum absorption at 405 nm and has excellent sensitivity to a light source of a g-ray, and the like may be used.

In addition, the cyclic oxime compounds described in JP2007-231000A and JP2007-322744A can also be suitably used. Among the cyclic oxime compounds, the cyclic oxime compounds ring-fused to a carbazole colorant, which are described in JP2010-32985A and JP2010-185072A, are preferable from the viewpoint of high sensitivity since these compounds have high light absorptivity.

Incidentally, the compound described in JP2009-242469A, which is an oxime compound having an unsaturated bond in a specific moiety, can also be suitably used since this compound makes it possible to improve sensitivity by reproducing active radicals from polymerization-inactive radicals.

Particularly preferred examples of the oxime compounds include the oxime compound having a specific substituent described in JP2007-269779A and the oxime compound having a thiaryl group described in JP2009-191061A.

Specifically, the oxime compound which is a photopolymerization initiator is preferably a compound represented by the following General Formula (OX-1). Incidentally, the compound may be an oxime compound in which an N—O bond of oxime forms an (E) isomer, an oxime compound in which the N—O bond forms a (Z) isomer, or a mixture in which the N—O bond forms a mixture of an (E) isomer and a (Z) isomer.

(OX-1)

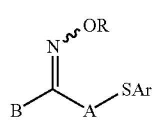

In General Formula (OX-1), R and B each independently represent a monovalent substituent, A represents a divalent organic group, and Ar represents an aryl group.

In General Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. Moreover, the substituents may be further substituted with other substituents.

Examples of the substituents include a halogen atom, an aryloxy group, an alkoxycarbonyl or aryloxycarbonyl group, an acyloxy group, an acyl group, an alkyl group, and an aryl group.

Specific examples (C-4) to (C-13) of the oxime compound which are suitably used are shown below, but the present invention is not limited thereto.

(C-4)

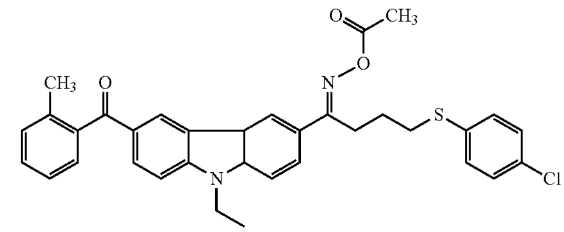

(C-5)

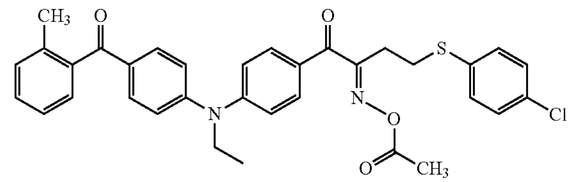

(C-6)

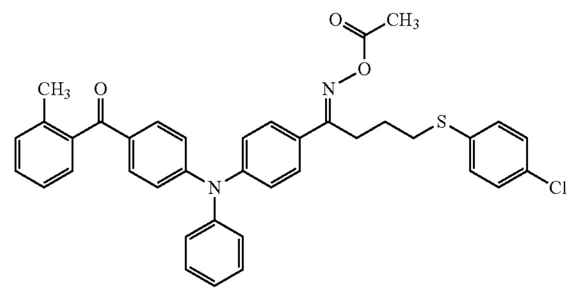

(C-7)

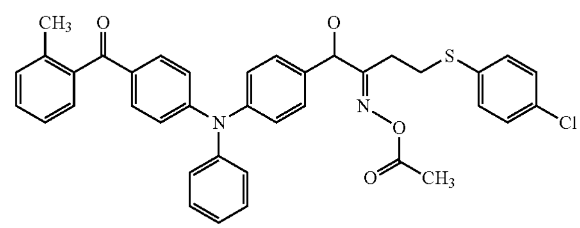

(C-8)

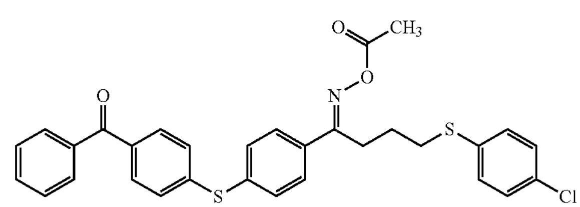

(C-9)

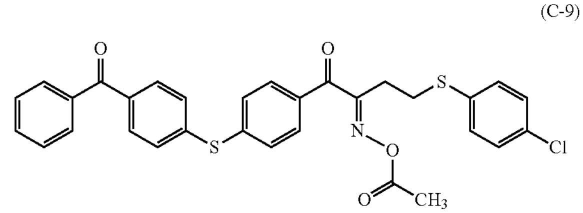

-continued (C-10)

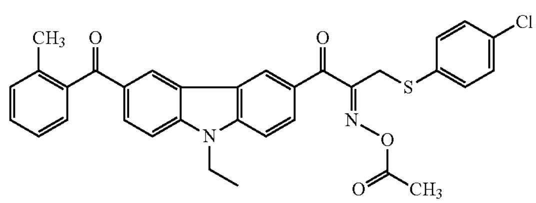

(C-11)

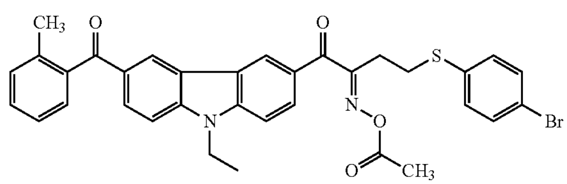

(C-12)

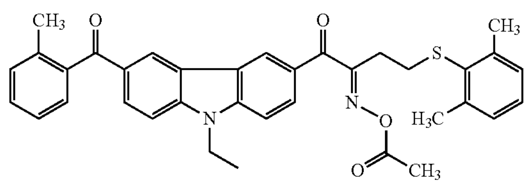

(C-13)

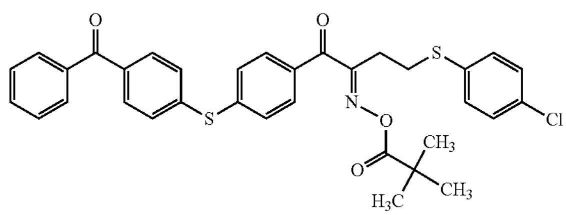

The oxime compound has a maximum absorption wavelength in a wavelength region of 350 nm to 500 nm and preferably has an absorption wavelength in a wavelength region of 360 nm to 480 nm, and an oxime compound showing a high absorbance at 365 nm and 455 nm is particularly preferable.

From the viewpoint of sensitivity, the molar light absorption coefficient at 365 nm or 405 nm of the oxime compound is preferably 1,000 to 300,000, and more preferably 2,000 to 300,000, and particularly preferably 5,000 to 200,000.

The molar light absorption coefficient of the compound can be measured using a known method, but specifically, it is preferable to measure the molar light absorption coefficient by means of, for example, a UV-visiblespectrophotometer (Cary-5spectrophotometer manufactured by Varian) by using an ethyl acetate solvent at a concentration of 0.01 g/L.

In the case where the coloring composition of the present invention contains the photopolymerization initiator, the content of the photopolymerization initiator is preferably from 0.1% by mass to 50% by mass, more preferably from 0.5% by mass to 30% by mass, and still more preferably from 1% by mass to 20% by mass, with respect to the total solid contents of the coloring composition. Within this range, improved sensitivity and pattern formability are obtained.

The composition of the present invention may include one kind or two or more kinds of photopolymerization initiator. In the case where the composition includes two or more kinds of the photopolymerization initiator, the total amount thereof is preferably within the range.

<Sensitizer>

The coloring composition of the present invention may include a sensitizer. The sensitizer is not particularly limited, and examples thereof include a mercaptan-based sensitizer and an amine-based sensitizer. Examples of the mercaptan-based sensitizer include 2-mercaptobenzothiazole, 2-mercaptobenzoxazole, 2-mercaptobenzoimidazole, 2,5-dimercapto-1,3,4-thiadiazole, and 2-mercapto-2,5-dimethylaminopyridine.

Examples of the amine-based sensitizer include benzophenone, Michler's ketone, 4,4'-bis(diethylamino)benzophenone, xanthone, thioxanthone, isopropylxanthone, 2,4-diethylthioxanthone, 2-ethylanthraquinone, acetophenone, 2-hydroxy-2-methylpropiophenone, 2-hydroxy-2-methyl-4'-isopropylpropiophenone, 1-hydroxycyclohexyl phenyl ketone, isopropylbenzoin ether, isobutylbenzoin ether, 2,2-diethoxyacetophenone, 2,2-dimethoxy-2-phenylacetophenone, benzyl, camphorquinone, benzanthrone, 2-methyl-1-[4-(methylthio)phenyl]-2-morpholinopropan-1-one, ethyl 2-benzyl-2-dimethylamino-1-(4-morpholinophenyl)-butanone-1,4-dimethylaminobenzoate, isoamyl 4-dimethylaminobenzoate, 3,4,4'-tri(t-butylperoxycarbonyl)benzophenone, 3,5,4'-tri(t-butylperoxycarbonyl)benzophenone, 3,4,5-tri(t-butylperoxycarbonyl)benzophenone, 2,3,4-tri(t-butylperoxycarbonyl)benzophenone, 3,4,4'-tri(t-amylperoxycarbonyl)benzophenone, 3,4,4'-tri(t-hexylperoxycarbonyl)benzophenone, 3,4,4'-tri(t-octylperoxycarbonyl)benzophenone, 3,3,4'-tri(t-cumylperoxycarbonyl)benzophenone, 4-methoxy-2',4'-di(t-butylperoxycarbonyl)benzophenone, 3-methoxy-2',4'-di(t-butylperoxycarbonyl)benzophenone, 2-methoxy-2',4'-di(t-butylperoxycarbonyl)benzophenone, 4-ethoxy-2',4'-di(t-butylperoxycarbonyl)benzophenone, 3,3',4,4'-tetra(t-butylperoxycarbonyl)benzophenone, 3,3',4,4'-tetra(t-hexylperoxycarbonyl)benzophenone, 2,4,6-trimethylbenzoyl-diphenylphosphine oxide, 2,4,6-trimethylbenzoyl-phenylphosphinic acid methyl ester, 2,4,6-trimethylbenzoyl-phenylphosphinic acid ethyl ester, 2,4-dichlorobenzoyl-diphenylphosphine oxide, 2,6-dichlorobenzoyl-diphenylphosphine oxide, 2,3,5,6-tetramethylbenzoyl-diphenylphosphine oxide, 3,4-dimethylbenzoyl-diphenylphosphine oxide, bis(2,4,6-trimethylbenzoyl)-phenylphosphine oxide, bis(2,6-dimethoxybenzoyl)-2,4,4-trimethyl-pentylphosphine oxide, 4-[p-N,N-di(ethoxycarbonylmethyl)]-2,6-di(trichloromethyl)-s-triazine, 1,3-bis(trichloromethyl)-5-(2'-chlorophenyl)-s-triazine, and 1,3-bis(trichloromethyl)-5-(4'-methoxyphenyl)-s-triazine.

The content of the sensitizer is preferably 0.1% by mass to 50% by mass, and more preferably 0.5% by mass to 40% by mass, with respect to the blending amount of the photopolymerization initiator. The sensitizer may be used singly or in combination of two or more kinds thereof. In the case where the coloring composition includes two or more kinds of sensitizer, the total amount thereof is preferably within the range.

<Pigment>

The coloring composition of the present invention may include a coloring agent other than the colorant compound represented by General Formula (1). Specifically, the coloring composition preferably contains a pigment.

As the pigment used in the present invention, various inorganic or organic pigments known in the related art can be used, and the organic pigments are preferably used. As the pigment, one having a high transmittance is preferable.

Examples of the inorganic pigment include metal compounds represented by a metal oxide, a metal complex salt, or the like, and specific examples thereof include metal oxides of iron, cobalt, aluminum, cadmium, lead, copper, titanium, magnesium, chromium, zinc, antimony, and the like, and complex oxides of the metals.

Examples of the organic pigment include:

C. I. Pigment Yellow 11, 24, 31, 53, 83, 93, 99, 108, 109, 110, 138, 139, 147, 150, 151, 154, 155, 167, 180, 185, 199;

C. I. Pigment Orange 36, 38, 43, 71;

C. I. Pigment Red 81, 105, 122, 149, 150, 155, 171, 175, 176, 177, 209, 220, 224, 242, 254, 255, 264, 270;

C. I. Pigment Violet 19, 23, 32, 39;

C. I. Pigment Blue 1, 2, 15, 15:1, 15:3, 15:6, 16, 22, 60, 66;

C. I. Pigment Green 7, 36, 37, 58;

C. I. Pigment Brown 25, 28; and

C. I. Pigment Black 1.

Examples of the pigment which can be preferably used in the present invention include the following ones, but the present invention is not limited thereto:

C. I. Pigment Yellow 11, 24, 108, 109, 110, 138, 139, 150, 151, 154, 167, 180, 185, C. I. Pigment Orange 36, 71;

C. I. Pigment Red 122, 150, 171, 175, 177, 209, 224, 242, 254, 255, 264,

C. I. Pigment Violet 19, 23, 32,

C. I. Pigment Blue 15:1, 15:3, 15:6, 16, 22, 60, 66,

C. I. Pigment Green 7, 36, 37, 58, and

C. I. Pigment Black 1.

These organic pigments can be used singly or in various combinations for spectral adjustment or improvement of color purity. Specific examples of the combination are shown below. For example, as a red pigment, an anthraquinone-based pigment, a perylene-based pigment, or a diketopyrrolopyrrole-based pigment can be used singly or as a mixture of at least one kind of these with a disazo-based yellow pigment, an isoindoline-based yellow pigment, a quinophthalone-based yellow pigment, or a perylene-based red pigment. Examples of the anthraquinone-based pigment include C. I. Pigment Red 177, examples of the perylene-based pigment include C. I. Pigment Red 155, and C. I. Pigment Red 224, and examples of the diketopyrrolopyrrole-based pigment include C. I. Pigment Red 254. In view of chromatic resolving properties, a mixture of the above pigment with C. I. Pigment Yellow 139 is preferable. The mass ratio between the red pigment and the yellow pigment is preferably 100:5 to 100:50. If the mass ratio is 100:4 or less, it is difficult to reduce the light transmittance at 400 nm to 500 nm, and if it is 100:51 or more, a dominant wavelength moves closer to a short wavelength, so a color separating power cannot be improved in some cases. In particular, the mass ratio is optimally in a range of 100:10 to 100:30. In addition, in the case of a combination of red pigments, the mass ratio can be adjusted according to the required spectrum.

In addition, as a green pigment, a halogenated phthalocyanine-based pigment can be used singly or as a mixture of this pigment with a disazo-based yellow pigment, a quinophthalone-based yellow pigment, an azomethine-based yellow pigment, or an isoindoline-based yellow pigment. As an example of such pigments, a mixture of C. I. Pigment Green 7, 36, or 37 with C. I. Pigment Yellow 83, C. I. Pigment Yellow 138, C. I. Pigment Yellow 139, C. I. Pigment Yellow 150, C. I. Pigment Yellow 180, or C. I. Pigment Yellow 185 is preferable. The mass ratio between the green pigment and the yellow pigment is preferably 100:5 to 100:150. The mass ratio is particularly preferably in a range of 100:30 to 100:120.

As a blue pigment, a phthalocyanine-based pigment can be used singly or as a mixture of this pigment with a dioxazine-based violet pigment. For example, a mixture of C. I. Pigment Blue 15:6 with C. I. Pigment Violet 23 is preferable. The mass ratio between the blue pigment and the violet pigment is preferably 100:0 to 100:100 and more preferably 100:10 or less.

Moreover, as a pigment for a black matrix, carbon, titanium black, iron oxide, or titanium oxide may be used singly or as a mixture, and a combination of carbon with titanium black is preferable. The mass ratio between carbon and titanium black is preferably in a rage of 100:0 to 100:60.

For the coloring composition of the present invention, it is preferable to blend pigments other than black one, which is suitable for a blue pigment.

In the case where the coloring composition is used for a color filter, the primary particle size of the pigment is preferably 100 nm or less from the viewpoint of color unevenness or contrast. From the viewpoint of dispersion stability, the primary particle size is preferably 5 nm or more. The primary particle size of the pigment is more preferably 5 nm to 75 nm, still more preferably 5 nm to 55 nm, and particularly preferably 5 nm to 35 nm.

The primary particle size of the pigment can be measured by a known method such as electron microscopy.

Among these, the pigment is preferably a pigment selected from an anthraquinone pigment, a diketopyrrolopyrrole pigment, a phthalocyanine pigment, a quinophthalone pigment, an isoindoline pigment, an azomethine pigment, and a dioxazine pigment. In particular, C. I. Pigment Red 177 (anthraquinone pigment), C. I. Pigment Red 254 (diketopyrrolopyrrole pigment), C. I. Pigment Green 7, 36, 58, C. I. Pigment Blue 15:6 (phthalocyanine pigment), C. I. Pigment Yellow 138 (quinophthalone pigment), C. I. Pigment Yellow 139, 185 (isoindoline pigments), C. I. Pigment Yellow 150 (azomethine pigment), and C. I. Pigment Violet 23 (dioxazine pigment) are particularly preferable.

The content of the pigment is preferably 10% by mass to 70% by mass, more preferably 20% by mass to 60% by mass, and still more preferably 25% by mass to 50% by mass, with respect to the total amount of components excluding a solvent, contained in the coloring composition.

The composition of the present invention may include one kind or two or more kinds of pigment. In the case where the composition includes two or more kinds of pigment, the total amount thereof is preferably within the range.

<Pigment Dispersant>

In the case where the coloring composition of the present invention has a pigment, a pigment dispersant can be used in combination with other components, as desired.

Examples of the pigment dispersant which can be used in the present invention include polymer dispersants [for example, a polyamide amine and a salt thereof, a polycarboxylic acid and a salt thereof, a high-molecular-weight unsaturated acid ester, a modified polyurethane, a modified polyester, a modified poly(meth)acrylate, a (meth)acrylic copolymer, and a naphthalene sulfonate formalin condensate], surfactants such as a polyoxyethylene alkyl phosphoric ester, a polyoxyethylene alkylamine, and an alkanolamine; and pigment derivatives.

The polymer dispersants can be further classified into linear polymers, terminal-modified polymers, graft polymers, and block polymers, according to the structure.

Examples of the terminal-modified polymers which has a moiety anchored to the pigment surface include a polymer having a phosphoric acid group in the terminal as described in JP1991-112992A (JP-H03-112992A), JP2003-533455A, and the like, a polymer having a sulfonic acid group in the terminal as described in JP2002-273191A, a polymer having a partial skeleton or a heterocycle of an organic colorant as described in JP1997-77994A (JP-H09-77994A), and the like. Moreover, a polymer obtained by introducing two or more moieties (acid groups, basic groups, partial skeletons of an organic colorant, heterocycles, or the like) anchored to the pigment surface into a polymer terminal as described in JP2007-277514A is also preferable since this polymer is excellent in dispersion stability.

Examples of the graft polymers having a moiety anchored to the pigment surface include polyester-based dispersant and the like, and specific examples thereof include a product of a reaction between a poly(lower alkylenimine) and a polyester, which is described in JP1979-37082A (JP-S54-37082A), JP1996-507960A (JP-H08-507960A), JP2009-258668A, and the like, a product of a reaction between a polyallylamine and a polyester, which is described in JP1997-169821A (JP-H09-169821A) and the like, a copolymer of a macromonomer and a nitrogen atom monomer, which is described in JP1998-339949A (JP-H10-339949A), JP2004-37986A, WO2010/110491A, and the like, a graft polymer having a partial skeleton or a heterocycle of an organic colorant, which is described in JP2003-238837A, JP2008-9426A, JP2008-81732A, and the like, and a copolymer of a macromonomer and an acid group-containing monomer, which is described in JP2010-106268A, and the like. From the viewpoint of dispersibility of a pigment dispersion, dispersion stability, and developability which a coloring composition using the pigment exhibits, an amphoteric dispersion resin having basic and acid groups, which is described in JP2009-203462A, is particularly preferable.

As the macromonomer used in production of a graft polymer having a moiety anchored to the pigment surface by radical polymerization, known macromonomers can be used. Examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile which has a methacryloyl group as a terminal group), and AB-6 (polybutyl acrylate having a methacryloyl group as a terminal group) manufactured by TOAGOSEI, CO., LTD.; Placcel FM 5 (a product obtained by adding 5 molar equivalents of ϵ-caprolactone to 2-hydroxyethyl methacrylate) and FA10L (a product obtained by adding 10 molar equivalents of ϵ-caprolactone to 2-hydroxyethyl acrylate) manufactured by DAICEL Corporation; a polyester-based macromonomer described in JP1990-272009A (JP-H02-272009A), and the like. Among these, from the viewpoint of dispersibility of the pigment, dispersion stability, and the developability which the coloring composition using the pigment dispersion exhibits, the polyester-based macromonomer excellent in flexibility and solvent compatibility is particularly preferable. Further, a polyester-based macromonomer represented by the polyester-based macromonomer described in JP1990-272009A (JP-H02-272009A) is particularly preferable.

As the block polymer having a moiety anchored to the pigment surface, block polymers described in JP2003-49110A, JP2009-52010A, and the like are preferable.

The pigment dispersants which can be used in the present invention can be obtained in the form of commercially available products, and specific examples thereof include "DA-7301" manufactured by Kusumoto Chemicals, Ltd., "Disperbyk-101 (polyamidamine phosphate), 107 (carboxylic ester), 110, 111 (copolymer including an acid group), 130 (polyamide), 161, 162, 163, 164, 165, 166, and 170 (polymeric copolymer)", and "BYK-P104 and P105 (high-molecular-weight unsaturated polycarboxylic acid)", manufactured by BYK-Chemie, "EFKA 4047, 4050~4010~4165 (polyurethane-based dispersant), EFKA 4330 to 4340 (block copolymer), 4400 to 4402 (modified polyacrylate), 5010 (polyesteramide), 5765 (high-molecular-weight polycarboxylate), 6220 (aliphatic polyester), 6745 (phthalocyanine derivative), and 6750 (azo pigment derivative)" manufactured by EFKA, "Ajisper PB821, PB822, PB880, and PB881" manufactured by Ajinomoto Fine-Techno Co., Inc., "Flowlen TG-710 (urethane oligomer)" and "Polyflow No. 50E, No. 300 (acrylic copolymer), manufactured by KYOEISHA CHEMICAL CO., LTD., "Disparlon KS-860, 873SN, 874, #2150 (aliphatic polyvalent carboxylic acid), #7004 (polyether ester), DA-703-50, DA-705, and DA-725", manufactured by Kusumoto Chemicals, Ltd., "Demol RN, N (naphthalene sulfonate formaldehyde condensate), MS, C, SN-B (aromatic sulfonate formaldehyde condensate)", "Homogenol L-18 (polymeric polycarboxylic acid), "Emulgen 920, 930, 935, and 985 (polyoxyethylene nonyl phenyl ether)", and "Acetamine 86 (stearylamine acetate)", manufactured by Kao Corporation, "Solsperse 5000 (phthalocyanine derivative), 22000 (azo pigment derivative), 13240 (polyesteramine), 3000, 17000, and 27000 (polymers having a functional portion in the terminal portion), and 24000, 28000, 32000, and 38500 (graft polymers)", manufactured by Lubrizol Japan Ltd., "Nikkol T106 (polyoxyethylene sorbitan monooleate) and MYS-IEX (polyoxyethylene monostearate)" manufactured by NIKKO CHEMICALS Co., Ltd., "HINOACT T-8000E" and the like manufactured by Kawaken Fine Chemicals Co., Ltd., "organosiloxane polymer KP341" manufactured by Shin-Etsu Chemical Co., Ltd., cationic surfactants such as "W001" manufactured by Yusho Co., Ltd., nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan aliphatic ester, and anionic surfactants such as "W004, W005, and W017", "EFKA-46, EFKA-47, EFKA-47EA, EFKA polymer 100, EFKA polymer 400, EFKA polymer 401, and EFKA polymer 450" manufactured by MORISHITA SANGYO Corporation, polymer dispersants such as "Disperse aid 6, Disperse aid 8, Disperse aid 15, and Disperse aid 9100" manufactured by SAN NOPCO Ltd., "Adeka Pluronic L31, F38, L42, L44, L61, L64, F68, L72, P95, F77, P84, F87, P94, L101, P103, F108, L121, and P-123" manufactured by ADEKA Corporation, and "Ionet (trade name) S-20" manufactured by Sanyo Chemical Industries, Ltd.

These pigment dispersants may be used singly or in combination of two or more kinds thereof. In the present invention, it is particularly preferable to use a combination of a pigment derivative and a polymer dispersant. Further, the pigment dispersant may be used in combination with an alkali-soluble resin, together with a terminal-modified polymer having a moiety anchored to the pigment surface, a graft polymer, or a block polymer. Examples of the alkali-soluble resin include a (meth)acrylic acid copolymer, an itaconic acid copolymer, a crotonic acid copolymer, a maleic acid copolymer, a partially esterified maleic acid copolymer, and an acidic cellulose derivative having a carboxylic acid in a side chain, and a (meth)acrylic acid copolymer is particularly preferable. In addition, the N-position-substituted maleimide monomers copolymer described in JP1998-300922A (JP-H10-300922A), the ether dimer copolymers described in JP2004-300204A, and the alkali-soluble resins containing a polymerizable group described in JP1995-319161A (JP-H07-319161A) are also preferable. Specifically, alkali-soluble resins: a benzyl methacrylate/methacrylic acid/2-hydroxyethyl methacrylate copolymer is exemplified.

In the case where the coloring composition contains a pigment dispersant, the total content of the pigment dispersant in the coloring composition is preferably 1 part by mass to 80 parts by mass, more preferably 5 parts by mass to 70 parts by mass, and still more preferably 10 parts by mass to 60 parts by mass, with respect to 100 parts by mass of the pigment. The content of the specific dispersed resin in the dispersant components contained in the coloring composition is preferably 50% by mass or more, more preferably 60% by mass or more, and still more preferably 70% by mass or more.

The composition of the present invention may include one kind or two or more kinds of pigment dispersant. In the case where the composition includes two or more kinds of the pigment dispersant, the total amount thereof is preferably within the range.

Specifically, in the case where a polymer dispersant is used, the amount of the polymer dispersant used is preferably 5 parts by mass to 100 parts by mass, and more preferably 10 parts by mass to 80 parts by mass, with respect to 100 parts by mass of the pigment.

Moreover, in the case where a pigment derivative is used in combination with other components, the amount of the pigment derivative used is preferably 1 part by mass to 30 parts by mass, more preferably 3 parts by mass to 20 parts by mass, and particularly preferably 5 parts by mass to 15 parts by mass, with respect to 100 parts by mass of the pigment.

In the coloring composition, from the viewpoint of curing sensitivity and color density, the total content of the coloring agent components and the dispersant components is preferably 50% by mass to 90% by mass, more preferably 55% by mass to 85% by mass, and still more preferably 60% by mass to 80% by mass, with respect to the total solid contents constituting the coloring composition.

Moreover, in the present invention, a dye other than the colorant compound represented by General Formula (1) may be included. For example, the colorants disclosed in JP1989-90403A (JP-S64-90403A), JP1989-91102A (JP-S64-91102A), JP1989-94301A (JP-H01-94301A), JP1994-11614A (JP-H06-11614A), JP2592207B, U.S. Pat. No. 4,808,501A, U.S. Pat. No. 5,667,920A, US505950A, JP1993-333207A (JP-H05-333207A), JP1994-35183A (JP-H06-35183A), JP1994-51115A (JP-H06-51115A), JP1994-194828A (JP-H06-194828A), and the like can be used. In terms of the chemical structure, a pyrazoleazo-based dye, an anilinoazo-based dye, a triphenylmethane-based dye, an anthraquinone-based dye, a benzylidene-based dye, an oxonol-based dye, a pyrazolotriazole azo-based dye, a pyridine azo-based dye, a cyanine-based dye, a phenothiazine-based dye, an pyrrolopyrazole azomethane-based dye, or the like can be used.

<Other Components>

The coloring composition of the present invention may further contain other components such as a polymerization inhibitor, a surfactant, an organic carboxylic acid, and an organic carboxylic anhydride, in addition to the respective components as described above, within a range which does not diminish the effects of the present invention.

<<Polymerization Inhibitor>>

It is preferable to add a small amount of a polymerization inhibitor to the coloring composition of the present invention in order to suppress the occurrence of unnecessary thermal polymerization of the polymerizable compound during production or storage of the coloring composition.

Examples of the polymerization inhibitor which can be used in the present invention include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and a cerium (III) salt of N-nitrosophenyl hydroxylamine.

In the case where the coloring composition of the present invention contains a polymerization inhibitor, the amount of the polymerization inhibitor added is preferably about 0.01% by mass to about 5% by mass, with respect to the total mass of the composition.

The composition of the present invention may include one kind or two or more kinds of polymerization inhibitor. In the case where the composition includes two or more kinds of the polymerization inhibitor, the total amount thereof is preferably within the range.

<<Surfactant>>

From the viewpoint of further improving coatability, various surfactants may be added to the coloring composition of the present invention. As the surfactants, it is possible to use various surfactants such as a fluorine-based surfactant, a nonionic surfactant, a cationic surfactant, an anionic surfactant, and a silicone-based surfactant.

In particular, if the coloring composition of the present invention contains a fluorine-based surfactant, liquid characteristics (particularly, fluidity) are further improved when the composition is prepared as a coating liquid, whereby evenness of the coating thickness or liquid saving properties can be further improved.

That is, in the case where a coating liquid obtained by applying the coloring composition containing a fluorine-based surfactant is used to form a film, the surface tension between a surface to be coated and the coating liquid is reduced to improve wettability with respect to the surface to be coated, and enhance coatability with respect to the surface to be coated. Therefore, even in the case where a thin film of about several μm is formed of a small amount of liquid, the coloring composition containing a fluorine-based surfactant is effective in that a film with a uniform thickness which exhibits a small extent of thickness unevenness can be more suitably formed.

The fluorine content in the fluorine-based surfactant is preferably 3% by mass to 40% by mass, more preferably 5% by mass to 30% by mass, and particularly preferably 7% by mass to 25% by mass. The fluorine-based surfactant in which the fluorine content is within this range is effective in terms of the uniformity of the thickness of the coated film or liquid saving properties, and the solubility of the surfactant in the coloring composition is also good.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACER30, MEGAFACE F437, MEGAFACE F475, MEGAFACE F479, MEGAFACE F482, MEGAFACE F554, MEGAFACE F780, and MEGAFACE F781 (all manufactured by DIC Corporation); FLUORAD FC430, FLUORADFC431, and FLUORADFC171 (all manufactured by Sumitomo 3M); SURFLON S-382, SURFLON SC-101, SURFLON SC-103, SURFLON SC-104, SURFLON SC-105, SURFLON SC1068, SURFLON SC-381, SURFLON SC-383, SURFLON SC-393, and SURFLON KH-40 (all manufactured by ASAHI GLASS Co., Ltd.); and PF636, PF656, PF6320, PF6520, and PF7002 (manufactured by OMNOVA).

As the fluorine-based surfactant, a block polymer can also be used, and specific examples thereof include the compounds described in JP2011-89090A.

Specific examples of the nonionic surfactant include glycerol, trimethylolpropane, trimethylolethane, and ethoxylate and propoxylate thereof (for example, glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (PLURONIC L10, L31, L61, L62, 10R5, 17R2, and 25R2, and Tetronic 304, 701, 704, 901, 904, and 150R1 manufactured by BASF), and SOLSEPERSE 20000 (manufactured by Lubrizol Japan Ltd.).

Specific examples of the cationic surfactant include phthalocyanine derivatives (trade name: EFKA-745 manufactured by MORISHITA SANGYO Corporation), organosiloxane polymer KP341 (manufactured by Shin-Etsu Chemical Co., Ltd.), (meth)acrylic acid-based (co)polymer Polyflow No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.).

Examples of the silicon-based surfactant include "Toray Silicone DC3PA", "Toray Silicone SH7PA", "TORAY SILICONE DC11PA", "TORAY SILICONE SH21PA", "TORAY SILICONE SH28PA", "TORAY SILICONE SH29PA", "TORAY SILICONE SH30PA", and "TORAY SILICONE SH8400", manufactured by Dow Corning Toray, "TSF-4440", "TSF-4300", "TSF-4445", "TSF-4460", and "TSF-4452", manufactured by Momentive Performance Materials Inc., "KP341", "KF6001", and "KF6002", manufactured by Shin-Etsu Silicones, and "BYK307", "BYK323", and "BYK330", manufactured by BYK-Chemie.

In the case where the coloring composition of the present invention contains a surfactant, the amount of the surfactant added is preferably 0.001% by mass to 2.0% by mass and more preferably 0.005% by mass to 1.0% by mass, with respect to the total mass of the coloring composition.

The composition of the present invention may include one kind or two or more kinds of surfactant. In the case where the composition includes two or more kinds of the surfactant, the total amount thereof is preferably within the range.

<<Organic Carboxylic Acid and Organic Carboxylic Anhydride>>

The coloring composition of the present invention may contain an organic carboxylic acid having a molecular weight of 1,000 or less, and/or an organic carboxylic anhydride.

Specific examples of the organic carboxylic acid compound include an aliphatic carboxylic acid and an aromatic carboxylic acid. Examples of the aliphatic carboxylic acid include monocarboxylic acids such as formic acid, acetic acid, propionic acid, butyric acid, valeric acid, pivalic acid, caproic acid, glycolic acid, acrylic acid, and methacrylic acid, dicarboxylic acids such as oxalic acid, malonic acid, succinic acid, glutaric acid, adipic acid, pimelic acid, cyclohexanedicarboxylic acid, cyclohexenedicarboxylic acid, itaconic acid, citraconic acid, maleic acid, and fumaric acid, tricarboxylic acids such as tricarboxylic acid, and aconitic acid, and the like. Examples of the aromatic carboxylic acid include carboxylic acids in which a carboxyl group is directly bonded to a phenyl group such as a benzoic acid and a phthalic acid, and carboxylic acids in which a phenyl group is bonded to a carboxyl group via a carbon bond. Among these, carboxylic acids having a molecular weight of 600 or less, particularly those having a molecular weight of 50 to 500, and specifically, maleic acid, malonic acid, succinic acid, and itaconic acid are preferable.

Examples of the organic carboxylic anhydride include aliphatic carboxylic anhydride and aromatic carboxylic anhydride. Specific examples thereof include aliphatic carboxylic anhydrides such as acetic anhydride, trichloroacetic anhydride, trifluoroacetic anhydride, tetrahydrophthalic anhydride, succinic anhydride, maleic anhydride, citraconic anhydride, itaconic anhydride, glutaric anhydride, 1,2-cyclohexenedicarboxylic anhydride, n-octadecylsuccinic anhydride, and 5-norbornene-2,3-dicarboxylic anhydride. Examples of the aromatic carboxylic anhydride include phthalic anhydride, trimellitic anhydride, pyromellitic anhydride, and naphthalic anhydride. Among these, those having a molecular weight of 600 or less, particularly having a molecular weight of 50 to 500, specifically, for example, maleic anhydride, succinic anhydride, citraconic anhydride, and itaconic anhydride are preferable.

If the coloring composition of the present invention contains an organic carboxylic acid or an organic carboxylic anhydride, the amount of these organic carboxylic acids and/or the organic carboxylic anhydrizdes added is generally in a range of 0.01% by weight to 10% by weight, preferably 0.03% by weight to 5% by weight, and more preferably 0.05% by weight to 3% by weight in the total solid contents.

The composition of the present invention may include one kind or two or more kinds of each of an organic carboxylic acid and/or an organic carboxylic anhydride. In the case where the composition includes two or more kinds of the organic carboxylic acid and/or the organic carboxylic anhydride, the total amount thereof is preferably within the range.

By adding these organic carboxylic acids and/or the organic carboxylic anhydrides having a molecular weight of 1,000 or less, it is possible to further reduce the amount of the residual undissolved substance of the coloring composition while maintaining high pattern adhesiveness.

If desired, various additives such as a filler, an adhesion promoting agent, an antioxidant, an ultraviolet absorbent, and an anti-aggregation agent may be blended into the coloring composition. Examples of these additives include those described in paragraphs 0155 and 0156 of JP2004-295116A, the contents of which are hereby incorporated by reference.

The coloring composition of the present invention can contain the sensitizer or the light stabilizer described in paragraph 0078 of JP2004-295116A, and the thermal polymerization inhibitor described in paragraph 0081 of JP2004-295116A.

The composition of the present invention may include one kind or two or more kinds of each of the components. In the case where the composition includes two or more kinds of each of the components, the total amount thereof is preferably within the range.

<Method for Preparing Coloring Composition>

The coloring composition of the present invention is prepared by mixing the aforementioned components.

Furthermore, when the coloring composition is prepared, the respective components constituting the coloring composition may be mixed together at the same time or mixed together sequentially after being dissolved and dispersed in a solvent. Further, the order of adding the components and the operation conditions during the mixing are not particularly restricted. For example, all the components may be dissolved and dispersed in a solvent at the same time to prepare the composition. Alternatively, if desired, the respective components may be appropriately prepared as two or more solutions or dispersions and mixed at the time of use (at the time of coating) to prepare the composition.

It is preferable that the coloring composition of the present invention is filtered using a filter for the purpose of removing impurities or reducing deficit, for example. Filters that have been used in the related art for filtration use and the like may be used without particular limitation. Examples thereof include filters formed of a fluorine resin such as polytetrafluoroethylene (PTFE), a polyamide-based resin such as Nylon-6 and Nylon-6,6, and a polyolefin resin (including a high density and a ultrahigh molecular weight) such as polyethylene and polypropylene (PP). Among these materials, polypropylene (including high density polypropylene) is preferable.

The pore diameter of the filter is suitably approximately 0.01 μm to 7.0 μm, preferably approximately 0.01 μm to 3.0 μm, and more preferably approximately 0.05 μm to 0.5 μm. By setting the pore diameter to this range, it is possible to reliably remove fine impurities which interfere with preparation of a uniform and smooth coloring composition in a subsequent step.

When a filter is used, other filters may be used in combination therewith. At that time, filter ring at a first filter may be performed only once or two or more times.

In addition, first filters having different pore diameters within the aforementioned range may be combined. As the pore diameter herein, a reference may be made to nominal values of a filter maker. A commercially available filter may be selected from various filters provided by, for example, Pall Corporation, Advantec Toyo Kaisha, Ltd., Nihon Entegris K.K. (former Nippon Microlith Co., Ltd.), Kitz Micro Filter Corporation, or the like.

As a second filter, a filter formed of a material which is the same as the material for the aforementioned first filter and the like can be used.

For example, the filtering at the first filter may be performed with only the liquid dispersion, and the other components may be mixed and then the filtering at the second filter may be performed.

The coloring composition of the present invention is preferably used for forming a colored layer of a color filter. More specifically, since the coloring composition of the present invention can form a cured film having excellent heat resistance and color characteristics, it is suitably used for forming a colored pattern (colored layer) of a color filter. Further, the coloring composition of the present invention can be suitably used for forming a colored pattern of a color filter or the like used in a solid-state imaging device (for example, a CCD and a CMOS), an image display device such as a liquid crystal display (LCD), and an image display device such as an organic EL display device. Further, the coloring composition can also be suitably used in an application of the manufacture of a print ink, an ink jet ink, a coating material, or the like. Among these, the composition can be suitably used in an application of the manufacture of a color filter for a solid-state imaging device such as a CCD and a CMOS.

<Cured Film, Pattern Forming Method, Color Filter, and Method for Manufacturing Color Filter>

Next, the cured film, the pattern forming method, and the color filter in the present invention will be described in detail by an explanation of production methods thereof.

The cured film of the present invention is formed by curing the coloring composition of the present invention. Such a cured film is preferably used in a color filter.

In the pattern forming method of the present invention, the coloring composition of the present invention is applied onto a support to form a coloring composition layer, and an undesired area is removed to form a colored pattern.

The pattern forming method of the present invention can be suitably applied for forming a colored pattern (pixel) included in a color filter.

With the composition of the present invention, a color filter may be produced by forming a pattern using a so-called photolithography method and a pattern may be formed by a dry etching method.

That is, as a first method for manufacturing a color filter of the present, a method for manufacturing a color filter including a step of applying the coloring composition of the present invention onto a support to form a coloring composition layer, a step of patternwise exposing the coloring composition layer, and a step of removing an unexposed area by development to form a colored pattern is exemplified.

Furthermore, as a second method for manufacturing a color filter of the present invention, a method for manufacturing a color filter, including a step of applying the coloring composition of the present invention onto a support to form a coloring composition layer, followed by curing, to form a colored layer, a step of forming a photoresist layer on the colored layer, a step of patterning the photoresist layer by exposure and development to obtain a resist pattern, and a step of dry etching the colored layer using the resist pattern as an etching mask is exemplified.

In the present invention, it is preferable to manufacture the color filter using a photolithography method.

Hereinafter, details of these will be described.

The respective steps in the pattern forming method of the present invention will be described in detail below with reference to the method for manufacturing a color filter for a solid-state imaging device, but the present invention is not limited to this method. Hereinafter, the color filter for a solid-state imaging device may be simply referred to as a "color filter" in some cases.

<<Coloring Composition Layer Forming Step>>

In the coloring composition layer forming step, the coloring composition of the present invention is applied onto a support to form a coloring composition layer.

As the support which can be used in the present step, for example, it is possible to use a substrate for a solid-state imaging device, which is formed by providing an imaging device (light-receiving element) such as a charge coupled device (CCD) or a complementary metal-oxide semiconductor (CMOS) onto a substrate (for example, a silicon substrate).

The colored pattern in the present invention may be formed on the surface (front surface) on which an imaging device is formed or on the surface (back surface) where an imaging device is not formed, of a substrate for a solid-state imaging device.

A light shielding film may be disposed between the colored pattern in a solid-state imaging device or onto the back surface of the substrate for a solid-state imaging device.

In addition, if desired, an undercoat layer may be disposed onto the support in order to improve adhesiveness between the support and the upper layer, prevent diffusion of substances, or planarize the substrate surface. A solvent, an alkali-soluble resin, a polymerizable compound, a polymerization inhibitor, a surfactant, a photopolymerization initiator, or the like can be blended into the undercoat layer, and it is preferable that these respective components are properly selected from the components blended into the aforementioned composition of the present invention.

As the method for applying the coloring composition of the present invention onto the support, various coating methods such as slit coating, ink jet coating, spin coating, cast coating, roll coating, and a screen printing method can be applied.

Drying (prebaking) of the coloring composition layer applied onto the support can be carried out using a hot plate, an oven, or the like at a temperature of 50° C. to 140° C. for 10 seconds to 300 seconds.

<Pattern Forming Step by Photolithography Method>

<<Exposing Step>>

In the exposing step, the coloring composition layer formed in the coloring composition layer forming step is patternwise exposed through a mask having a predetermined mask pattern by using, for example, an exposure device such as a stepper. Thus, a cured film is obtained.

As radiation (light) usable in exposure, particularly, ultraviolet rays such as a g-ray and an i-ray are preferably used (particularly, an i-ray is preferably used). The irradiation dose (exposure dose) is preferably 30 mJ/cm$^2$ to 1,500 mJ/cm$^2$, more preferably 50 mJ/cm$^2$ to 1,000 mJ/cm$^2$, and particularly preferably 80 mJ/cm$^2$ to 500 mJ/cm$^2$.

The film thickness of the cured film (colored film) is preferably 1.0 μm or less, more preferably 0.1 μm to 0.9 μm, and still more preferably 0.2 μm to 0.8 μm.

It is preferable to set the film thickness to 1.0 μm or less since a high degree of resolution and adhesiveness are obtained.

Moreover, in this step, a cured film having a small film thickness of 0.7 μm or less can be suitably formed. Further, if the obtained cured film is subjected to a development process in a pattern forming step which will be described later, it is possible to obtain a thin film having a colored pattern which exhibits excellent developability and reduced surface roughness and has an excellent pattern shape.

<<Developing Step>>

Next, by carrying out an alkaline developing treatment, the coloring composition layer in an area not irradiated with light in the exposing step is eluted into an aqueous alkaline solution, and as a result, only a photo cured area remains.

As a developing liquid, an organic alkaline developing liquid not damaging an imaging device, a circuit, or the like in an underlayer is preferable. The development temperature is usually from 20° C. to 30° C., and the development time is 20 seconds to 90 seconds in the related art. In order to further remove residues, development is recently carried out for 120 seconds to 180 seconds in some cases. Further, in order to improve residue removal properties, a step of sufficiently shaking the developing liquid every 60 seconds and newly supplying a developing liquid is repeated plural times in some cases.

Examples of an alkaline agent used for the developing liquid include organic alkaline compounds such as aqueous ammonia, ethylamine, diethylamine, dimethyl ethanolamine, tetramethyl ammonium hydroxide, tetraethyl ammonium hydroxide, tetrapropyl ammonium hydroxide, tetrabutyl ammonium hydroxide, benzyltrimethyl ammonium hydroxide, choline, pyrrole, piperidine, and 1,8-diazabicyclo-[5,4,0]-7-undecene. An aqueous alkaline solution obtained by diluting these alkaline agents with pure water so as to yield a concentration of the alkaline agent of 0.001% by mass to 10% by mass, and preferably 0.01% by mass to 1% by mass is preferably used as the developing liquid.

Incidentally, inorganic alkali may be used for the developing liquid, and as the inorganic alkali, for example, sodium hydroxide, potassium hydroxide, sodium carbonate, sodium hydrogen carbonate, sodium silicate, sodium metasilicate, and the like are preferable.

Furthermore, in the case where a developing liquid formed of such an aqueous alkaline solution is used, the pattern is generally cleaned (rinsed) with pure water after development.

Next, it is preferable to carry out a heating treatment (postbaking) after drying. If a multi-colored pattern is formed, the above steps can be sequentially repeated for each color to produce a cured coat. Thus, a color filter is obtained.

The postbaking is a heating treatment performed after development so as to complete curing, and in the postbaking, a thermal curing treatment is carried out usually at 100° C. to 240° C., and preferably at 200° C. to 240° C.

The postbaking treatment can be carried out on the coated film obtained after development in a continuous or batch manner, by using heating means such as a hot plate, a convection oven (a hot-air circulation type drier), and a high-frequency heater under the conditions described above.

<Case of Forming Pattern By Dry Etching Method>

In the case of forming a pattern by dry etching, reference can be made to the description of JP2013-64993A, the contents of which can be hereby incorporated by reference.

Furthermore, the manufacturing method of the present invention may have a step known as a method for manufacturing a color filter for a solid-state imaging device, if desired, as a step other than the above steps. For example, the method may include a curing step of curing the formed colored pattern by heating and/or exposure, if desired, after the coloring composition layer forming step, the exposing step, and the pattern forming step are carried out.

Moreover, in the case of using the coloring composition according to the present invention, contaminations or the like occur in some cases, for example, when a nozzle of an ejection portion or a piping portion of a coating device is clogged, or the coloring composition or a pigment adheres to or is precipitated or dried inside the coating machine. Accordingly, in order to efficiently clean off the contaminations caused by the composition of the present invention, it is preferable to use the solvent relating to the coloring composition of the present invention as a cleaning liquid. In addition, the cleaning liquids described in JP1995-128867A (JP-H07-128867A), JP1995-146562A (JP-H07-146562A), JP1996-278637A (JP-H08-278637A), JP2000-273370A, JP2006-85140A, JP2006-291191A, JP2007-2101A, JP2007-2102A, JP2007-281523A, and the like can also be suitably used as cleaning removing liquid of the coloring composition according to the present invention.

Among those, alkylene glycol monoalkyl ether carboxylate and alkylene glycol monoalkyl ether are preferable.

These solvents may be used singly or as a mixture of two or more kinds thereof. In the case where two or more kinds thereof are mixed, it is preferable to mix a solvent having a hydroxyl group with a solvent not having a hydroxyl group.

The mass ratio between the solvent having a hydroxyl group and the solvent not having a hydroxyl group is 1/99 to 99/1, preferably 10/90 to 90/10, and still more preferably 20/80 to 80/20. A mixed solvent in which propylene glycol monomethyl ether acetate (PGMEA) is mixed with propylene glycol monomethyl ether (PGME) at a ratio of 60/40 is particularly preferable. Further, in order to improve the permeability of the cleaning liquid with respect to the contaminant, it is preferable to add the aforementioned surfactants relating to the present composition to the cleaning liquid.

Since the color filter of the present invention uses the coloring composition of the present invention, exposure having an excellent exposure margin can be carried out, and the formed colored pattern (colored pixel) has an excellent pattern shape. Further, since the surface roughness of the pattern and the residues in a developed area are suppressed, excellent color characteristics are exhibited.

The color filter of the present invention can be suitably used for a solid-state imaging device such as a CCD and a CMOS, and is particularly preferable for a CCD, a CMOS, and the like with a high resolution, having more than 1,000,000 pixels. The color filter for a solid-state imaging device of the present invention can be used as, for example, a color filter disposed between a light-receiving portion of each pixel constituting a CCD or a CMOS and a microlens for condensing light.

Furthermore, the film thickness of the colored pattern (colored pixel) in the color filter of the present invention is preferably 2.0 μm or less, more preferably 1.0 μm or less, and still more preferably 0.7 μm or less.

Moreover, the size (pattern width) of the colored pattern (colored pixel) is preferably 2.5 μm or less, more preferably 2.0 μm or less, and particularly preferably 1.7 μm or less.

<Solid-State Imaging Device>

The solid-state imaging device of the present invention includes the color filter of the present invention. The constitution of the solid-state imaging device of the present invention is not particularly limited as long as the solid-state imaging device is constituted to include the color filter in the present invention and functions as a solid-state imaging device. However, for example, the solid-state imaging device can be constituted as below.

The solid-state imaging device has a configuration which has a plurality of photodiodes constituting a light-receiving area of a solid-state imaging device (a CCD image sensor, a CMOS image sensor, or the like) and a transfer electrode formed of polysilicon or the like, on a support; a light shielding film formed of tungsten or the like onto the photodiodes and the transfer electrodes, which has openings only over the light-receiving portion of the photodiode; a device protecting film formed of silicon nitride or the like, which is formed to cover the entire surface of the light shielding film and the light receiving portion of the photodiodes, on the light shielding film; and the color filter for a solid-state imaging device of the present invention on the device protecting film.

In addition, the solid-state imaging device may have a configuration in which a light-collecting means (for example, a micro lens or the like, the same applies hereinafter) is disposed on the device protecting film and under the color filter (side a side closer to the support), a configuration in which a light-collecting means is disposed on the color filter, and the like.

<Image Display Device>

The color filter of the present invention can be used not only for a solid-state imaging device, but also for an image display device such as a liquid crystal display device and an organic EL display device. In particular, the color filter is suitable in the applications of a liquid crystal display device. The liquid crystal display device including the color filter of the present invention can display a high-quality image showing a good hue of a display image and having excellent display characteristics.

The definition of display devices or details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The color filter of the present invention may be used for a liquid crystal display device using a color TFT system. The liquid crystal display device using a color TFT system is described in, for example, "Color TFT Liquid Crystal Display (KYORITSU SHUPPAN Co., Ltd., published in 1996) ". Further, the present invention can be applied to a liquid crystal display device having an enlarged view angle, which uses an in-plane switching driving system such as IPS and a pixel division system such as MVA, or to STN, TN, VA, OCS, FFS, R-OCB, and the like.

In addition, the color filter in the present invention can be provided to a Color-filter On Array (COA) system which is a bright and high-definition system. In the liquid crystal display device of the COA system, the characteristics required for a color filter layer need to include characteristics required for an interlayer insulating film, that is, a low dielectric constant and resistance to a peeling solution in some cases, in addition to the generally required characteristics as described above. In the color filter of the present invention, a colorant multimer having an excellent hue is used. Accordingly, the color purity, light-transmitting properties, and the like are excellent, and the tone of the colored pattern (pixel) is excellent. Consequently, a liquid crystal display device of a COA system which has a high resolution and is excellent in long-term durability can be provided. Further, in order to satisfy the characteristics required for a low dielectric constant, a resin coat may be provided on the color filter layer.

These image display systems are described in, for example, p. 43 of "EL, PDP, and LCD Display Technologies and Recent Trend in Market (TORAY RESEARCH CENTER, Research Department, published in 2001)", and the like.

The liquid crystal display device including the color filter in the present invention is constituted with various members such as an electrode substrate, a polarizing film, a phase difference film, a backlight, a spacer, and a view angle compensation film, in addition to the color filter of the present invention. The color filter of the present invention can be applied to a liquid crystal display device constituted with these known members. These members are described in, for example, "'94 Market of Peripheral Materials And Chemicals of Liquid Crystal Display (Kentaro Shima, CMC Publishing Co., Ltd., published in 1994)" and "2003 Current Situation of Market Relating to Liquid Crystal and Prospects (Vol. 2) (Ryokichi Omote, Fuji Chimera Research Institute, Inc., published in 2003)".

The backlight is described in SID Meeting Digest 1380 (2005) (A. Konno, et al.), December Issue of Monthly "Display", 2005, pp. 18-24 (Yasuhiro Shima) and pp. 25-30 (Takaaki Yagi) of the documents, and the like.

If the color filter in the present invention is used in a liquid crystal display device, high contrast can be realized when the color filter is combined with a three-wavelength tube of a cold cathode tube known in the related art. Further, if a light source of LED in red, green, and blue (RGB-LED) is used as a backlight, a liquid crystal display device having high luminance, high color purity, and good color reproducibility can be provided.

EXAMPLES

Hereinafter, the present invention will be described in more detail with reference to Examples, but the present invention is not limited to Examples below as long as the gist of the present invention is not impaired. Further, "%" and "part(s)" are based on mass unless otherwise specified.

Synthesis Example of Colorant Compound M-3

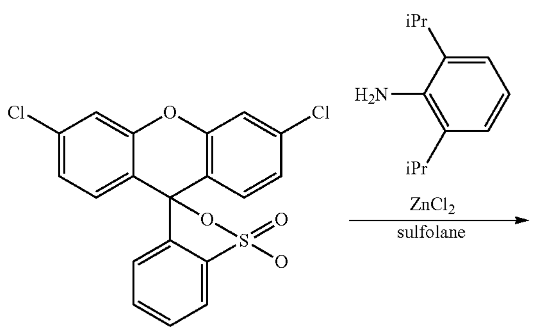

DCSF

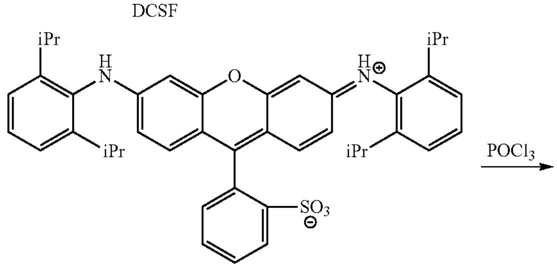

Intermediate 1

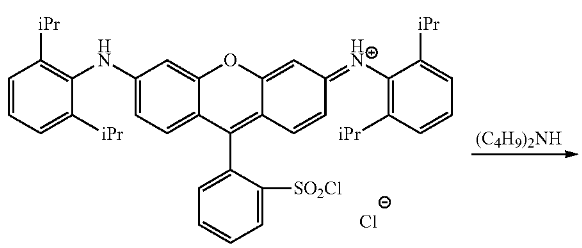

Intermediate 2

-continued

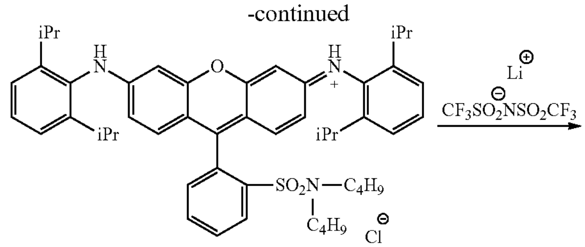

Intermediate 3

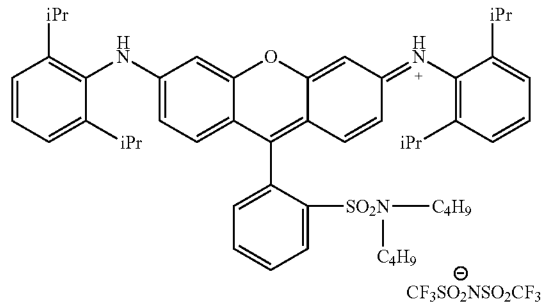

M-3

<<Synthesis of Intermediate 1>>

20 parts of the compound DCSF (manufactured by Chugai Kasei Co., Ltd.) shown above, 43.9 parts of 2,6-diisopropylaniline, 11.05 parts of zinc chloride, and 80 parts of sulfolane were put into a flask, and the mixture was stirred at an external temperature of 200° C. for 4 hours. Thereafter, the mixture was left to be cooled to 60° C., 500 parts of 2 N hydrochloric acid was added dropwise thereto, and the precipitated crystals were separated by filtration. The crystals were dispersed and washed at 45° C. using 240 parts of acetonitrile, collected by filtration, and air-dried for 10 hours to obtain 29.6 parts (yield: 88%) of an intermediate 1.

<<Synthesis of Intermediate 2>>

20 parts of the intermediate 1 and 200 parts of phosphorus oxychloride were put into a flask, and the mixture was stirred at 60° C. for 4 hours. The mixture was left to be cooled to room temperature, the reaction liquid was added dropwise to 1,300 parts of ice water, and the mixture was stirred for 30 minutes. The obtained crystals separated by filtration, washed with 3,000 parts of water, and air-dried for 10 hours to obtain 21.6 parts (yield: 100%) of an intermediate 2.

<<Synthesis of Intermediate 3>>

33.6 parts of dibutylamine was dissolved in 100 parts of methylene chloride, and the solution was cooled to 0° C. 3.85 parts of the intermediate 2 was added thereto, and the mixture was returned to room temperature and stirred for 4 hours. The mixture was left to be cooled to room temperature, the reaction liquid was added dropwise to 1,300 parts of ice water, and the mixture was stirred for 30 minutes. After completion of the reaction, the mixture was subjected to liquid separation using 100 parts of water, and then the organic layer was concentrated. The obtained solid was purified by silica gel column chromatography to obtain 3.0 parts (yield: 70%) of an intermediate 3.

<<Synthesis of Colorant Compound M-3>>

1.67 parts of the intermediate 3 and 0.63 parts of a bis(trifluoromethanesulfonyl)imide lithium salt were dissolved in 50 parts of methanol, and the mixture was stirred at room temperature for 4 hours. After completion of the reaction, methanol was removed by evaporation. Then, the resultant was dissolved in 50 parts of chloroform and the solution was subjected to liquid separation purification using 50 parts of water. The obtained organic layer was concentrated to obtain 1.74 parts (yield: 81%) of a colorant compound M-3.

Synthesis Example of Colorant Compound M-23

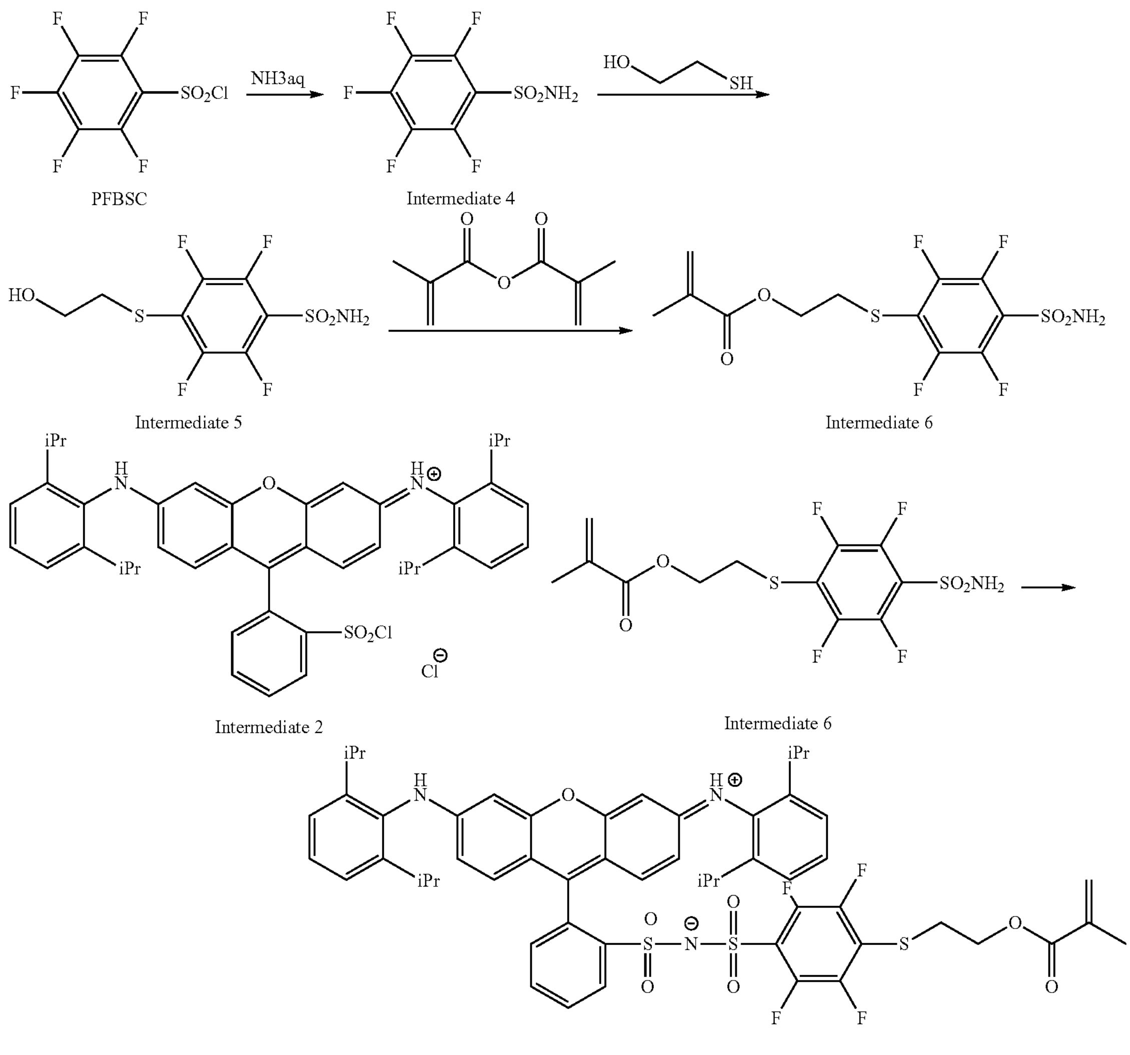

M-23

<<Synthesis of Intermediate 4>>

175 parts of the compound PFBSC (manufactured by Tokyo Chemical Industry Co., Ltd.) shown above and 3,500 parts of tetrahydrofuran were put into a flask, the mixture was cooled to −10° C., and then 80 parts of aqueous ammonia were slowly added dropwise thereto. After dropwise addition, the mixture was stirred at 0° C. for 1 hour. After completion of the reaction, the precipitated solid was separated by filtration, and then the filtrate was concentrated to obtain crystals. The obtained crystals were reslurry-washed with 2 L of water, and then the solid was collected by filtration and air-dried for 10 hours to obtain 148 parts (yield: 91%) of an intermediate 4.

<<Synthesis of Intermediate 5>>

12.4 parts of the intermediate 5 was dissolved in 80 parts of methanol, then 4.3 parts of 2-mercaptoethanol was added thereto, and the mixture was stirred at room temperature. Triethylamine was slowly added dropwise thereto, and subsequently, the mixture was stirred at room temperature for 4 hours. After completion of the reaction, methanol was removed by evaporation, and the liquid-separation purification was carried out by addition of 100 parts of ethyl acetate and 100 parts of water. The obtained organic layer was concentrated to obtain 14.3 parts (yield: 94 parts) of an intermediate 5.

<<Synthesis of Intermediate 6>>

40 parts of the intermediate 5, 60 parts of methacrylic anhydride, and 3.15 parts of methanesulfonic acid were added, and the mixture was stirred at 50° C. for 1 hour. After completion of the reaction, the reaction liquid was purified by silica gel column chromatography to obtain 41.5 parts (yield: 85%) of an intermediate 6.

<<Synthesis of Colorant Compound M-23>>

18.67 parts of the intermediate 6 and 15.2 parts of triethylamine were dissolved in 200 parts of methylene chloride, 55.6 parts of the intermediate 2 was added thereto, and the mixture was stirred at room temperature for 3 hours. Thereafter, 200 parts of water was added thereto to wash the mixture, and the organic layer was dried over sodium sulfate, concentrated, purified by silica gel column chromatography, and then concentrated under reduced pressure to obtain 34 parts (yield: 65%) of a colorant compound M-23.

Other colorant compounds M-1, M-2, M-4 to M-22, M-24 to M-37 were also synthesized by changing raw materials with reference to the colorant compounds M-3 and M-23.

<<Synthesis of Colorant Compound P-6>>

12.14 parts of N-ethylpyrrolidone was stirred at 90° C., and to the solution was added dropwise a solution obtained by adding 15 parts of M-23, 3.7 parts of methacrylic acid, 0.35 parts of dodecylmercaptan, and 0.79 parts of V601 manufactured by Wako Pure Chemical Industries, Ltd., and 31.5 parts of N-ethylpyrrolidone for 1 hour. Thereafter, the mixture was stirred at 90° C. for 3 hours. The reaction liquid was left to be cooled to room temperature and added dropwise to a mixed solvent of 360 parts of ethyl acetate and 40 parts of acetonitrile. The obtained crystals were separated by filtration, washed with 270 parts of ethyl acetate, and 30 parts of acetonitrile, and dried at 40° C. under reduced pressure to obtain 15.5 parts of P-6.

Synthesis Examples of Colorant Compounds P-1 to P-19

By carrying out the same procedure except that the repeating unit in the colorant compound P-6 was changed to those described in the following table, colorant compounds P-1 to P-19 were synthesized.

TABLE 2

| Colorant compound (colorant multimer) | Repeating unit 1 | % by mole | Repeating unit 2 | % by mole | Repeating unit 3 | % by mole | Repeating unit 4 | % by mole | Mw |
|---|---|---|---|---|---|---|---|---|---|
| P-1 | M-17 | 25 | B-1 | 75 | | | | | 10,600 |
| P-2 | M-18 | 30 | B-1 | 35 | B-18 | 35 | | | 11,500 |
| P-3 | M-19 | 25 | B-2 | 35 | B-19 | 30 | | | 15,200 |
| P-4 | M-20 | 30 | B-1 | 40 | B-18 | 30 | | | 20,000 |
| P-5 | M-19 | 20 | B-1 | 30 | B-20 | 50 | | | 8,200 |
| P-6 | M-23 | 25 | B-1 | 75 | | | | | 15,000 |
| P-7 | M-23 | 25 | B-1 | 40 | B-20 | 35 | | | 23,500 |
| P-8 | M-22 | 50 | B-2 | 40 | B-18 | 10 | | | 12,600 |
| P-9 | M-30 | 50 | B-1 | 50 | | | | | 8,300 |
| P-10 | M-26 | 30 | B-7 | 35 | B-19 | 35 | | | 15,400 |
| P-11 | M-23 | 25 | B-1 | 40 | B-20 | 25 | B-21 | 10 | 12,200 |
| P-12 | M-27 | 30 | B-1 | 40 | B-18 | 20 | B-23 | 10 | 16,500 |
| P-13 | M-24 | 35 | B-1 | 40 | B-20 | 20 | B-27 | 5 | 17,300 |
| P-14 | M-30 | 15 | B-7 | 60 | B-19 | 20 | B-32 | 5 | 21,000 |
| P-15 | M-32 | 30 | B-1 | 45 | B-17 | 20 | B-9 | 5 | 14,600 |
| P-16 | M-43 | 30 | B-1 | 40 | B-18 | 20 | B-21 | 10 | 15,000 |
| P-17 | M-45 | 35 | B-1 | 35 | B-18 | 15 | B-21 | 15 | 21,000 |
| P-18 | M-46 | 35 | B-1 | 40 | B-20 | 15 | B-21 | 10 | 18,500 |
| P-19 | M-30 | 25 | B-1 | 35 | B-20 | 25 | B-21 | 15 | 8,500 |

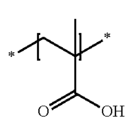

(B-1)

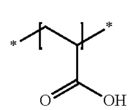

(B-2)

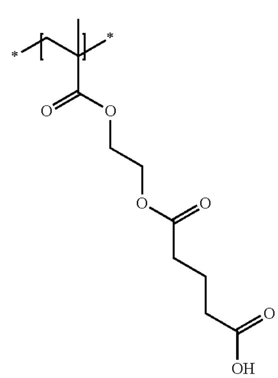

(B-7)

TABLE 2-continued

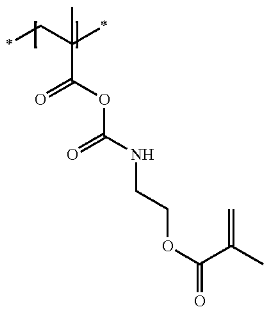

(B-17)

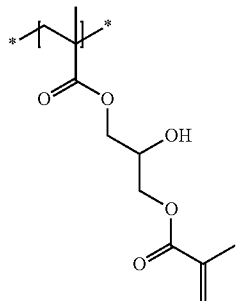

(B-18)

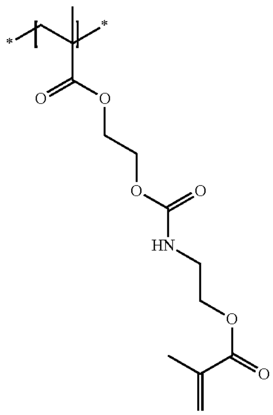

(B-19)

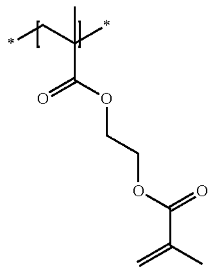

(B-20)

<Comparative Colorant Compound>

H-1

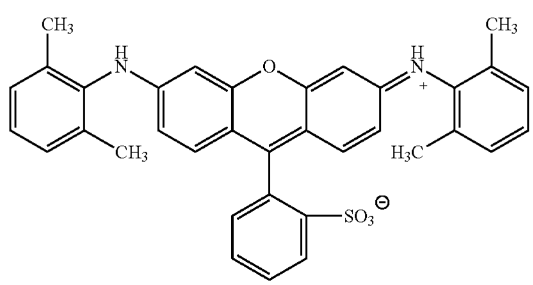

H-2

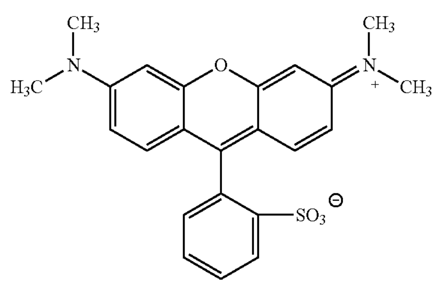

-continued

H-3

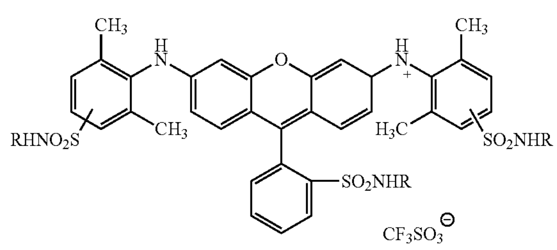

R: 2ethylhexyl

<Formation of Pattern for Image Sensor>

1. Formation of Undercoat Layer

The components having the following composition were mixed and dissolved to prepare a resist solution for an undercoat layer.

| (Composition of Resist Solution for Undercoat Layer) | |
|---|---|
| Solvent: propylene glycol monomethyl ether acetate (PGMEA) | 19.20 parts |
| Solvent: ethyl lactate | 36.67 parts |
| Alkali-soluble resin: 40% PGMEA solution of a benzyl methacrylate/methacrylic acid/2-hydroxyethyl methacrylate copolymer (molar ratio = 60/22/18, weight-average molecular weight of 15,000, number-average molecular weight of 9,000) | 30.51 parts |
| Compound Containing Ethylenically Unsaturated Double Bond: Dipentaerythritol hexaacrylate | 12.20 parts |

-continued

| (Composition of Resist Solution for Undercoat Layer) | |
|---|---|
| Polymerization inhibitor: p-methoxyphenol | 0.0061 parts |
| Fluorine-based surfactant: F-475, manufactured by DIC Corporation | 0.83 parts |
| Photopolymerization initiator: trihalomethyl triazine-based photopolymerization initiator (TAZ-107, manufactured by Midori Kagaku Co., Ltd.) | 0.586 parts |

2. Manufacture of Undercoat Layer-Attached Silicon Wafer Substrate

A 150-mm (6-inch) silicon wafer was subjected to a heating treatment in an oven at 200° C. for 30 minutes. Next, the resist solution was applied onto this silicon wafer such that the dry film thickness became 1.5 μm. Further, the resultant was further heated and dried in an oven at 220° C. for 1 hour to form an undercoat layer to obtain an undercoat layer-attached silicon wafer substrate.

3. Preparation of Coloring Composition 3-1. Preparation of Blue Pigment Dispersion A blue pigment dispersion 1 was prepared in the following manner.

A mixed solution including 13.0 parts of C. I. Pigment Blue 15:6 (blue pigment, average particle size of 55 nm), 5.0 parts of Disperbyk111 as a pigment dispersant, and 82.0 parts of PGMEA was mixed and dispersed for 3 hours by a beads mill (zirconia beads having a diameter of 0.3 mm) to prepare a pigment dispersion. Thereafter, the pigment dispersion was further subjected to a dispersion treatment under a pressure of 2,000 kg/cm$^3$ and at a flow rate of 500 g/min, by using a high-pressure dispersing machine equipped with a depressurizing mechanism, NANO-3000-10 (manufactured by Nihon B. E. E Co., Ltd.). This dispersion treatment was repeated 10 times to obtain a blue pigment dispersion 1 (a dispersion of C. I. Pigment Blue 15:6, pigment concentration of 13%) used in the coloring compositions of Examples or Comparative Examples.

For the obtained blue pigment dispersion, the particle diameter of the pigment was measured using a dynamic light scattering method (Microtrac Nanotrac UPA-EX150 (manufactured by Nikkiso Co., Ltd.), and as a result, was found to be 24 nm.

In the same manner as in Preparation of Blue Pigment Dispersion 1 above except that a combination of the pigment shown in the table below and Disperbyk111 was used instead of the combination of C. I. Pigment Blue 15:6 used as the blue pigment and Disperbyk111 as the pigment dispersant in the blue pigment dispersion 1 in "3-1. Preparation of Blue Pigment Dispersion", a red pigment dispersion, a green pigment dispersion, and a yellow pigment dispersion were prepared.

C. I. Pigment Red 254 (PR254)

C. I. Pigment Yellow (PY139)

3-2. Preparation of Coloring Composition

The following respective components were mixed, dispersed, and dissolved to obtain the respective coloring compositions of Examples and Comparative Examples.

| | |
|---|---|
| (A) Colorant compound (the compound described in the table below) | 0.04 parts in terms of a solid content of the colorant |
| Solvent (PGMEA) | 1.133 parts |
| Alkali-soluble resin (Compound of J1 or J2 below) | 0.03 parts |
| Dispersant (Solsperse 20000: (1% cyclohexane solution, manufactured by Lubrizol Japan Ltd.) | 0.125 parts |

-continued

| | |
|---|---|
| Photopolymerization initiator (Compounds of C-4 to C-13 below) | 0.012 parts |
| Pigment dispersion above (pigment concentration of 13% by mass) | 0.615 parts |
| Curable compound | 0.07 parts |
| Surfactant (glycerol propoxylate: (1% cyclohexane solution)) | 0.048 parts |

As the curable compound, any one of the following compounds was employed.

DPHA (dipentaerythritolhexaacrylate, KAYARAD DPHA, manufactured by Nippon Kayaku Co., Ltd.)

A-DPH-12E (ethyleneoxy-modified dipentaerythritol-hexaacrylate, manufactured by Nippon Kayaku Co., Ltd.)

DPHA/1,4-bis(3-mercaptobutyryloxy)butane (a mixture of 0.062 parts of DPHA and 0.008 parts of 1,4-bis(3-mercaptobutyryloxy)butane)

(J1)

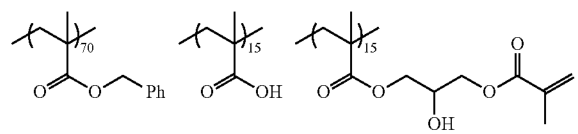

Mw 15,000

(J2)

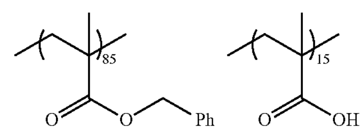

Mw 15,000

(C-4)

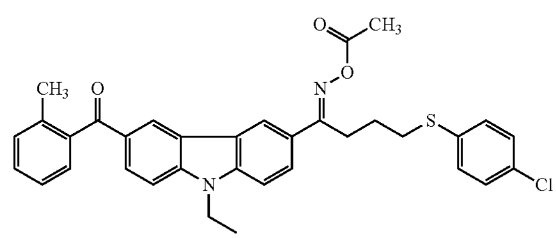

(C-5)

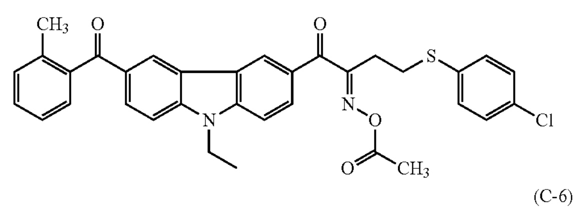

(C-6)

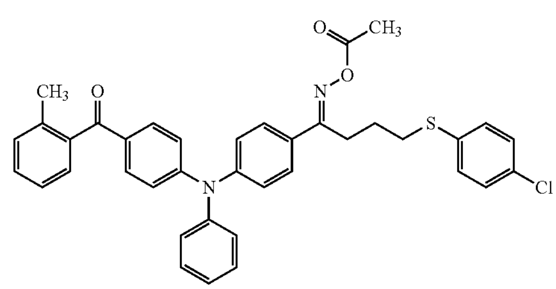

-continued (C-7)

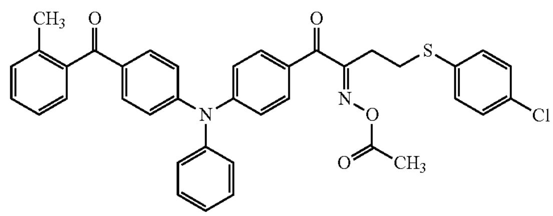

(C-8)

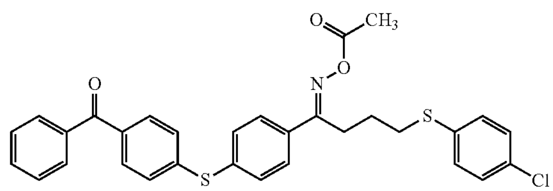

(C-9)

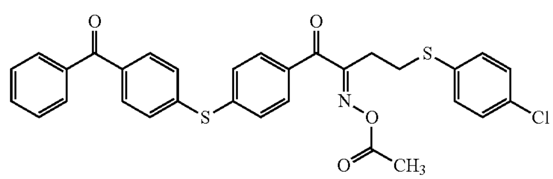

(C-10)

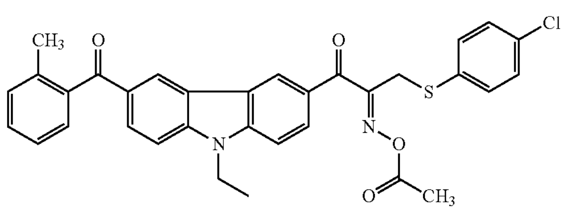

(C-11)

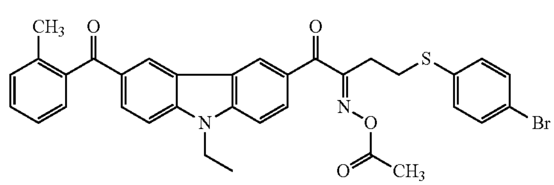

(C-12)

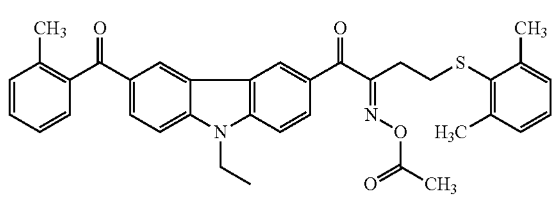

(C-13)

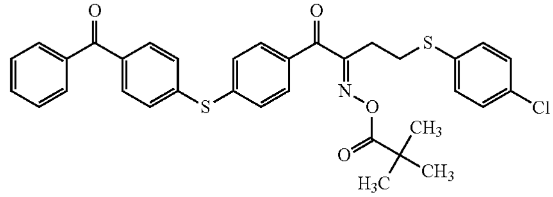

4. Manufacture of Color Filter Using Coloring Composition

<Pattern Formation>

Each of the coloring compositions of Examples and Comparative Examples, which had been prepared as above, was applied onto the undercoat layer of the undercoat layer-attached silicon wafer substrate obtained in the above section 2, thereby forming a coloring composition layer (coated film). Then, a heating treatment (prebaking) was carried out for 120 seconds by using a hot plate at 100° C. such that the dry film thickness of the coated film became 0.6 μm.

Next, by using an i-ray stepper exposure device FPA-3000i5+ (manufactured by CANON Inc.), the wafer was exposed at a wavelength of 365 nm through an island pattern mask having a 1.0 μM×1.0 μm pattern, by varying the exposure dose in a range from 50 mJ/cm$^2$ to 1200 mJ/cm$^2$.

Subsequently, the silicon wafer substrate having the coated film irradiated with light formed thereon was loaded onto a horizontal spin table of a spin shower developing machine (Model DW-30, manufactured by Chemitronics Co., Ltd.), and subjected to puddle development at 23° C. for 60 seconds by using CD-2000 (manufactured by FUJIFILM Electronic Materials CO., LTD.), thereby forming a colored pattern on the silicon wafer substrate.

The silicon wafer having the colored pattern formed thereon was fixed onto the horizontal spin table by a vacuum chuck method, and the silicon wafer substrate was rotated at a rotation frequency of 50 r.p.m. by using a rotation device. In this state, from the position above the rotation center, pure water was supplied onto the wafer from a spray nozzle in the form of a shower so as to carry out a rinsing treatment, and then the wafer was spray-dried.

In the manner described above, a monochromic color filter having the colored pattern formed of the coloring compositions of Examples or Comparative Examples were manufactured.

Thereafter, the size of the colored pattern was measured by using a length measuring SEM "S-9260A" (manufactured by Hitachi High-Technologies Corporation). An exposure dose at which the pattern size became 1.0 μm was determined as an optimal exposure dose.

<Evaluation of Performance>

1. Heat Resistance

The obtained color filter was disposed on a hot plate at 230° C. such that the color filter came into contact with the substrate surface, and was heated for 1 hour. Then, the color differences (ΔE*ab value) before and after the heating were measured using a colorimeter MCPD-1000 (manufactured by Otsuka Electronics Co., Ltd.), and used as an index for evaluating the heat fastness, and the heat resistance was evaluated in accordance with the following evaluation criteria. A smaller ΔE*ab value indicates higher heat resistance. Incidentally, the ΔE*ab value is a value determined from the following color-difference formula according to CIE 1976 (L*, a*, b*) color space (New Edition of Color Science Handbook (1985) p. 266, edited by The Color Science Association of Japan).

$$\Delta E^*ab=\{(\Delta L^*)^2+(\Delta a^*)^2+(\Delta b^*)^2\}^{1/2}$$

Evaluation was carried out in accordance with the following criteria.

A: The value of ΔE*ab is 0 or more and less than 1.0.

B: The value of ΔE*ab is 1.0 or more and less than 3.0.

C: The value of ΔE*ab is 3.0 or more.

2. Light Resistance

The color filter was irradiated with light of 50,000 lux for 20 hours (equivalent to 1,000,000 lux·h) using a xenon lamp as a light fastness test, and the color difference, ΔE*ab value, between before and after the light fastness test, was measured. A smaller ΔE*ab value indicates better light fastness.

Evaluation was carried out in accordance with the following criteria.

A: ΔE*ab value <3

B: 3≤ΔE*ab value <10

C: 10≤ΔE*ab value <20

D: 20≤ΔE*ab value

3. Solubility

The solvent solubility of the colorant compound for a solvent of PGMEA/cyclohexanone=1/1 (mass ratio) was evaluated in accordance with the following criteria.

A: A case exhibiting a solubility of 20% by mass or more

B: A case exhibiting a solubility of 10% by mass or more and less than 20% by mass C: A case exhibiting a solubility of 5% by mass or more and less than 10% by mass D: A case exhibiting a solubility of less than 5% by mass 4. Evaluation of Surface Unevenness The coloring composition prepared above was coated onto glass (EAGLE XG; manufactured by Corning Inc.) by a spin coating method such that the film thickness of the colored film became 2.5 μm, dried to remove volatile components, and then heated at 100° C. for 80 seconds to form a colored film.

The colored film obtained above was cooled, and then irradiated with an i-line (at a wavelength of 365 nm) to cure the colored film. As a light source for the i-line, an ultra-high pressure mercury lamp was used, and the irradiation dose was set to 40 mJ/cm$^2$. Next, a developing treatment was carried out with a 0.05% aqueous KOH solution at 25° C. for 40 seconds, and then a rinsing treatment using pure water was carried out to wash away the developing solution.

Next, this colored film was subjected to a postbaking treatment at 230° C. for 30 minutes, and using the colored film after the treatment, the colored film was observed if the colored film has unevenness at a brightfield magnification of 200 times using an optical microscope (MX-61L manufactured by OLYMPUS CORPORATION). In the case where unevenness was not found when observed with the optical microscope and a uniform film was formed, the resistance to thermal stress during postbaking is considered to be excellent.

A: Unevenness is not seen with an optical microscope

B: Slight unevenness is seen with an optical microscope

C: Clear unevenness is seen with an optical microscope

TABLE 3

| | Colorant compound | Curable compound | Photopolymerization initiator | Alkali-soluble resin |
|---|---|---|---|---|
| Example 1-1 | M-1 | DPHA | C-4 | J1 |
| Example 1-2 | M-3 | A-DPH-12E | C-5 | J1 |
| Example 1-3 | M-5 | DPHA | C-4 | J2 |
| Example 1-4 | M-9 | DPHA | C-9 | J1 |
| Example 1-5 | M-14 | DPHA | C-7 | J1 |
| Example 1-6 | M-16 | DPHA | C-13 | J1 |
| Example 1-7 | M-17 | DPHA | C-9 | J1 |
| Example 1-8 | M-19 | A-DPH-12E | C-10 | J1 |
| Example 1-9 | M-21 | DPHA | C-11 | J1 |
| Example 1-10 | M-22 | DPHA | C-12 | J1 |
| Example 1-11 | M-23 | A-DPH-12E | C-13 | J1 |
| Example 1-12 | M-30 | DPHA | C-4 | J1 |
| Example 1-13 | P-1 | DPHA | C-9 | J1 |
| Example 1-14 | P-2 | DPHA | C-5 | J1 |
| Example 1-15 | P-3 | A-DPH-12E | C-13 | J2 |
| Example 1-16 | P-4 | DPHA | C-10 | J1 |
| Example 1-17 | P-5 | DPHA | C-8 | J2 |
| Example 1-18 | P-6 | DPHA | C-6 | J1 |
| Example 1-19 | P-7 | A-DPH-12E | C-11 | J1 |
| Example 1-20 | P-8 | DPHA | C-9 | J1 |
| Example 1-21 | P-9 | A-DPH-12E | C-12 | J1 |
| Example 1-22 | P-10 | A-DPH-12E | C-10 | J1 |
| Example 1-23 | P-11 | DPHA | C-4 | J1 |
| Example 1-24 | P-12 | DPHA | C-9 | J2 |
| Example 1-25 | P-13 | DPHA | C-10 | J1 |
| Example 1-26 | P-14 | DPHA | C-4 | J1 |
| Example 1-27 | P-15 | A-DPH-12E | C-13 | J1 |
| Example 1-28 | M-38 | DPHA | C-4 | J1 |
| Example 1-29 | M-40 | DPHA | C-11 | J1 |
| Example 1-30 | P-16 | DPHA | C-4 | J1 |
| Example 1-31 | P-17 | A-DPH-12E | C-5 | J1 |
| Example 1-32 | P-18 | DPHA | C-7 | J1 |
| Example 1-33 | P-19 | DPHA | C-9 | J1 |
| Example 1-34 | P-18 | DPHA/1,4-bis(3-mercapto-butyryloxy)butane | C-9 | J1 |
| Example 1-35 | P-19 | DPHA/1,4-bis(3-mercapto-butyryloxy)butane | C-9 | J1 |
| Comparative Example 1-1 | H-1 | DPHA | C-9 | J1 |
| Comparative Example 1-2 | H-2 | DPHA | C-9 | J1 |
| Comparative Example 1-3 | H-3 | DPHA | C-9 | J1 |

TABLE 4

| | Heat resistance | Light resistance | Solubility | Surface unevenness |
|---|---|---|---|---|
| Example 1-1 | B | A | B | B |
| Example 1-2 | B | A | B | B |
| Example 1-3 | B | B | B | B |
| Example 1-4 | B | A | B | B |
| Example 1-5 | B | A | B | B |
| Example 1-6 | B | B | B | B |
| Example 1-7 | B | A | A | B |
| Example 1-8 | B | A | A | B |
| Example 1-9 | B | A | A | B |
| Example 1-10 | A | A | B | B |
| Example 1-11 | A | A | B | B |
| Example 1-12 | A | A | B | B |
| Example 1-13 | B | A | A | A |
| Example 1-14 | B | A | A | A |
| Example 1-15 | B | A | A | A |
| Example 1-16 | B | A | A | A |
| Example 1-17 | B | A | A | A |
| Example 1-18 | A | A | A | A |
| Example 1-19 | A | A | A | A |
| Example 1-20 | A | A | A | A |
| Example 1-21 | A | A | A | A |
| Example 1-22 | A | A | A | A |
| Example 1-23 | A | A | A | A |
| Example 1-24 | A | A | A | A |
| Example 1-25 | A | A | A | A |
| Example 1-26 | A | A | A | A |
| Example 1-27 | A | A | A | A |
| Example 1-28 | B | C | B | B |
| Example 1-29 | B | B | C | B |
| Example 1-30 | A | A | A | A |
| Example 1-31 | A | A | A | A |
| Example 1-32 | A | A | A | A |
| Example 1-33 | A | A | A | A |
| Example 1-34 | A | A | A | A |
| Example 1-35 | A | A | A | A |
| Comparative Example 1-1 | C | C | D | C |
| Comparative Example 1-2 | C | D | D | C |
| Comparative Example 1-3 | C | C | C | C |

As apparent from the above results, it could be seen that the colorant compounds of the compositions of Examples have excellent solvent solubility. Further, in the case where color filters were manufactured by a photoresist using the compositions of Examples, as a result, it could be seen that the surface unevenness is excellent in the case of using the compositions of Examples. In addition, it could be seen that the heat resistance and the light fastness are also excellent.

Moreover, it could be seen that this tendency is particularly effective in the case where a low-nucleophilicity anion is used, in the case where the colorant compound represented by General Formula (1) is a polymer or polymerizable monomer, or in the case where the colorant compound represented by General Formula (1) has a cation and an anion inside the molecule.

<Formation of Pattern for LCD>

(S-1) A pigment dispersion obtained by mixing 12.8 parts of C. I. Pigment Blue 15:6 and 7.2 parts of an acrylic pigment dispersant with 80.0 parts of propylene glycol monomethyl ether acetate, and sufficiently dispersing the pigment using a bead mill.

(T-1) Polymerizable Compound: KAYARAD DPHA (dipentaerythritol hexaacrylate, manufactured by Nippon Kayaku Co., Ltd.)

(U-1) Alkali-soluble resin: Propylene glycol monomethyl ether acetate solution (solid content 40.0%) of benzyl methacrylate/methacrylic acid (75/25 [mass ratio]) copolymer (weight-average molecular weight: 12,000)

(V-1) Photopolymerization initiator: 2-(Benzoyloxyimino)-1-[4-(phenylthio)phenyl]-1-octanone (manufactured by BASF)

(V-2) Photopolymerization initiator: 2-(Acetoxyimino)-4-(4-chlorophenylthio)-1-[9-ethyl-6-(2-methylbenzoyl)-9H-carbazol-3-yl]-1-butanone (manufactured by BASF)

(V-3) Photopolymerization initiator: Oxime-based compound having the following structure (Ac represents an acetyl group)

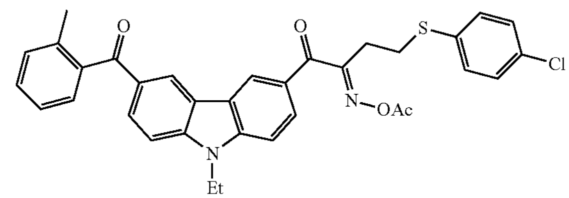 [SMILES: CCn1c2ccc(C(=O)/C(CCSc3ccc(Cl)cc3)=N/OC(C)=O)cc2c2cc(C(=O)c3ccccc3C)ccc21]

(V-4) Photopolymerization initiator: IRGACURE 369 (manufactured by BASF)

(V-5) 2,2'-Bis(2-chlorophenyl)-4,4',5,5'-tetraphenylbiimidazole (B-CIM manufactured by Hodogaya Chemical Co. Ltd.)

(V-6) Photopolymerization initiator: Oxime-based compound having the following structure

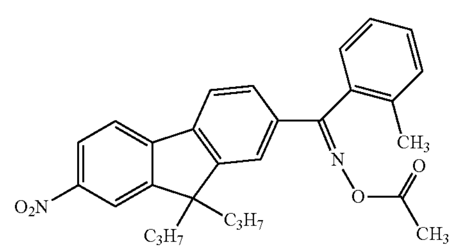

(W-1) Sensitizer: 4,4'-Bis(diethylamino)benzophenone (W-2) Sensitizer: 2-Mercaptobenzothiazole (manufactured by Tokyo Kasei Co., Ltd.)

(X-1) Organic solvent: Propylene glycol monomethyl ether acetate (X-2) Organic solvent: Ethyl 3-ethoxypropionate (Y-1) Surfactant: MEGAFACE F781 (manufactured by DIC Corporation)

—Preparation of Coloring Composition (Coating Liquid)—

The components having the following composition were mixed to prepare a coloring composition 1 (Example 2-1).

<Composition>

- Colorant compound: the compound in the table below . . . 6.9 parts in terms of a solid content of the colorant
- Pigment dispersion: (S-1) . . . 43.0 parts
- Polymerizable compound: (T-1) . . . 103.4 parts
- Alkali-soluble resin: (U-1) . . . 212.2 parts (value in terms of a solid content: 84.9 parts)
- Photopolymerization initiator: (V-1) . . . 21.2 parts
- Photosensitizer: (W-1) . . . 3.5 parts
- Organic solvent: (X-1) . . . 71.9 parts
- Organic solvent: (X-2) . . . 3.6 parts
- Surfactant: (Y-1) . . . 0.06 parts —Manufacture of Color Filter Using Coloring Composition and Evaluation Thereof—

The obtained coloring composition (color resist liquid) was coated onto a glass substrate (1737, manufactured by Corning Inc.) in 100 mm×100 mm such that the x value which is an index of color concentration became 0.150, and dried in an oven at 90° C. for 60 seconds (prebaking). Thereafter, exposure was carried out at 200 mJ/cm$^2$ (an illuminance of 20 mW/cm$^2$) using a high-pressure mercury lamp through a photomask for resolution evaluation having a mask hole width of 10 μm to 100 μm, then the coated film after exposure was developed with a 1% aqueous solution of an alkali developing solution CDK-1 (manufactured by FUJIFILM Electronic Materials Co., Ltd.), and then the developing solution was washed away by spraying pure water like a shower. Then, the coated film that had been subjected to exposure and development as described above was subjected to a heating treatment (postbaking) in an oven at 220° C. for 1 hour to form a colored pattern (colored layer) for a color filter on the glass substrate, whereby a colored filter substrate 1 (color filter 1) was manufactured.

—Evaluation—

The color filter 1 obtained above was subjected to the following evaluations.

1. Heat Resistance

The color filter was disposed on a hot plate at 230° C. such that the color filter came into contact with the substrate surface, and was heated for 1 hour. Then, the color differences (ΔE*ab value) before and after the heating were measured using a colorimeter MCPD-1000 (manufactured by Otsuka Electronics Co., Ltd.), and used as an index for evaluating the heat fastness, and the heat resistance was evaluated in accordance with the following evaluation criteria. A smaller ΔE*ab value indicates higher heat resistance. Incidentally, the ΔE*ab value is a value determined from the following color-difference formula according to CIE 1976 (L*, a*, b*) color space (New Edition of Color Science Handbook (1985) p. 266, edited by The Color Science Association of Japan).

$$\Delta E^*Ab=\{(\Delta L^*)^2+(\Delta a^*)^2+(\Delta b^*)^2\}^{1/2}$$

Evaluation was carried out in accordance with the following criteria.

A: ΔE*ab value <3

B: 3≤ΔE*ab value <5

C: 5≤ΔE*ab value <10

D: 10≤ΔE*ab value

2. Light Resistance

The color filter was irradiated with light of 50,000 lux for 20 hours (equivalent to 1,000,000 lux·h) using a xenon lamp, and the color difference, ΔE*ab value, between before and after the light fastness test, was measured. A smaller ΔE*ab value indicates better light fastness.

Evaluation was carried out in accordance with the following criteria.

A: ΔE*ab value <3

B: 3≤ΔE*ab value <5

C: 5≤ΔE*ab value <10

D: 10≤ΔE*ab value

3. Voltage Holding Ratio

The coloring composition 1 was coated onto an ITO electrode-attached glass substrate (trade name: 1737, manufactured by Corning Inc.) such that the film thickness after drying became 2.0 μm, and dried in an oven at 90° C. for 60 seconds (prebaking). Thereafter, exposure of 100 mJ/cm$^2$ (an illuminance of 20 mW/cm$^2$) was carried out without using a mask, then development was carried out at 25° C. using a 1% by mass aqueous solution of alkali developing solution (trade name: CDK-1, manufactured by FUJIFILM Electronic Materials Co., Ltd.), and then the coated film that had been washed and dried was subjected to heating treatment (postbaking) in an oven at 230° C. for 30 minutes. Subsequently, this substrate with pixels formed thereon and a substrate on which an ITO electrode is merely vapor deposited in a predetermined shape were bonded together using a sealing agent mixed with glass beads having a size of 5 μm, and then, liquid crystal MJ971189 (trade name) manufactured by Merck KGaA was injected to manufacture a liquid crystal cell.

Next, the liquid crystal cell was placed in a constant temperature bath at 70° C. for 48 hours, and then the voltage holding ratio of the liquid crystal cell was measured using a liquid crystal voltage holding ratio measuring system VHR-1A type (trade name) manufactured by Toyo Corporation. A higher mark indicates a better voltage holding ratio.

The lower voltage holding ratio of the liquid crystal cell means that the liquid crystal cell cannot maintain the applied voltage at a predetermined level for a period of 16.7 msec, and that the orientation of liquid crystals cannot be achieved sufficiently. A higher mark indicates a better voltage holding ratio.

Measurement Conditions

Distance between electrodes: 5 μm to 15 μm

Pulse amplitude of applied voltage: 5 V

Pulse frequency of applied voltage: 60 Hz

Pulse width of applied voltage: 16.67 msec

Voltage holding ratio: Potential difference in liquid crystal cell after 16.7 msec/the value of voltage applied at 0 msec Evaluation can be carried out in accordance with the following criteria.

A: 90% or more

B: 80% or more and less than 90%

C: Less than 80%

(Solubility)

The solubility of the colorant compound for the solvent during the manufacture of the coloring composition was visually observed, and the results were evaluated as three stages: complete dissolution was evaluated as A, partial dissolution with partial remaining was evaluated as B, and non-dissolution of a half or more was evaluated as C.

In the other Examples and Comparative Examples, the same procedure was carried out except that the kinds of the colorant compound, the photopolymerization initiator, and the sensitizer were changed as shown in the table below in Example 2-1 (coloring composition 1), and evaluated.

TABLE 5

| | Colorant compound | Photopolymerization initiator | Sensitizer | Heat resistance | Light resistance | Voltage holding ratio | Solubility | Surface unevenness |
|---|---|---|---|---|---|---|---|---|
| Example 2-1 | M-1 | V-3 | | B | A | B | B | B |
| Example 2-2 | M-3 | V-1 | W-1 | B | A | B | B | B |
| Example 2-3 | M-5 | V-3 | | B | B | B | B | B |
| Example 2-4 | M-9 | V-1 | W-1 | B | A | B | B | B |
| Example 2-5 | M-14 | V-5 | W-2 | B | A | B | B | B |
| Example 2-6 | M-16 | V-1 | W-1 | B | B | B | B | B |
| Example 2-7 | M-17 | V-3 | | B | A | A | A | B |
| Example 2-8 | M-19 | V-2 | | B | A | A | A | B |
| Example 2-9 | M-21 | V-1 | W-1 | B | A | A | A | B |
| Example 2-10 | M-22 | V-3 | | A | A | A | B | B |
| Example 2-11 | M-23 | V-3 | | A | A | A | B | B |
| Example 2-12 | M-30 | V-5 | W-2 | A | A | A | B | B |
| Example 2-13 | P-1 | V-3 | | B | A | A | A | A |
| Example 2-14 | P-2 | V-1 | W-1 | B | A | A | A | A |
| Example 2-15 | P-3 | V-3 | | B | A | A | A | A |
| Example 2-16 | P-4 | V-4 | | B | A | A | A | A |
| Example 2-17 | P-5 | V-6 | W-1 | B | A | A | A | A |
| Example 2-18 | P-6 | V-3 | | A | A | A | A | A |
| Example 2-19 | P-7 | V-1 | W-1 | A | A | A | A | A |
| Example 2-20 | P-8 | V-3 | | A | A | A | A | A |
| Example 2-21 | P-9 | V-2 | | A | A | A | A | A |
| Example 2-22 | P-10 | V-5 | W-2 | A | A | A | A | A |
| Example 2-23 | P-11 | V-3 | | A | A | A | A | A |
| Example 2-24 | P-12 | V-1 | W-1 | A | A | A | A | A |
| Example 2-25 | P-13 | V-3 | | A | A | A | A | A |
| Example 2-26 | P-14 | V-6 | W-1 | A | A | A | A | A |
| Example 2-27 | P-15 | V-6 | W-2 | A | A | A | A | A |
| Example 2-28 | M-38 | V-3 | | B | C | B | B | B |
| Example 2-29 | M-40 | V-3 | | B | B | C | B | B |
| Example 2-30 | P-16 | V-3 | | A | A | A | A | A |
| Example 2-31 | P-17 | V-6 | W-2 | A | A | A | A | A |
| Example 2-32 | P-18 | V-6 | W-1 | A | A | A | A | A |
| Example 2-33 | P-19 | V-6 | W-1 | A | A | A | A | A |
| Comparative Example 2-1 | H-1 | V-1 | W-1 | C | C | C | C | C |
| Comparative Example 2-2 | H-2 | V-1 | W-1 | D | D | C | C | C |
| Comparative Example 2-3 | H-3 | V-1 | W-1 | C | C | C | B | C |

As apparent from the above results, it could be seen that the colorant compounds of the compositions of Examples have excellent solvent solubility. Further, it could be seen that in the case of using the compositions of Examples, surface unevenness is excellent. In addition, heat resistance, light fastness, and voltage holding ratio are also excellent. Moreover, it could be seen that this tendency is particularly effective in the case where a low-nucleophilicity anion is used, in the case where the colorant compound represented by General Formula (1) is a polymer or polymerizable monomer, or in the case where the colorant compound represented by General Formula (1) has a cation and an anion inside the molecule.

<Formation of Pattern for Image Sensor Using Drying Etching Method>

—Preparation of Coloring Composition—

The following respective components were mixed, dispersed, and dissolved to obtain the respective coloring compositions of Examples and Comparative Examples.

(A) Colorant compound (described in Table 6) . . . 1.0 part in terms of the solid content of the colorant Solvent: PGMEA . . . 5.0 parts Curable composition (described in Table 6) . . . 5.0 parts Blue pigment dispersion (pigment concentration of 13% by mass) . . . 15.4 parts Surfactant (glycerol propoxylate) (1% cyclohexane solution) . . . 1.0 part <<Evaluation of Coloring Composition>>

The coloring composition was coated onto a glass substrate using a spin coater such that the thickness of the colored film became 0.6 μm, and subjected to a heating treatment (prebaking) for 120 seconds using a hot plate at 100° C. and then a heating treatment (postbaking) using a hot plate at 220° C. for 300 seconds to form a cured film.

1. Heat Resistance

The glass substrate having the cured film formed thereon was disposed again on a hot plate at 260° C. such that the glass substrate came into contact with the substrate surface, and was heated for 5 minutes. Then, the color differences (ΔE*ab value) before and after the heating were measured using a colorimeter MCPD-1000 (manufactured by Otsuka Electronics Co., Ltd.), and used as an index for evaluating the heat fastness. Evaluation was carried out in accordance with the following evaluation criteria.

$$\Delta E^*ab=\{(\Delta L^*)^2+(\Delta a^*)^2+(\Delta b^*)^2\}^{1/2}$$

Evaluation was carried out in accordance with the following criteria.

A: The value of ΔE*ab is 0 or more and less than 1.0

B: The value of ΔE*ab is 1.0 or more and less than 3.0

C: The value of ΔE*ab is 3.0 or more

2. Light Resistance

The color filter was irradiated with light of 100,000 lux for 12 hours (equivalent to 1,200,000 lux·h) using a xenon lamp, and the color difference, ΔE*ab value, between before and after the light fastness test, was measured. A smaller ΔE*ab value indicates better light fastness.

The light fastness was evaluated in accordance with the following criteria.

A: ΔE*ab value <3

B: 3≤ΔE*ab value <10

C: 10≤ΔE*ab value <20

D: 20≤ΔE*ab value

3. Solubility

The solubility of the colorant compound for the solvent during the manufacture of the coloring composition was visually observed, and the results were evaluated as three stages: complete dissolution was evaluated as A, partial dissolution with partial remaining was evaluated as B, and non-dissolution of a half or more was evaluated as C.

4. Evaluation of Surface Unevenness

The glass substrate after the test on heat resistance was observed if the colored film has unevenness at a brightfield magnification of 200 times using an optical microscope (MX-61L manufactured by Olympus). In the case where unevenness was not found using the optical microscope and a uniform film was formed, the resistance to thermal stress during postbaking is considered to be excellent.

A: Unevenness is not seen with an optical microscope.

B: Slight unevenness is seen with an optical microscope.

C: Clear unevenness is seen with an optical microscope.

TABLE 6

| | Colorant compound | Curable compound | Heat resistance | Light resistance | Solubility | Surface unevenness |
|---|---|---|---|---|---|---|
| Example 3-1 | M-1 | K-3 | B | B | B | B |
| Example 3-2 | M-3 | K-4 | B | B | B | B |
| Example 3-3 | M-5 | K-3 | B | B | B | B |
| Example 3-4 | M-9 | K-5 | B | A | B | B |
| Example 3-5 | M-14 | K-3 | B | A | B | B |
| Example 3-6 | M-16 | K-6 | B | B | B | B |
| Example 3-7 | M-17 | K-3 | B | B | A | A |
| Example 3-8 | M-19 | K-3 | B | B | A | A |
| Example 3-9 | M-21 | K-3 | B | B | A | A |
| Example 3-10 | M-22 | K-1 | A | B | B | A |
| Example 3-11 | M-23 | K-2 | A | B | B | A |
| Example 3-12 | M-30 | K-1 | A | A | B | A |
| Example 3-13 | P-1 | K-5 | B | B | A | A |
| Example 3-14 | P-2 | K-6 | B | B | A | A |
| Example 3-15 | P-3 | K-4 | B | B | A | A |
| Example 3-16 | P-4 | K-3 | B | B | A | A |
| Example 3-17 | P-5 | K-4 | B | B | A | A |
| Example 3-18 | P-6 | K-1 | A | A | A | A |
| Example 3-19 | P-7 | K-2 | A | A | A | A |
| Example 3-20 | P-8 | K-2 | A | A | A | A |
| Example 3-21 | P-9 | K-1 | A | A | A | A |
| Example 3-22 | P-10 | K-1 | A | A | A | A |
| Example 3-23 | P-11 | K-1 | A | A | A | A |
| Example 3-24 | P-12 | K-2 | A | A | A | A |
| Example 3-25 | P-13 | K-2 | A | A | A | A |
| Example 3-26 | P-14 | K-1 | A | A | A | A |

TABLE 6-continued

| | Colorant compound | Curable compound | Heat resistance | Light resistance | Solubility | Surface unevenness |
|---|---|---|---|---|---|---|
| Example 3-27 | P-15 | K-1 | A | A | A | A |
| Example 3-28 | M-38 | K-6 | B | C | B | C |
| Example 3-29 | M-40 | K-6 | B | A | B | A |
| Example 3-30 | P-16 | K-1 | A | A | A | A |
| Example 3-31 | P-17 | K-2 | A | A | A | A |
| Example 3-32 | P-18 | K-2 | A | A | A | A |
| Example 3-33 | P-19 | K-1 | A | A | A | A |
| Example 3-34 | P-1 | K-1 | A | B | A | A |
| Example 3-35 | P-1 | K-6 | B | B | A | A |
| Comparative Example 3-1 | H-1 | K-1 | C | C | C | C |
| Comparative Example 3-2 | H-2 | K-1 | D | D | C | C |
| Comparative Example 3-3 | H-3 | K-1 | C | C | B | C |

As apparent from the above results, it could be seen that the colorant compounds of the compositions of Examples have excellent solvent solubility. Moreover, it could be seen that in the case of using the compositions of Examples, the surface unevenness is excellent. Further, it could also be seen that the heat resistance and the light fastness are also excellent. In particular, it could be seen that in the case of using an epoxy compound in the curable composition, the heat resistance is excellent, the colorant compound having a cation and an anion inside the molecule has excellent light fastness, and excellent surface unevenness due to the polymeric structure having the colorant compound as a repeating unit colorant compound or the colorant compound having a polymerizable group.

The curable compounds K-1 to K-6 described in Table 6 are compounds having the structures shown below.

(K-1)

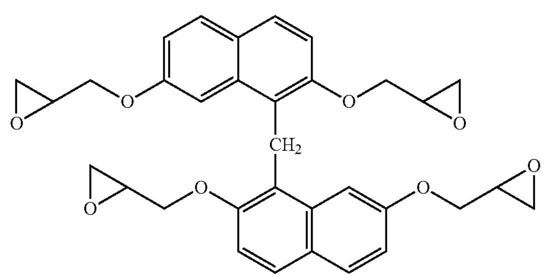

(K-2)

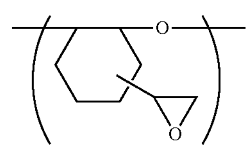

(K-3)

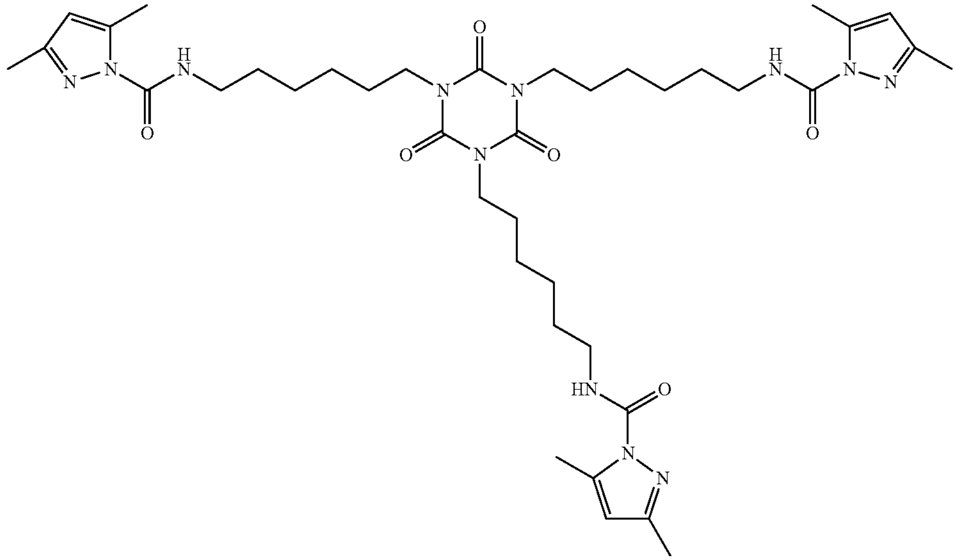

-continued (K-4)

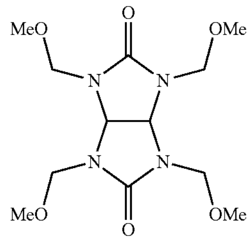

(K-5)

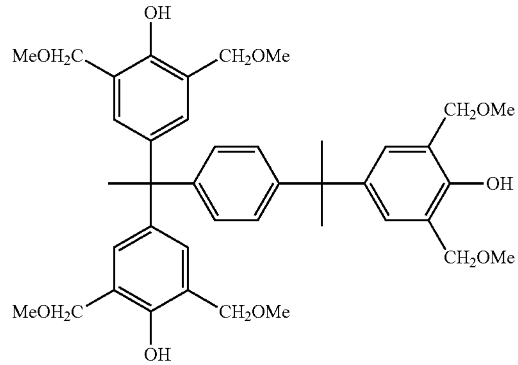

(K-6)

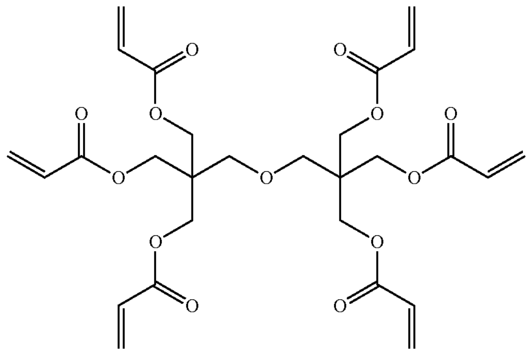

<Blue Pattern (Blue Pixel) Forming Step by Dry Etching>

(Formation of Blue Layer)

The coloring compositions for forming a blue filter of Example (3-20) and Comparative Example (3-1) were coated onto a glass wafer using a spin coater to provide a coated film having a film thickness of 0.6 μm. Then, the resultant was dried using a hot plate at 100° C. for 180 seconds, and after drying, a heating treatment (postbaking) was carried out for 300 seconds using a hot plate at 200° C. to form a green layer. The film thickness of the green layer was 0.6 μm.

(Coating of Resist for Mask)

Next, a positive type photoresist "FHi622BC" (manufactured by FUJIFILM Electronic Materials Co., Ltd.) was coated onto the blue layer and subjected to prebaking to form a photoresist layer having a film thickness of 0.8 μm.

(Patternwise Exposure and Development of Resist for Mask)

Next, the photoresist layer was patternwise exposed at an exposure dose of 350 mJ/cm$^2$ using an i-line stepper (manufactured by Canon Inc.), and then subjected to a heating treatment for 1 minute at the temperature of the photoresist layer or an atmospheric temperature reaching 90° C. Thereafter, the resultant was subjected to a developing treatment with a developing solution "FHD-5" (manufactured by FUJIFILM Electronic Materials Co., Ltd.) for 1 minute, and then subjected to a postbaking treatment at 110° C. for 1 minute to form a resist pattern. This resist pattern is a pattern in which the resist films in the shape of square, formed with one side of 1.25 μm, are aligned in the checker board shape, taking consideration an etching conversion difference (reduction in the pattern width by etching).

(Dry Etching)

Next, dry etching of the blue layer was carried out in the following procedure, using the resist pattern as an etching mask.

In a dry etching device (manufactured by Hitachi High-Technologies Corp., U-621), the blue layer was subjected to a first-stage etching treatment for 80 seconds at an RF power of 800 W, an antenna bias of 400 W, a wafer bias of 200 W, an internal pressure of a chamber of 4.0 Pa, a substrate temperature of 50° C., and gas types and flow rates of a mixed gas: $CF_4$: 80 mL/min., $O_2$: 40 mL/min., and Ar: 800 mL/min.

The reduction amount of the blue layer under these etching conditions (an etching amount of 89%) was 521 nm, and thus, it became a state in which there was a residual film in about 59 nm.

Next, in the same etching chamber, the blue layer was subjected to a second-stage etching treatment and an over-etching treatment at an RF power of 600 W, an antenna bias of 100 W, a wafer bias of 250 W, an internal pressure of a chamber of 2.0 Pa, a substrate temperature of 50° C., and gas types and flow rates of a mixed gas: $N_2$: 500 mL/min., $O_2$: 50 mL/min., and Ar: 500 mL/min. ($N_2/O_2/Ar$=10/1/10), with an over-etching rate in the total etching of 20%.

The etching rate of the blue layer under the second-stage etching conditions was 600 nm/min or more, and it took about 10 seconds to etch the residual film of the blue layer. The total time determined by addition of the first-stage etching time of 80 seconds and the second-stage etching time of 10 seconds was calculated as an etching time. As a result, the etching time was set to 80+10=90 seconds, an over-etching time of 90×0.2=18 seconds, and a total etching time of 90+18=108 seconds.

After carrying out the dry etching under the above conditions, a peeling treatment was carried out for 120 seconds, using a photoresist peeling solution "MS230C" (manufactured by FUJIFILM Electronic Materials Co., Ltd.), thereby removing the resist pattern. The resultant was cleaned with pure water and spin-dried. Thereafter, a dehydration/baking treatment was carried out at 100° C. for 2 minutes. As a result, a blue pattern in which green pixels in the square shape with one side measuring 1.2 μm were aligned in the checker board shape was obtained.

The blue pattern formed from the coloring composition of Example (3-20) had a smooth surface state, and the etched areas had no residue and the pattern was good.

On the other hand, the blue pattern formed in Comparative Example (3-1) had a rough surface state and residues were seen in the etched areas.

What is claimed is:

1. A coloring composition comprising:

a colorant compound represented by the following General Formula (1);

a curable compound; and a solvent:

General Formula (1)

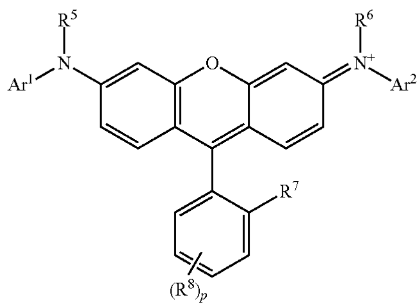

in General Formula (1), each of $Ar^1$ and $Ar^2$ independently represents a group represented by the following General Formula (2), $R^5$ and $R^6$ each independently represents a hydrogen atom, an alkyl group, or an aryl group, $R^7$ represents a monovalent substituent, $R^8$ represents a halogen atom, an alkyl group, a carboxyl group, or a nitro group, and p represents an integer of 0 to 4; and General Formula (2)

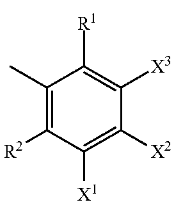

in General Formula (2), $R^1$ and $R^2$ each independently represents an alkyl group having 3 or more carbon atoms, an aryl group, or a heterocyclic group, and $X^1$ to $X^3$ each independently represents a hydrogen atom, a halogen atom or an alkyl group;

wherein the colorant compound represented by General Formula (1) has a counter anion inside and/or outside the molecule.

2. The coloring composition according to claim 1 wherein in General Formula (2), $R^1$ and $R^2$ are each an alkyl group having 3 to 12 carbon atoms.

3. The coloring composition according to claim 1, wherein in General Formula (2), $R^1$ and $R^2$ are the same groups.

4. The coloring composition according to claim 1, wherein in General Formula (2), $R^1$ and $R^2$ are an isopropyl group.

5. The coloring composition according to claim 1, wherein the counter anion of the colorant compound represented by General Formula (1) is an anion formed by dissociation of an organic acid having a pKa lower than the pKa of sulfuric acid.

6. The coloring composition according to claim 1, wherein in General Formula (1), $R^7$ is a group represented by the following structure:

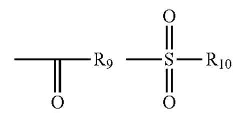

in the above formulae, $R_9$ and $R_{10}$ each independently represents an alkoxy group, an aryloxy group, an alkylamino group, an arylamino group, a dialkylamino group, a diarylamino group, an alkylarylamino group, an alkylsulfamoyl group, an arylsulfamoyl group, an alkylcarbamoyl group, or an arylcarbamoyl group.

7. The coloring composition according to claim 1, wherein the counter anion of the colorant compound represented by General Formula (1) is bonded to a cation via one or more covalent bonds.

8. The coloring composition according to claim 1, wherein the colorant compound represented by General Formula (1) is a polymer having a repeating unit including or a compound having a polymerizable group.

9. The coloring composition according to claim 1, for use in a color filter.

10. A cured film formed by curing the coloring composition according to claim 1.

11. A pattern forming method comprising:

applying the coloring composition according to claim 1 onto a support to form a coloring composition layer;

patternwise-exposing the coloring composition layer; and removing an unexposed area by development to form a colored pattern.

12. A method for manufacturing a color filter, comprising the pattern forming method according to claim 11.

13. A color filter obtained by using the coloring composition according to claim 1.

14. A solid-state imaging device comprising the color filter according to claim 13.

15. An image display device comprising the color filter according to claim 13.

16. The coloring composition according to claim 1, wherein in General Formula (2), $X^1$ to $X^3$ each represents a hydrogen atom.

17. The coloring composition according to claim 1, wherein in General Formula (1), $R^5$ and $R^6$ each represents a hydrogen atom; and the counter anion is selected from the group consisting of a bis(sulfonyl)imide anion, a tris(sulfonyl)methide anion and a tetraarylborate anion.

18. The coloring composition according to claim 1, wherein the curable compound is a polymerizable compound; and the coloring composition contains a photopolymerization initiator.

19. The coloring composition according to claim 1, wherein the colorant compound represented by General Formula (1) is a polymer having a repeating unit.

* * * * *